US008351541B2

(12) United States Patent
Taylor et al.

(10) Patent No.: US 8,351,541 B2
(45) Date of Patent: Jan. 8, 2013

(54) LOW DENSITY PARITY CHECK (LDPC) CODING FOR A 32K MODE INTERLEAVER IN A DIGITAL VIDEO BROADCASTING (DVB) STANDARD

(75) Inventors: Mathew Paul Athol Taylor, Ringwood (GB); Samuel Asanbeng Atungsiri, Basingstoke (GB); Takashi Yokokawa, Minato-ku (JP); Makiko Yamamoto, Minato-ku (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/359,928

(22) Filed: Jan. 27, 2012

(65) Prior Publication Data

US 2012/0189079 A1 Jul. 26, 2012

Related U.S. Application Data

(62) Division of application No. 12/260,327, filed on Oct. 29, 2008, now Pat. No. 8,179,955.

(30) Foreign Application Priority Data

| Oct. 30, 2007 | (GB) | 0721269.9 |
| Oct. 30, 2007 | (GB) | 0721270.7 |
| Oct. 30, 2007 | (GB) | 0721271.5 |
| Oct. 30, 2007 | (GB) | 0721272.3 |
| Nov. 19, 2007 | (GB) | 0722645.9 |
| Nov. 20, 2007 | (GB) | 0722728.3 |
| Nov. 26, 2007 | (JP) | 2007-304689 |
| Nov. 26, 2007 | (JP) | 2007-304690 |

(51) Int. Cl.
    *H04L 27/00* (2006.01)
(52) U.S. Cl. .......... 375/295; 375/230; 375/260; 455/59; 370/203

(58) Field of Classification Search .......... 375/295, 375/230, 260; 455/59; 370/203
See application file for complete search history.

(56) References Cited

U.S. PATENT DOCUMENTS

| 5,799,033 A | 8/1998 | Baggen |
| 6,314,534 B1 | 11/2001 | Agrawal et al. |

(Continued)

FOREIGN PATENT DOCUMENTS

EP 1 463 255 A1 9/2004

(Continued)

OTHER PUBLICATIONS

ETSI, "Digital Video Broadcasting (DVB); Framing structure, channel coding and modulation for digital terrestrial television", ETSI EN 300 744 V1.4.1, Jan. 2001, 4 pages.

(Continued)

*Primary Examiner* — Juan A Torres
(74) *Attorney, Agent, or Firm* — Oblon, Spivak, McClelland, Maier & Neustadt, L.L.P.

(57) ABSTRACT

A data processing apparatus communicates data bits on a predetermined number of sub-carrier signals of an Orthogonal Frequency Division Multiplexed (OFDM) symbol. The data processing apparatus comprises a parity interleaver operable to perform parity interleaving on Low Density Parity Check (LDPC) encoded data bits obtained by performing LDPC encoding according to a parity check matrix of an LDPC code including a parity matrix corresponding to parity bits of the LDPC code, the parity matrix having a stepwise structure, so that a parity bit of the LDPC encoded data bits is interleaved to a different parity bit position. A mapping unit maps the parity interleaved bits onto data symbols corresponding to modulation symbols of a modulation scheme of the OFDM sub-carrier signals.

20 Claims, 45 Drawing Sheets

U.S. PATENT DOCUMENTS

| | | |
|---|---|---|
| 6,353,900 B1 | 3/2002 | Sindhushayana et al. |
| 6,625,234 B1 | 9/2003 | Cul et al. |
| 7,543,197 B2 | 6/2009 | Palanki et al. |
| 8,130,894 B2 | 3/2012 | Peron |
| 2002/0186797 A1 | 12/2002 | Robinson |
| 2004/0246888 A1 | 12/2004 | Peron |
| 2005/0008084 A1 | 1/2005 | Zhidkov |
| 2005/0257119 A1 | 11/2005 | Blankenship et al. |
| 2006/0062314 A1 | 3/2006 | Palin et al. |
| 2006/0123323 A1 | 6/2006 | Kim et al. |
| 2006/0218461 A1 | 9/2006 | Kyung et al. |
| 2006/0256708 A1 | 11/2006 | Wang et al. |
| 2006/0282712 A1 | 12/2006 | Argon et al. |
| 2007/0139428 A1 | 6/2007 | Berkeman |
| 2007/0250742 A1 | 10/2007 | Kowalski |
| 2009/0110091 A1 | 4/2009 | Taylor et al. |
| 2009/0110093 A1 | 4/2009 | Taylor et al. |
| 2009/0110094 A1 | 4/2009 | Taylor et al. |
| 2009/0110095 A1 | 4/2009 | Taylor et al. |
| 2009/0110097 A1 | 4/2009 | Taylor et al. |
| 2009/0110098 A1 | 4/2009 | Taylor et al. |
| 2009/0296838 A1 | 12/2009 | Atungsiri et al. |
| 2009/0296840 A1 | 12/2009 | Atungsiri et al. |
| 2009/0300300 A1 | 12/2009 | Treigherman |
| 2010/0296593 A1 | 11/2010 | Atungsiri et al. |
| 2012/0002739 A1 | 1/2012 | Peron |
| 2012/0069922 A1 | 3/2012 | Taylor et al. |

FOREIGN PATENT DOCUMENTS

| | | |
|---|---|---|
| EP | 1 463 256 A1 | 9/2004 |
| EP | 1 662 739 A1 | 5/2006 |
| JP | 2001-352252 | 12/2001 |
| JP | 2005-51469 | 2/2005 |
| JP | 2006-254466 | 9/2006 |
| JP | 2007-214783 | 8/2007 |
| JP | 2007-525931 | 9/2007 |
| JP | 2008-263566 | 10/2008 |
| WO | WO 2005/091509 A1 | 9/2005 |
| WO | WO 2006/136883 A1 | 12/2006 |

OTHER PUBLICATIONS

Imed Ben Dhaou, et al., "Performance analysis and low power VLSI implementation of DVB-T receiver", Mar. 4, 1999, 3 pages, Downloaded from http://www.signal.uu.se/Courses/Semabstracts/ofdm2.pdf.

Dr. Jonathan Devile, "Reply to examination report Letter for EP 1463256", Aug. 2, 2005, 4 pages.

Stephanie Y. Le Goff, "Signal Constellations for Bit-Interleaved Coded Modulation", IEEE Transactions on Information Theory, vol. 49, No. 1, Jan. 2003, pp. 307-313.

Robert D. Maddock et al., "Reliability-Based Coded Modulation With Low-Density Parity-Check Codes", IEEE Transactions on Communications, vol. 54, No. 3, Mar. 2006, pp. 403-406.

Jin, "Irregular Repeat-Accumulate Codes", Proceedings of $2^{nd}$ International Symposium on Turbo codes and Related Topics, pp. 1-8, Sep. 2000.

Afshari, "A Novel Symbol Interleaver Address Generation Architecture for DVB-T Modulator", International Symposium on Communications and Information Technologies, 2006, ISCIT '06, Publication Year: 2006, pp. 989-993.

Li, "Hardware implementation of DVB-RCTT modulator", ECS of ICT, KTH Feb. 2006 (see http://web.it.kth.se/~srs/MSc_theses/Zhu_Lei+Shenjiang_Li_MSc-thesis.pdf).

U.S. Appl. No. 13/341,532, filed Dec. 30, 2011, Taylor, et al.
U.S. Appl. No. 13/364,640, filed Feb. 2, 2012, Taylor, et al.
U.S. Appl. No. 13/398,506, filed Feb. 16, 2012, Taylor, et al.
U.S. Appl. No. 13/363,467, filed Feb. 1, 2012, Taylor, et al.

FIG. 2

$$H = \begin{bmatrix} & & & \vdots & & & & & & \\ \cdots 1 \cdots \cdot 1 \cdot & 1 & \cdots \cdots 1 \cdots 1 \cdots 1 \\ & & & \vdots & & & & & & \\ & & & 1 & & & & & & \\ & & & \vdots & & & & & & \\ & & & 1 & & & & & & \end{bmatrix}$$

FIG. 4

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 10

$$H_T = \begin{pmatrix} 1 & & & & & & 0 \\ 1\,1 & & & & & & \\ & 1\,1 & & & & & \\ & & \ddots & & & & \\ & & & & 1\,1 & & \\ 0 & & & & 1\,1 & & \\ & & & & & & 1\,1 \end{pmatrix}$$

PARITY MATRIX $H_T$

FIG. 13
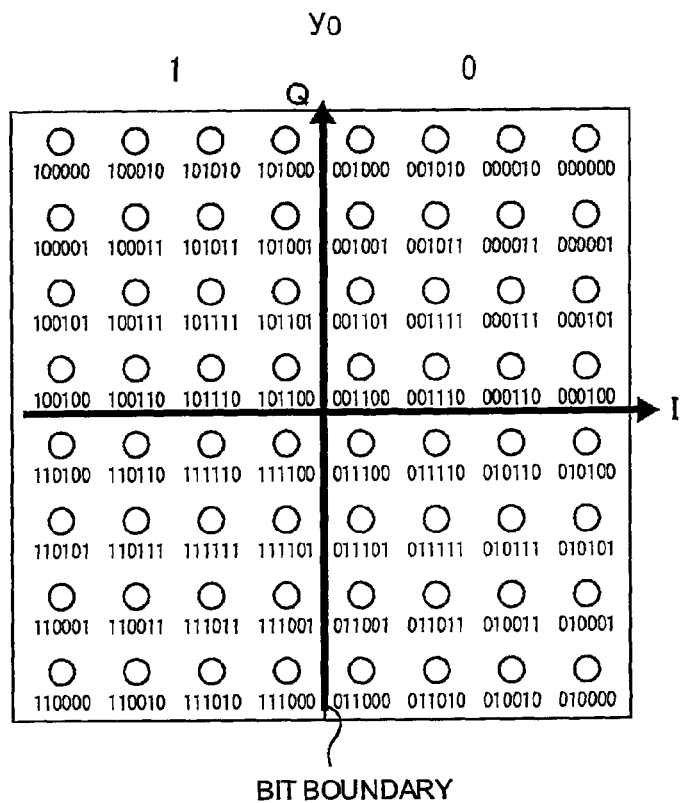
BIT BOUNDARY
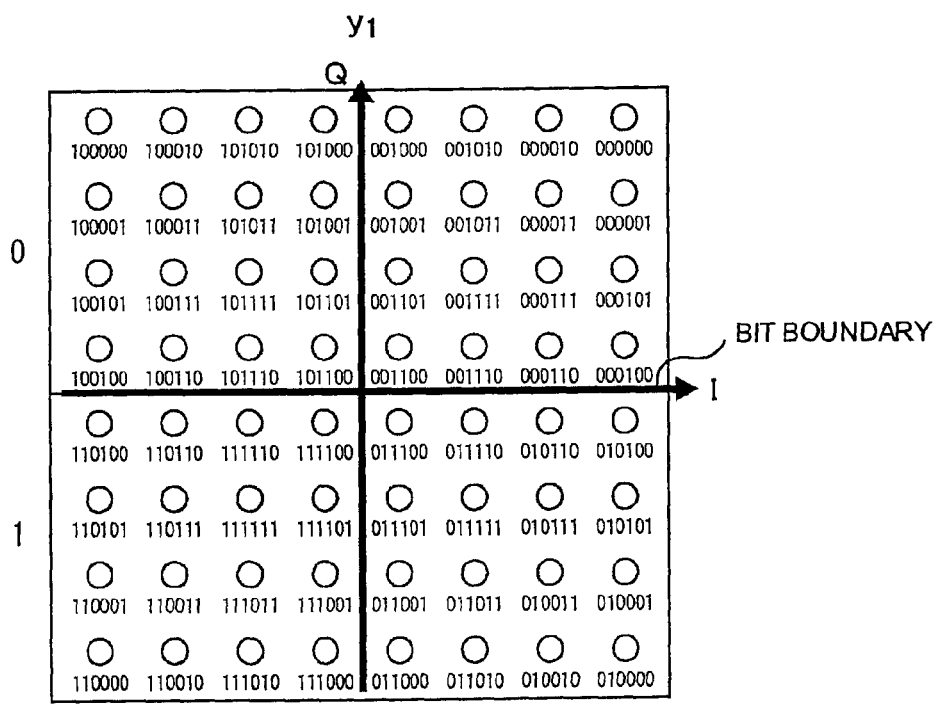
BIT BOUNDARY

FIG. 14
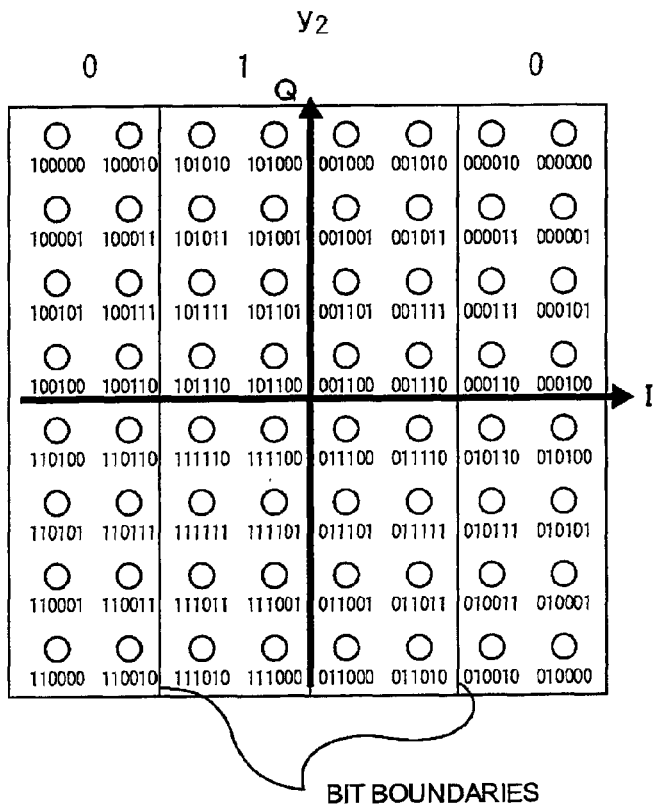
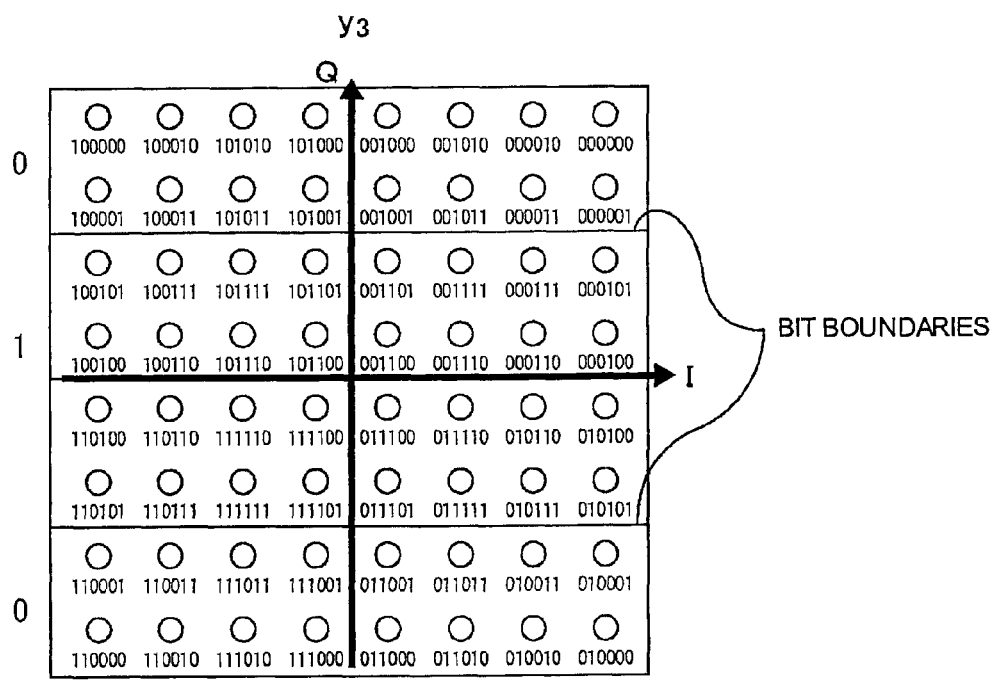

FIG. 15
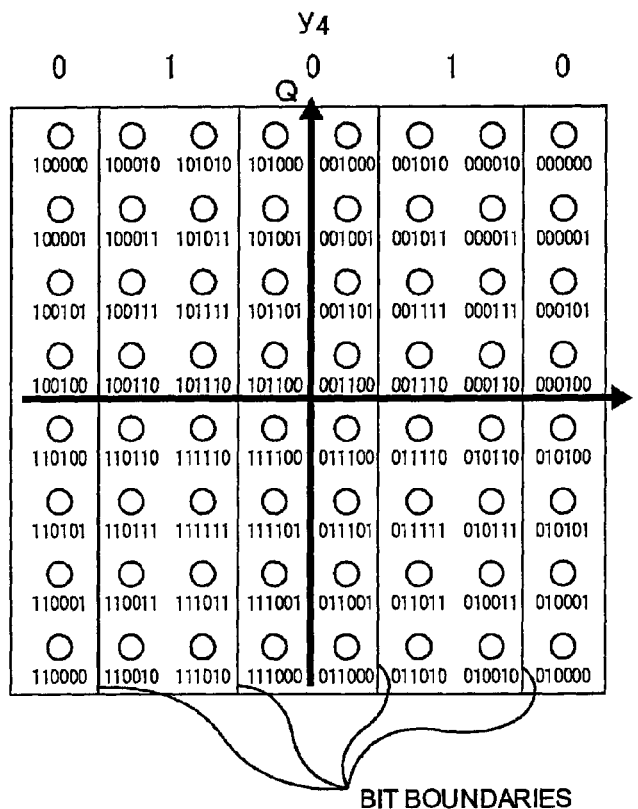
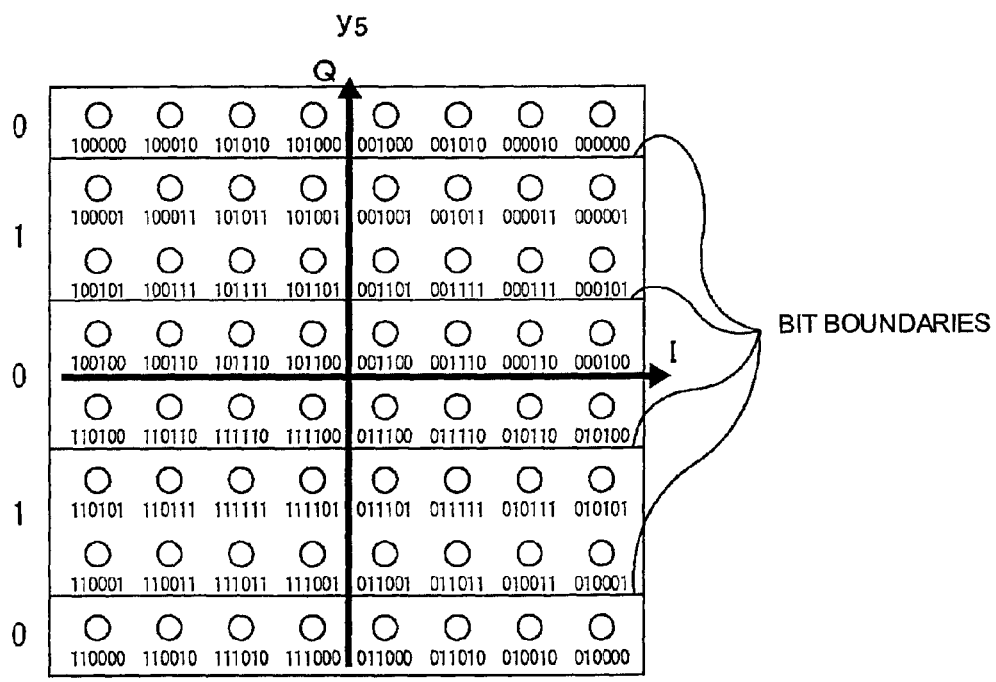

FIG. 19
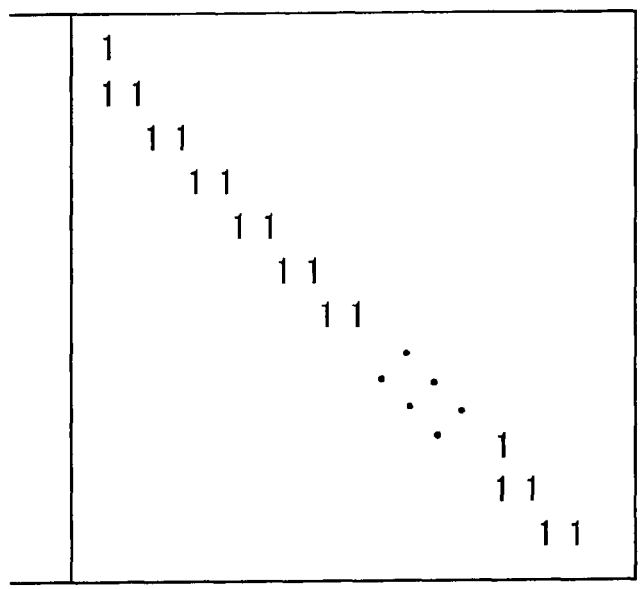
STEPWISE STRUCTURE OF PARITY MATRIX
A
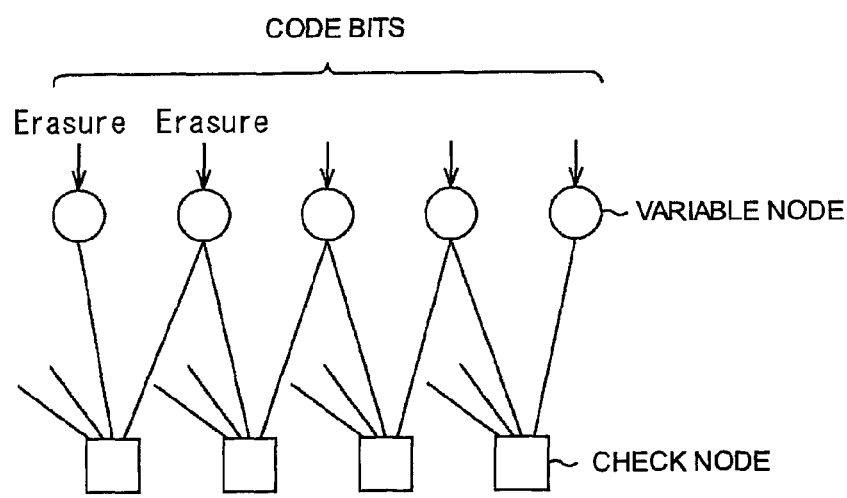
PART OF TANNER GRAPH HAVING STEPWISE STRUCTURE
B

FIG. 23

| The number of required columns of memory "mb" | First to third reordering methods | Fourth reordering method | Respective writing start positions of mb columns | | | | | | | | | | | | | | | | | | | | | | | |
|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 6 | 9 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 12 | 12 | 13 | 16 | 17 | 19 | 21 | 22 | 23 | 26 | 37 | 39 | 40 | 41 | 41 | 41 |

FIG. 24

| THE NUMBER OF REQUIRED COLUMNS OF MEMORY "mb" | FIRST TO THIRD REORDERING METHODS | FOURTH REORDERING METHOD | RESPECTIVE WRITING START POSITIONS OF mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

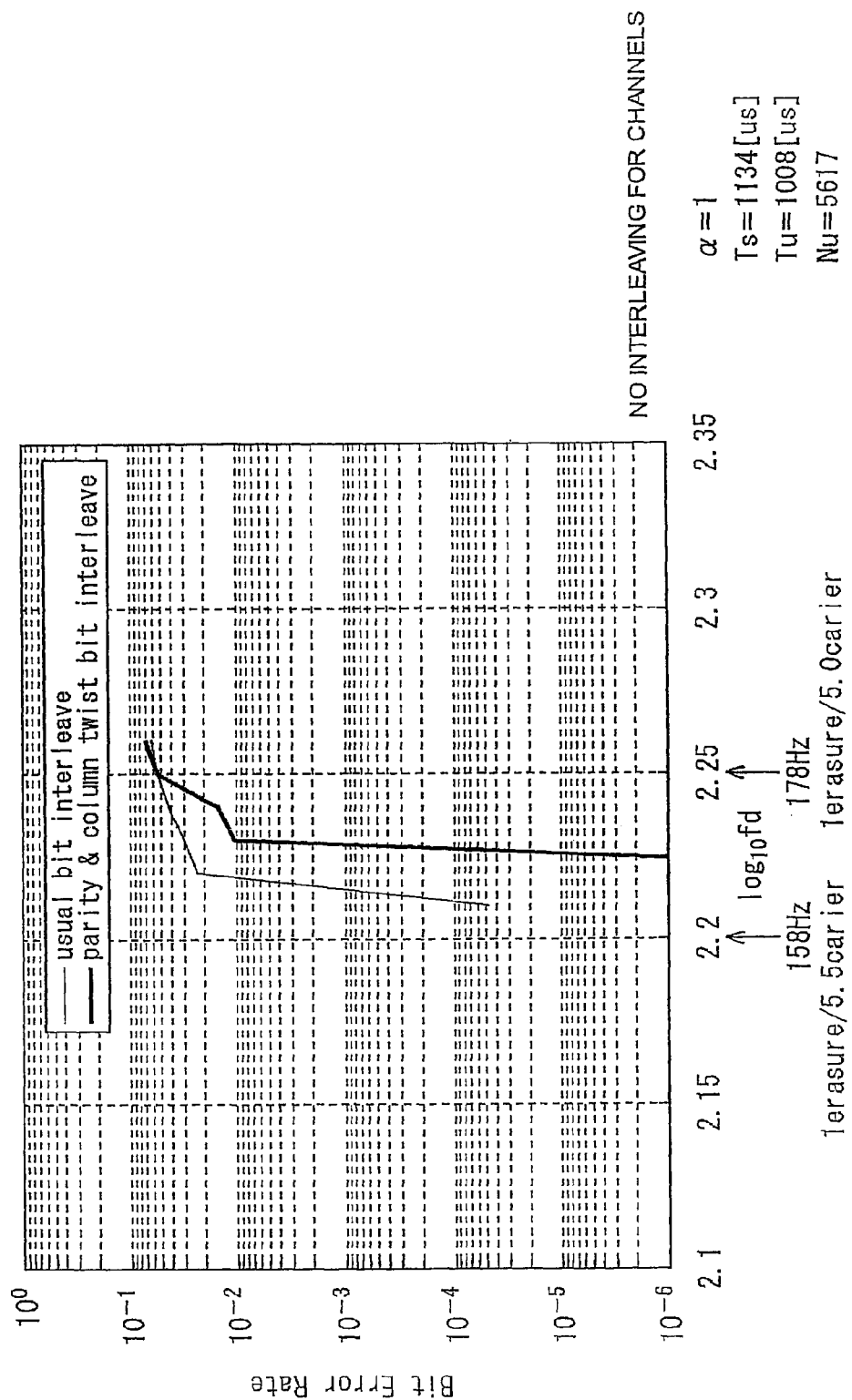

LOW DENSITY PARITY CHECK (LDPC) CODING FOR A 32K MODE INTERLEAVER IN A DIGITAL VIDEO BROADCASTING (DVB) STANDARD

CROSS-REFERENCE TO RELATED APPLICATION

The present application is a divisional application of U.S. application Ser. No. 12/260,327 filed Oct. 29, 2008, the entire contents of which are incorporated herein by reference. The '327 application claims priority to United Kingdom Applications Nos. 0721271.5, filed Oct. 30, 2007; 0721272.3, filed Oct. 30, 2007; 0721270.7, filed Oct. 30, 2007; 0721269.9, filed Oct. 30, 2007; 0722645.9, filed Nov. 19, 2007; 0722728.3, filed Nov. 20, 2007; and Japanese Application Nos. 2007-304689, filed Nov. 26, 2007; and 2007-304690, filed Nov. 26, 2007.

FIELD OF INVENTION

The present invention relates to data processing methods and apparatus for communicating data bits via a number of sub-carrier signals of an Orthogonal Frequency Division Multiplexed (OFDM) symbol.

The present invention also relates to data processing methods and apparatus for recovering data bits from a number of sub-carrier signals of an OFDM symbol to form an output bit stream.

Embodiments of the present invention can provide an OFDM transmitter/receiver.

BACKGROUND OF THE INVENTION

The Digital Video Broadcasting-Terrestrial standard (DVB-T) utilises Orthogonal Frequency Division Multiplexing (OFDM) to communicate data representing video images and sound to receivers via a broadcast radio communications signal. There are known to be two modes for the DVB-T standard which are known as the 2k and the 8k mode. The 2k mode provides 2048 sub-carriers whereas the 8k mode provides 8192 sub-carriers. Similarly for the Digital Video Broadcasting-Handheld standard (DVB-H) a 4k mode has been provided, in which the number of sub-carriers is 4096.

Error correction coding schemes such as Low-Density Parity Check/Bose-Chaudhuri-Hocquenghem (LDPC/BCH) coding, which have been proposed for DVB-T2 perform better when noise and degradation of the symbol values resulting from communication is un-correlated. Terrestrial broadcast channels may suffer from correlated fading in both the time and the frequency domains. As such, by separating encoded data bits onto different data symbols and separating the communication of the data symbols on different sub-carrier signals of the OFDM symbol by as much as possible, the performance of error correction coding schemes can be increased.

In order to improve the integrity of data communicated using DVB-T or DVB-H, it is known to provide a symbol interleaver in order to interleave input data symbols as these symbols are mapped onto the sub-carrier signals of an OFDM symbol. For the 2k mode and the 8k mode an arrangement has been disclosed in the DVB-T standard for generating the addresses to effect the mapping. Likewise for the 4k mode of DVB-H standard, an arrangement for generating addresses for the mapping has been provided and an address generator for implementing this mapping is disclosed in European Patent application 04251667.4. The address generator comprises a linear feed back shift register which is operable to generate a pseudo random bit sequence and a permutation circuit. The permutation circuit permutes the order of the content of the linear feed back shift register in order to generate an address. The address provides an indication of a memory location of the interleaver memory for writing the input data symbol into or reading the input data symbol out from the interleaver memory for mapping onto one of the sub-carrier signal of the OFDM symbol. Similarly, an address generator in the receiver is arranged to generate addresses of the interleaver memory for writing the received data symbols into or reading the data symbols out from the interleaver memory to form an output symbol stream.

In accordance with a further development of the Digital Video Broadcasting-Terrestrial standard, known as DVB-T2, there is a desire to improve the communication of data bits, and more particularly to provide an improved arrangement for interleaving data bits encoded with LDPC codes and data symbols onto the sub-carrier signals of OFDM symbols.

SUMMARY OF INVENTION

According to the present inventions there is provided a data processing apparatus for communicating data bits via a predetermined number of sub-carrier signals of an Orthogonal Frequency Division Multiplexed (OFDM) symbol. The data processing apparatus comprises a parity interleaver operable to perform parity interleaving on Low Density Parity Check (LDPC) encoded data bits obtained by performing LDPC encoding according to a parity check matrix of an LDPC code, which includes a parity matrix corresponding to parity bits of the LDPC code, the parity matrix having a stepwise structure, so that a parity bit of the LDPC code is interleaved to a different parity bit position. A mapping unit maps the parity interleaved bits onto data symbols corresponding to modulation symbols of a modulation scheme of the OFDM sub-carrier signals. A symbol interleaver is arranged in operation to read-into a symbol interleaver memory the predetermined number of data symbols for mapping onto the OFDM sub-carrier signals, and to read-out of the symbol interleaver memory the data symbols for the OFDM sub-carriers to effect the mapping, the read-out being in a different order than the read-in, the order being determined from a set of addresses, with the effect that the data symbols are interleaved on the sub-carrier signals.

An address generator is operable to generate the set of addresses, an address being generated for each of the data symbols to indicate one of the sub-carrier signals onto which the data symbol is to be mapped, the address generator comprising a linear feedback shift register including a predetermined number of register stages and being operable to generate a pseudo-random bit sequence in accordance with a generator polynomial, a permutation circuit operable to receive the content of the shift register stages and to permute the bits present in the register stages in accordance with a permutation code to form an address of one of the OFDM sub-carriers, and a control unit operable in combination with an address check circuit to re-generate an address when a generated address exceeds a predetermined maximum valid address.

In one example, in which the OFDM symbol is generated in accordance with a 32K mode, the predetermined maximum valid address is approximately thirty two thousand, the linear feedback shift register has fourteen register stages with a generator polynomial for the linear feedback shift register of $R'_i[13]=R'_{i-1}[0] \oplus R'_{i-1}[1] \oplus R'_{i-1}[2] \oplus R'_{i-1}[12]$, and the permutation code forms, with an additional bit, a fifteen bit address $R_i[n]$ for the i-th data symbol from the bit present in the n-th register stage $R'_i[n]$ in accordance with the table:

| | $R'_i$ bit positions | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| $R_i$ bit positions | 6 | 5 | 0 | 10 | 8 | 1 | 11 | 12 | 2 | 9 | 4 | 3 | 13 | 7. |

In other modes the maximum valid address, the number of stages of the linear feedback shift register, the generator polynomial and the permutation code may be adapted in accordance with the predetermined number of sub-carrier signals per OFDM symbol in each mode.

Embodiments of the present invention include a bit interleaver which combines with a symbol interleaver to improve the performance of an OFDM communications system, which utilises Low Density Parity Check (LDPC) error correction encoding. The bit interleaver includes a permuter for performing, when two or more code bits of a Low Density Parity Check (LDPC) code are transmitted as a symbol, a permutation process which permutes the code bits of the LDPC code so that a plurality of code bits corresponding to a value of 1 in an arbitrary row of an information matrix corresponding to information bits of the LDPC code is not incorporated into the same symbol.

The data processing apparatus may be an independent device and may also be an internal block included in a device, such as a transmitter or in other embodiments a receiver.

LDPC codes can provide a high error correction performance in communication paths, other then Additive White Gaussian Noise channels, which is superior to convolutional codes or concatenated Reed Solomon (RS)-convolutional codes. This can be provided in communications channels which exhibit bursts of errors, which cause erasures. Thus, there is a need to provide a method for increasing resistance to burst errors or erasures while maintaining the performance of AWGN communication paths.

The invention has been made in view of the above circumstances and provides a data processing apparatus and method which can increase resistance to errors in code bits of LDPC codes such as burst errors or erasures, by combining a bit interleaver for the LDPC encoded data bits with a symbol interleaver.

That is, according to the embodiments of the invention, parity interleaving is performed on an LDPC code obtained by performing LDPC encoding according to a parity check matrix including a stepwise-structured parity matrix corresponding to parity bits of the LDPC code so that parity bits of the LDPC code are interleaved to different parity bit positions.

Various operating modes of an OFDM system have been envisaged in which the present invention finds application. For example in order to provide an even sparser deployment of DVB transmitters within a single frequency network, it has been proposed to provide the 32k mode. To implement the 32k mode, a symbol interleaver must be provided for mapping the input data symbols onto the sub-carrier signals of the OFDM symbol.

Embodiments of the present invention can provide a data processing apparatus operable as a symbol interleaver for mapping data symbols to be communicated on an OFDM symbol, having approximately thirty two thousand sub-carrier signals. In one embodiment the number of sub-carrier signals maybe a value substantially between twenty four thousand and thirty two thousand seven hundred and sixty eight. Furthermore, the OFDM symbol may include pilot sub-carriers, which are arranged to carry known symbols, and the predetermined maximum valid address depends on a number of the pilot sub-carrier symbols present in the OFDM symbol. As such the 32k mode can be provided for example for a DVB standard, such as DVB-T2, DVB-Cable2, DVB-T or DVB-H.

Mapping data symbols to be transmitted onto the sub-carrier signals of an OFDM symbol, where the number of sub-carrier signals is approximately thirty two thousand, represents a technical problem requiring simulation analysis and testing to establish an appropriate generator polynomial for the linear feedback shift register and the permutation order. This is because the mapping requires that the symbols are interleaved onto the sub-carrier signals with the effect that successive symbols from the input data stream are separated in frequency by a greatest possible amount in order to optimise the performance of error correction coding schemes.

As will be explained, it has been discovered from simulation performance analysis that the generator polynomial for the linear feed back shift register in combination with the permutation circuit order indicated above, provides a good performance. Furthermore, by providing an arrangement which can implement address generating for each of the 2k mode, the 4k mode and the 8k mode by changing the taps of the generator polynomial for the linear feed back shift register and the permutation order, a cost effective implementation of the symbol interleaver for the 32k mode can be provided. Furthermore, a transmitter and a receiver can be changed between the 1k mode, 2k mode, 4k mode, 8k mode 16k mode and the 32k mode by changing the generator polynomial and the permutation orders. This can be effected in software (or by embedded signalling) whereby a flexible implementation is provided.

Various aspects and features of the present invention are defined in the appended claims. Further aspects of the present invention include a data processing apparatus operable to map symbols received from a predetermined number of sub-carrier signals of an Orthogonal Frequency Division Multiplexed (OFDM) symbol into an output symbol stream, as well as a transmitter and a receiver.

BRIEF DESCRIPTION OF DRAWINGS

Embodiments of the present invention will now be described by way of example only with reference to the accompanying drawings, wherein like parts are provided with corresponding reference numerals, and in which:

FIG. 2 illustrates an example parity check matrix H of an LDPC code;

FIG. 4 illustrates an example parity check matrix of an LDPC code;

FIG. 10 illustrates a parity matrix;

FIG. 13 illustrates an arrangement of signal points of 64QAM;

FIG. 14 illustrates an arrangement of signal points of 64QAM;

FIG. 15 illustrates an arrangement of signal points of 64QAM;

FIGS. 19a and 19b illustrate a parity matrix $H_T$ having a stepwise structure and a Tanner graph corresponding to the parity matrix $H_T$;

FIG. 23 illustrates the number of columns of a memory 31 required for column twist interleaving and the addresses of writing start positions;

FIG. 24 illustrates the number of columns of the memory 31 required for column twist interleaving and the addresses of writing start positions;

FIG. 27 illustrates relations between Doppler frequencies $f_d$ and error rates obtained from simulations;

FIG. 31 illustrates an example parity check matrix of an LDPC code;

FIG. 32 illustrates a matrix (converted parity check matrix) obtained by performing row permutation and column permutation on the parity check matrix;

FIG. 33 illustrates the converted parity check matrix divided into units of 5×5 matrices;

FIG. 41(a) is diagram illustrating results for an interleaver using the address generator shown in FIG. 40 for even symbols and FIG. 41(b) is a diagram illustrating design simulation results for odd symbols, whereas

FIGS. 44(a) and 44(b) show plots of the distance at the interleaver output of sub-carriers that were adjacent at the interleaver input;

DESCRIPTION OF PREFERRED EMBODIMENTS

Figure 1:
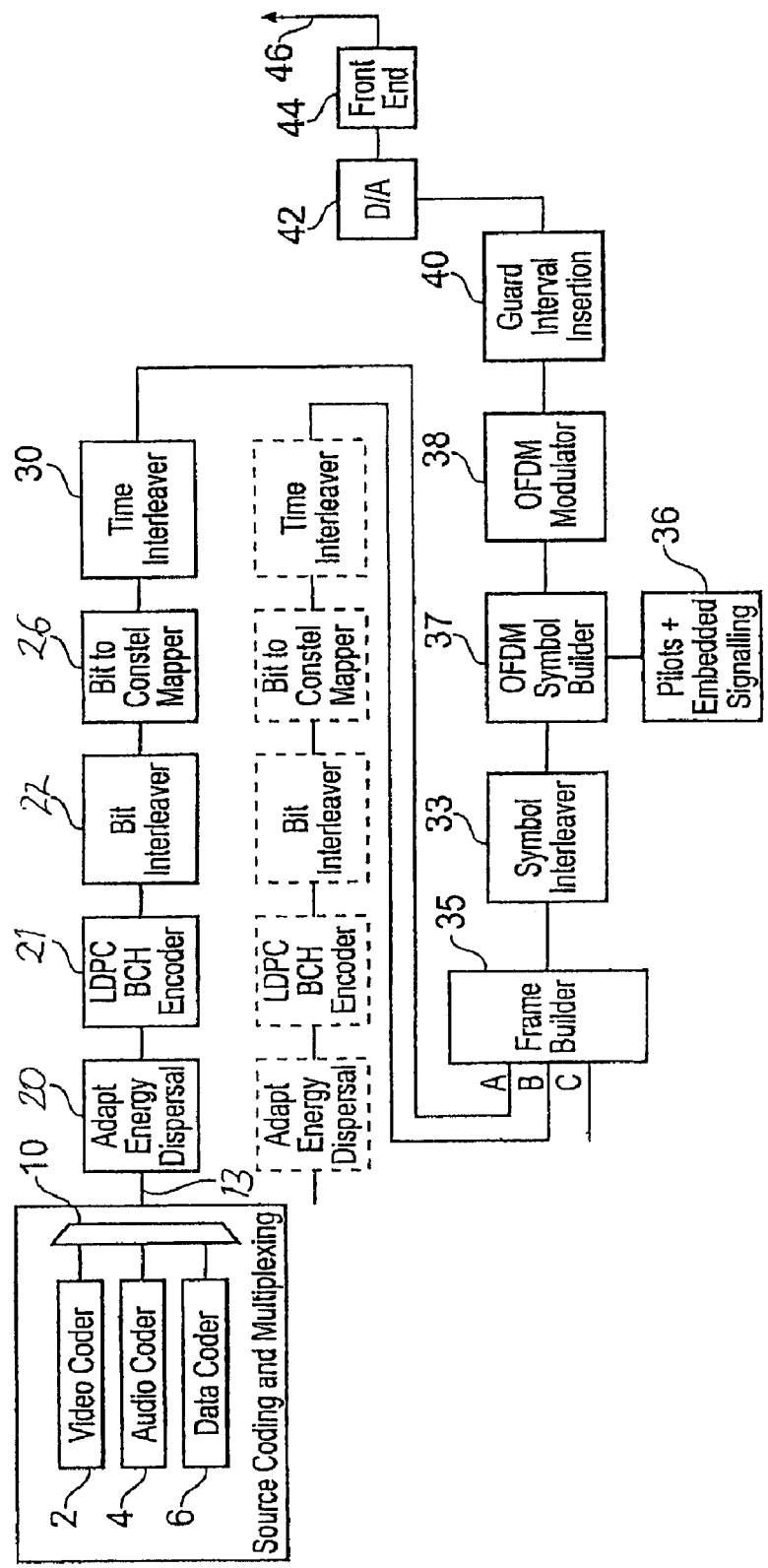
FIG. 1 is a schematic block diagram of a Coded OFDM transmitter which may be used, for example, with the DVB-T2 standard.

FIG. 1 provides an example block diagram of an OFDM transmitter which may be used for example to transmit video images and audio signals in accordance with the DVB-T2 standard. In FIG. 1 a program source generates data to be transmitted by the OFDM transmitter. A video coder 2, and audio coder 4 and a data coder 6 generate video, audio and other data to be transmitted which are fed to a program multiplexer 10. The output of the program multiplexer 10 forms a multiplexed stream with other information required to communicate the video, audio and other data. The multiplexer 10 provides a stream on a connecting channel 13. There may be many such multiplexed streams which are fed into different branches A, B etc. For simplicity, only branch A will be described.

As shown in FIG. 1 an OFDM transmitter receives the stream at a multiplexer adaptation and energy dispersal block 20. The multiplexer adaptation and energy dispersal block 20 randomises the data and feeds the appropriate data to a forward error correction encoder 21 which performs error correction encoding of the stream. A bit interleaver 22 is provided to interleave the encoded data bits which for the example of DVB-T2 is the LDCP encoder output. The output from the bit interleaver 22 is fed to a bit into constellation mapper 26, which maps groups of bits onto a constellation point, which is to be used for conveying the encoded data bits. The outputs from the bit into constellation mapper 26 are constellation point labels that represent real and imaginary components. The constellation point labels represent data symbols formed from two or more bits depending on the modulation scheme used. These will be referred to as data cells. These data cells are passed through a time-interleaver 30 whose effect is to interleaver data cells resulting from multiple LDPC code words. The data cells from the time interleaver 30 are then fed to a modulation and frame builder, which maps the data cells onto modulation symbols for transmission.

The data cells are received within the modulation unit by a frame builder 35, with data cells produced by branch B etc in FIG. 1, via other channels. The frame builder 35 then forms many data cells into sequences to be conveyed on OFDM symbols, where an OFDM symbol comprises a number of data cells, each data cell being mapped onto one of the sub-carriers. The number of sub-carriers will depend on the mode of operation of the system, which may include one of 1k, 2k, 4k, 8k, 16k or 32k, each of which provides a different number of sub-carriers according, for example to the following table:

| Number of Sub-carriers Adapted from DVB-T/H | |
|---|---|
| Mode | Sub-carriers |
| 1k | 756 |
| 2k | 1512 |
| 4k | 3024 |
| 8k | 6048 |
| 16k | 12096 |
| 32k | 24192 |

Thus in one example, the number of sub-carriers for the 32k mode is twenty four thousand one hundred and ninety two. For the DVB-T2 system, the number of sub-carriers per OFDM symbol can vary depending upon the number of pilot and other reserved carriers. Thus, in DVB-T2, unlike in DVB-T, the number of sub-carriers for carrying data is not fixed. Broadcasters can select one of the operating modes from 1k, 2k, 4k, 8k, 16k, 32k each providing a range of sub-carriers for data per OFDM symbol, the maximum available for each of these modes being 1024, 2048, 4096, 8192, 16384, 32768 respectively. In DVB-T2 a physical layer frame is composed of many OFDM symbols. Typically the frame starts with one or more preamble or P2 OFDM symbols, which are then followed by a number payload carrying OFDM symbols. The end of the physical layer frame is marked by a frame closing symbols. For each operating mode, the number of sub-carriers may be different for each type of symbol. Furthermore, this may vary for each according to whether bandwidth extension is selected, whether tone reservation is enabled and according to which pilot sub-carrier pattern has been selected. As such a generalisation to a specific number of sub-carriers per OFDM symbol is difficult. However, the frequency interleaver for each mode can interleave any symbol whose number of sub-carriers is smaller than or the same as the maximum available number of sub-carriers for the given mode. For example, in the 1k mode, the interleaver would work for symbols with the number of sub-carriers being less than or equal to 1024 and for 16k mode, with the number of sub-carriers being less than or equal to 16384.

The sequence of data cells to be carried in each OFDM symbol is then passed to the symbol interleaver 33. The OFDM symbol is then generated by an OFDM symbol builder block 37 which introduces pilot and synchronising signals fed from a pilot and embedded signal former 36. An OFDM modulator 38 then forms the OFDM symbol in the time domain which is fed to a guard insertion processor 40 for generating a guard interval between symbols, and then to a digital to analogue converter 42 and finally to an RF amplifier within an RF front end 44 for eventual broadcast by the OFDM transmitter from an antenna 46.

Embodiments of the present invention provide an OFDM communications system which includes a bit interleaver for interleaving bits encoded with an LDPC encoder in combination with a symbol interleaver, which interleaves symbols representing the one or more interleaved and encoded bits onto the sub-carrier signals of an OFDM symbol. Both the bit interleaver and the symbol interleaver according to example embodiments are described in the following paragraphs, starting with the bit interleaver, which is described with LDPC encoding:

Bit Interleaver for LDPC Encoding

LDPC Error Correction Codes

LDPC codes have high error correction performance and have recently begun to be used in communication schemes including satellite digital broadcasting such as DVB-S.2, which has entered use in Europe (for example, see DVB-S.2: ETSI EN 302 307 V1.1.2 (2006-06)). Applying LDPC codes to next-generation terrestrial digital broadcasting is also under discussion.

Recent studies show that the performance of LDPC codes approaches the Shannon Limit as the code length increases, similar to turbo codes. Since LDPC codes have a property that the minimum distance is proportional to the code length, LDPC codes have advantages in that block error probability characteristics are excellent and an error floor, which is a phenomenon observed in association with decoding characteristics of turbo codes or the like, rarely occurs.

Reference will now be made in detail to such LDPC codes. LDPC codes are linear codes. Although LDPC codes are not necessarily binary, the following description will be given with reference to binary LDPC codes.

The most important feature of LDPC codes is that a parity check matrix defining each LDPC code is a sparse matrix which has a very small number of elements of "1," i.e., elements thereof are mostly "0."

FIG. 2 illustrates an example parity check matrix H of an LDPC code.

Each column of the parity check matrix H of FIG. 2 has a weight of 3 (i.e., 3 elements of "1") and each row has a weight of 6 (i.e., 6 elements of "1").

Encoding based on LDPC codes (i.e., LDPC encoding) is performed, for example by calculating a generation matrix G based on a parity check matrix H and multiplying the generation matrix G by information bits to generate a codeword (LDPC code).

Specifically, an LDPC encoder first calculates a generation matrix G which satisfies an equation $GH^T=0$ with a transposed matrix $H^T$ of the parity check matrix H. Here, when the generation matrix G is a K×N matrix, the encoder multiplies the generation matrix G by a K-bit information bit sequence (vector u) to generate an N-bit codeword c (=uG). The codeword (LDPC code) generated by the encoder is received by a receiving side through a communication path.

The LDPC code can be decoded by a message-passing algorithm proposed by Gallager and dubbed a "probabilistic decoding algorithm." The message-passing algorithm uses belief propagation on a Tanner graph including variable nodes (also referred to as message nodes) and check nodes. In the following description, each of the variable node and the check node will be simply referred to as a "node" as appropriate.

Figure 3:
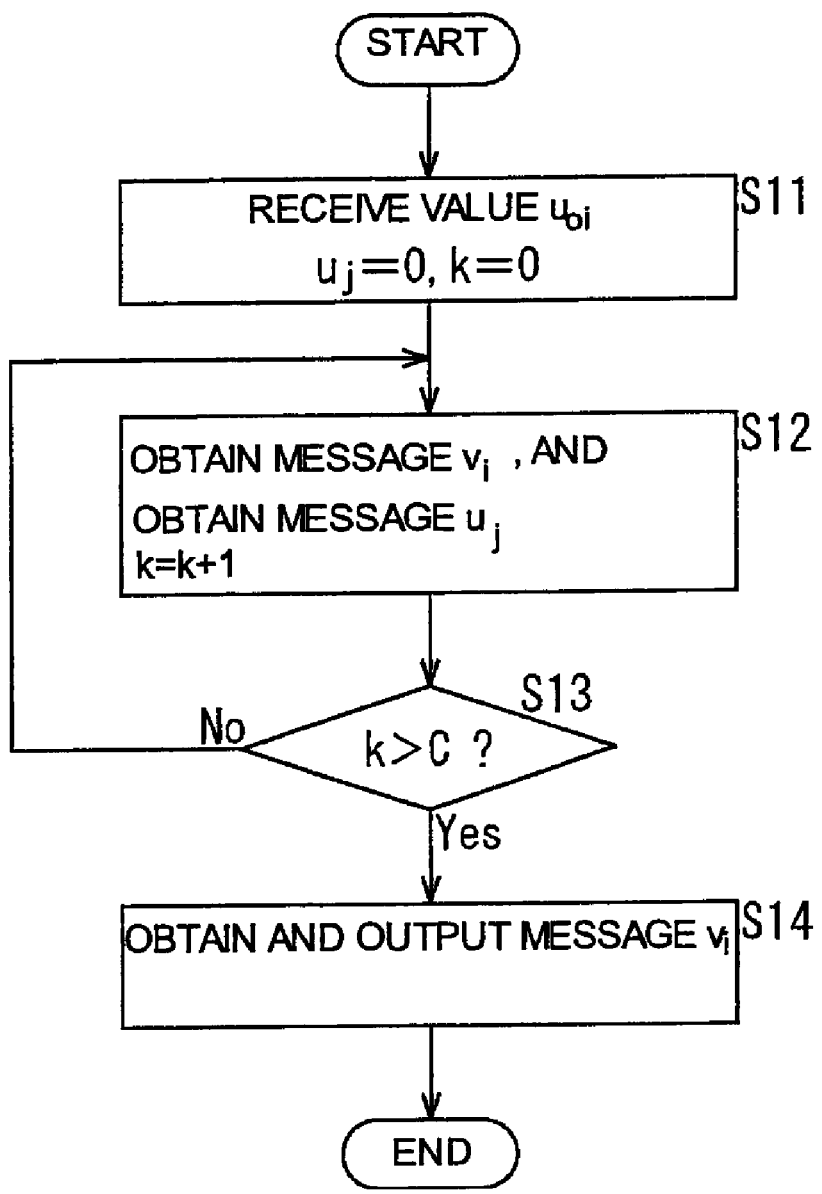
FIG. 3 is a flow chart illustrating a procedure for decoding an LDPC code.

FIG. 3 illustrates a procedure for decoding an LDPC code.

In the following, a real value which expresses, as a log likelihood ratio, the probability that an ith code bit of an LDPC code (a codeword) received by a receiving side has a value of "0" is referred to as a received value $u_{0i}$ as appropriate. In addition, a message output from a check node is referred to as $u_j$ and a message output from a variable node is referred to as $v_i$.

An LDPC code is decoded in the following manner. First, as shown in FIG. 3, at step S11, an LDPC code is received, a message (check node message) $u_j$ is initialized to "0" and a variable k, which has an integer value as a counter of an iterative process, is initialized to "0." Then, the procedure proceeds to step S12. At step S12, a calculation (variable node calculation) represented by Equation (1) is performed based on a received value $u_{0i}$ obtained by receiving the LDPC code to obtain a message (variable node message) $v_i$ and a calculation (check node calculation) represented by Equation (2) is then performed based on the message $v_i$ to obtain a message $u_j$.

EQUATION 1

$$v_i = \mu_{0i} + \sum_{j=1}^{d_v-1} u_j \tag{1}$$

EQUATION 2

$$\tanh\left(\frac{u_j}{2}\right) + \prod_{i=1}^{d_c-1} \tanh\left(\frac{v_i}{2}\right) \tag{2}$$

$d_v$ and $d_c$ in Equation (1) and Equation (2) are arbitrarily selectable parameters that represent the respective numbers of 1s in a vertical direction (column) and in a horizontal direction (row) of the parity check matrix H. For example, $d_v=3$ and $d_c=6$ in the case of a (3,6) code.

The respective ranges for calculation in the variable node calculation of Equation (1) and the check node calculation of Equation (2) are from 1 to $d_v-1$ and from 1 to $d_c-1$ since a message received from an edge (i.e., a line connecting a variable node and a check node to each other) which outputs the message is excluded from each of the calculations of Equations (1) and (2). Actually, the check node calculation of Equation (2) is performed by recursively using, as shown in Equation (4), a previously created table of a function $R(v_1, v_2)$ shown in Equation (3) that is defined as one output with respect to two inputs $v_1$ and $v_2$.

EQUATION 3

$$x = 2\tan h^{-1}\{\tan h(v_1/2)\tan h(v_2/2)\} = R(v_1, v_2) \tag{3}$$

EQUATION 4

$$u_j = R(v_1, R(v_2, R(v_3, \ldots R(v_{d_c-2}, v_{d_c-1})))) \tag{4}$$

At step S12, the variable k is incremented by "1" and the procedure proceeds to step S13. At step S13, it is determined whether or not the variable k is greater than a predetermined number of iterations of decoding C. If it is determined at step S13 that the variable k is not greater than C, the procedure returns to step S12 to repeat the same process.

If it is determined at step S13 that the variable k is greater than C, the procedure proceeds to step S14 to perform a calculation represented by Equation (5) to obtain and output a message $v_i$ as a final decoding result. Then, the LDPC code decoding procedure is terminated.

EQUATION 5

$$v_i = u_{0i} + \sum_{j=1}^{d_v} u_j \tag{5}$$

Here, unlike the variable node calculation of Equation (1), the calculation of Equation (5) is performed using messages $u_j$ from all edges connected to the variable node.

FIG. 4 illustrates an example parity check matrix H of a (3,6) LDPC code with a code rate of 1/2 and a code length of 12.

As with the parity check matrix H of FIG. 2, the parity check matrix H of FIG. 4 has a column weight of 3 and a row weight of 6.

Figure 5:
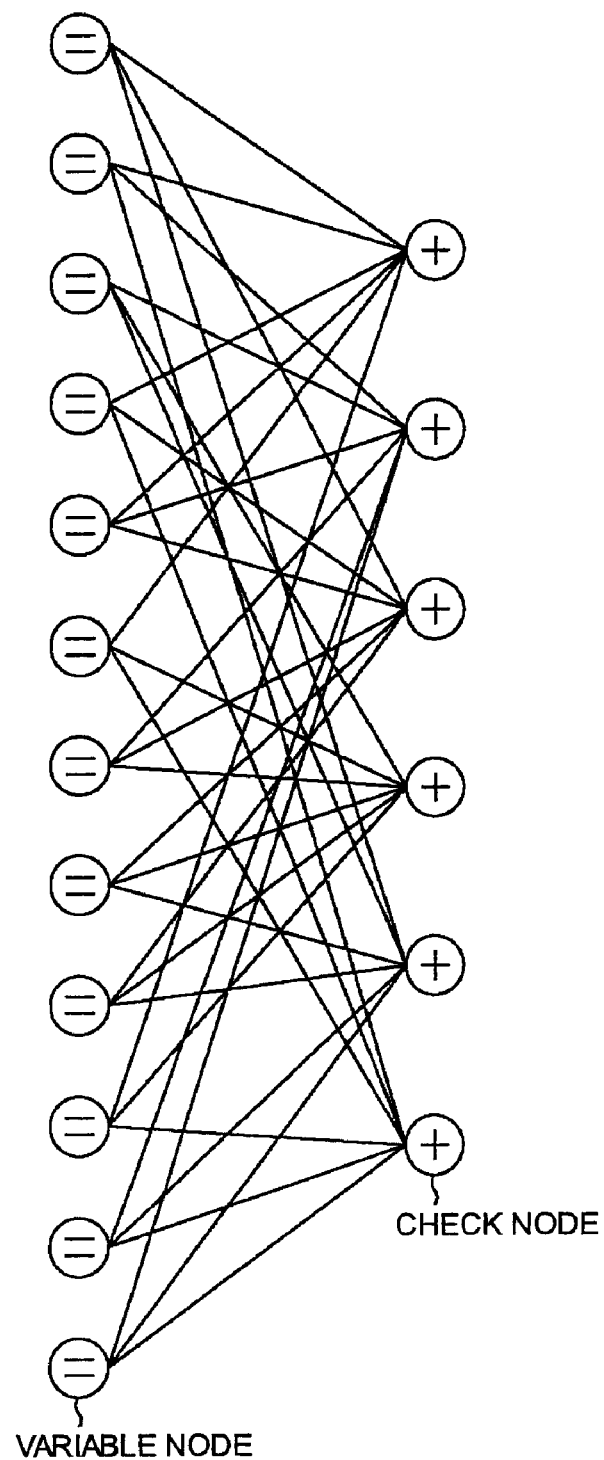
FIG. 5 illustrates a Tanner graph of a parity check matrix.

FIG. 5 illustrates a Tanner graph of the parity check matrix H of FIG. 4.

In FIG. 5, "+" represents a check node and "=" represents a variable node. Check nodes and variable nodes correspond to rows and columns of the parity check matrix H, respectively. Each connecting line between a pair of check and variable nodes is an edge corresponding to an element of "1" of the parity check matrix H.

Specifically, when an element of jth row and ith column of a parity check matrix is "1," an ith variable node "=" (counting from the top) and a jth check node "+" (counting from the top) are connected through an edge in FIG. 5. The edge indicates that a code bit corresponding to the variable node has a constraint corresponding to the check node.

A sum product algorithm, which is an LDPC code decoding algorithm, repeatedly performs a variable node calculation and a check node calculation.

Figure 6:
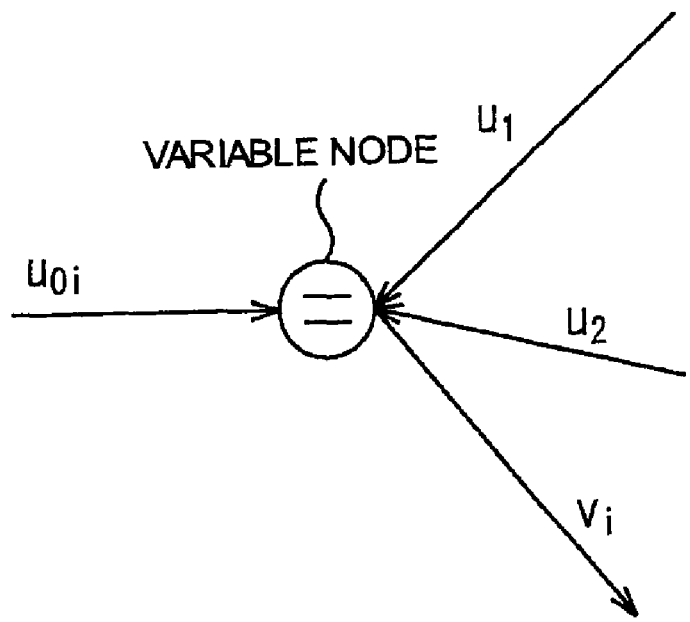
FIG. 6 illustrates a variable node.

FIG. 6 illustrates a variable node calculation performed at a variable node.

A message $v_i$ corresponding to an edge for calculation is obtained according to the variable node calculation of Equation (1) using a received value $u_{0i}$ and messages $u_1$ and $u_2$ from remaining edges connected to the variable node. Messages corresponding to other edges are obtained in the same manner.

Figure 7:
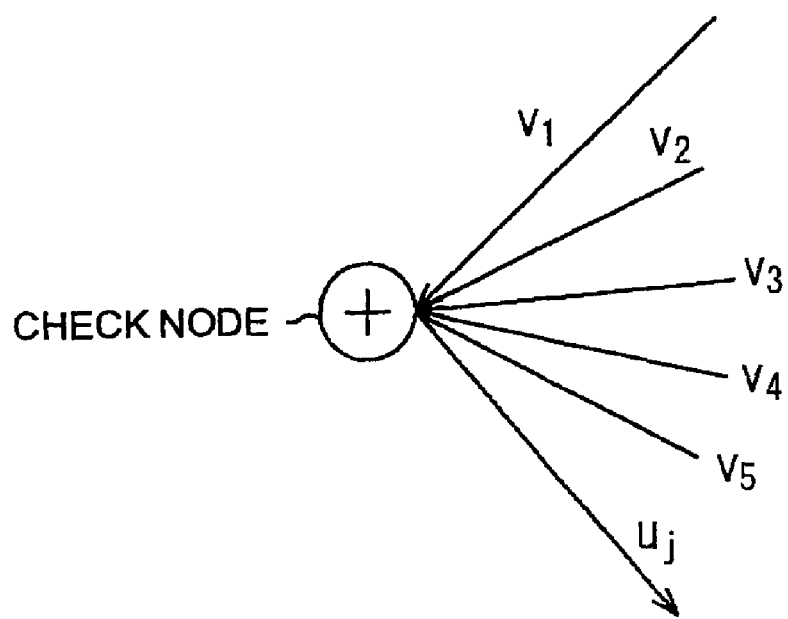
FIG. 7 illustrates a check node.

FIG. 7 illustrates a check node calculation performed at a check node.

The above Equation (2) for check node calculation can be rewritten as Equation (6) using a relation equation of $a \times b = \exp\{\ln(|a|) + \ln(|b|)\} \times \text{sign}(a) \times \text{sign}(b)$, where $\text{sign}(x)$ is 1 when $x \geq 0$ and $-1$ when $x < 0$.

EQUATION 6

$$u_j = 2\tanh^{-1}\left(\prod_{i=1}^{d_c-1} \tanh\left(\frac{v_i}{2}\right)\right) \tag{6}$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

In addition, when a function $\phi(x) = \ln(\tan h(x/2))$ is defined when $x \geq 0$, an equation $\phi^{-1}(x) = 2\tan h^{-1}(e^{-x})$ is satisfied and therefore Equation (6) can be rearranged into Equation (7).

EQUATION 7

$$u_j = \phi^{-1}\left(\sum_{i=1}^{d_c-1} \phi(|v_i|)\right) \times \prod_{i=1}^{d_c-1} \text{sign}(v_i) \quad (7)$$

At the check node, the check node calculation of Equation (2) is performed according to Equation (7).

That is, at the check node, a message $u_j$ corresponding to an edge for calculation is obtained according to the check node calculation of Equation (7) using messages $v_1$, $v_2$, $v_3$, $v_4$, and $v_5$ from remaining edges connected to the check node as shown in FIG. 7. Messages corresponding to other edges are obtained in the same manner.

The function $\phi(x)$ in Equation (7) can also be expressed such that $\phi(x)=\ln((e^x+1)/(e^x-1))$ and $\phi(x)=\phi^{-1}(x)$ when $x>0$. When the functions $\phi(x)$ and $\phi^{-1}(x)$ are embedded into hardware, they can be embedded using the same Look Up Table (LUT).

Although it is known that LDPC codes exhibit very high performance in Additive White Gaussian Noise (AWGN) communication paths, it is also known in recent years that LDPC codes have high error correction performance in other communication paths, compared to convolutional codes or concatenated Reed Solomon (RS)-convolutional codes in the past.

That is, when a code having excellent performance in an AWGN communication path is selected, the selected code generally exhibits excellent performance in other communication paths, superior to other codes.

For example, as LDPC codes are applied to terrestrial digital broadcasting, it has been suggested that LDPC codes defined in the DVB-S.2 specification and modulation schemes defined in the DVB-T specification be combined and a bit interleaver that interleaves code bits of an LDPC code be provided between an LDPC encoder and a modulator to improve the performance of LDPC codes in AWGN communication paths.

However, erasures or burst errors may occur in communication paths that are assumed to be ground waves. For example, in an Orthogonal Frequency Division Multiplexing (OFDM) system, a specific symbol may be erased (i.e., drop to zero in power) due to delay of an echo, which is a path other than the main path, in multi-path environments where a Desired to Undesired Ratio (D/U) is 0 dB such that main path power as desired power is equal to echo power as undesired power.

When the D/U is 0 dB, all OFDM symbols at a specific time may also be erased (i.e., drop to zero in power) due to a Doppler frequency in a flutter which is a communication path to which an echo with a Doppler frequency applied thereto and having a delay of "0" has been added.

In addition, burst errors may occur due to unstable power or undesirable conditions of wirings from antennas to receivers.

In the related art, error correcting codes having excellent performance in AWGN communication paths are also frequently used in communication paths in which burst errors or erasures occur as described above.

On the other hand, when an LDPC code is decoded, a variable node corresponding not only to a column of a parity check matrix H but also to a code bit of the LDPC code is calculated according to Equation (1) involving addition of a code bit (a received value $u_{0i}$) of an LDPC code as shown in FIG. 6. Therefore, the accuracy of the obtained message is reduced if an error occurs at a code bit used in the variable node calculation.

In addition, when an LDPC code is decoded, a check node is calculated according to Equation (7) using a message obtained at a variable node connected to the check node. Therefore, the decoding performance is reduced if an error including an erasure simultaneously occurs at (a plurality of code bits of the LDPC code corresponding to) a plurality of variable nodes connected to each of a large number of check nodes.

More specifically, for example when two or more variable nodes connected to a check node are erased simultaneously, the check node returns a message with a probability of "0" being equal to the probability of "1" to every variable node connected to the check node. In this case, the check node returning the message with equal probabilities of "0" and "1" does not contribute to one decoding process which is a set of a variable node calculation and a check node calculation. This increases the number of required decoding processes, thereby decreasing the decoding performance and increasing power consumption of a receiver that performs LDPC code decoding.

Thus, there is a need to provide a method for increasing resistance to burst errors or erasures while maintaining the performance of AWGN communication paths.

Here, it will be possible to increase the decoding performance if a bit interleaver that interleaves code bits of an LDPC code is provided between an LDPC encoder and a modulator to improve the performance of LDPC codes in AWGN communication paths as described above and if the bit interleaver is designed such that it can perform interleaving to reduce the probability that an error will simultaneously occur at (a plurality of code bits of an LDPC code corresponding to) a plurality of variable nodes connected to a check node.

The invention has been made in view of the above circumstances and provides a data processing apparatus and method which can increase resistance to errors in code bits of LDPC codes such as burst errors or erasures.

A data processing apparatus for interleaving data according to an embodiment of the invention includes a parity interleaver for performing parity interleaving on a Low Density Parity Check (LDPC) code obtained by performing LDPC encoding according to a parity check matrix including a parity matrix corresponding to parity bits of the LDPC code, the parity matrix having a stepwise structure, so that a parity bit of the LDPC code is interleaved to a different parity bit position.

A data processing method for a data processing apparatus interleaving data according to an embodiment of the invention includes the step of causing the data processing apparatus to perform parity interleaving on a Low Density Parity Check (LDPC) code obtained by performing LDPC encoding according to a parity check matrix including a parity matrix corresponding to parity bits of the LDPC code, the parity matrix having a stepwise structure, so that a parity bit of the LDPC code is interleaved to a different parity bit position.

That is, according to the embodiments of the invention, parity interleaving is performed on an LDPC code obtained by performing LDPC encoding according to a parity check matrix including a stepwise-structured parity matrix corresponding to parity bits of the LDPC code so that parity bits of the LDPC code are interleaved to different parity bit positions.

The data processing apparatus may be an independent device and may also be an internal block included in a device.

Detailed Explanation of an Example Bit Interleaver

Figure 8:
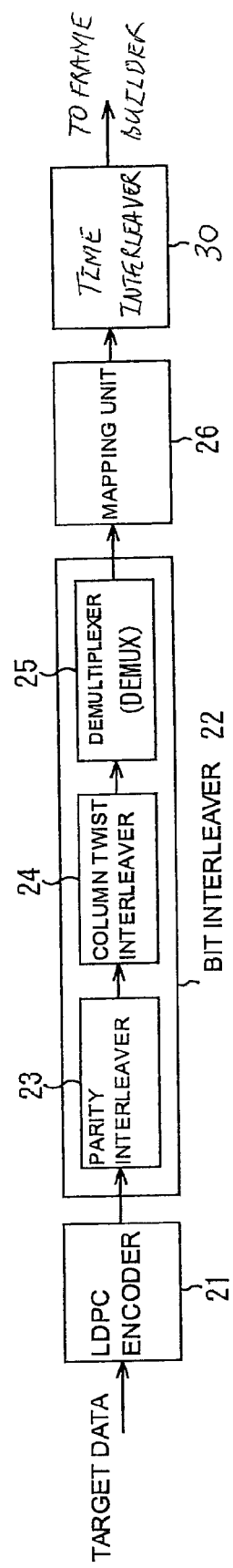
FIG. 8 is a schematic block diagram illustrating an example configuration of a transmitter.

FIG. 8 provides a more detailed representation of parts of the transmitter shown in FIG. 1, which illustrate the operation of the bit interleaver. In particular the LDPC encoder 21, will now be described. The LDPC encoder 21 encodes the target data into an LDPC encoded data bits including information bits corresponding to the target data according to a parity check matrix, in which a parity matrix corresponding to parity bits of the LDPC code has a stepwise structure.

Specifically, the LDPC encoder 21 encodes target data into an LDPC code defined, for example in accordance with the DVB-S.2 specification and outputs the LDPC code.

The LDPC code defined in the DVB-S.2 specification is an Irregular Repeat Accumulate (IRA) code and a parity matrix in a parity check matrix of the LDPC code has a stepwise structure. Details of the parity matrix and the stepwise structure thereof will be described below. An example of the IRA code is described in "Irregular Repeat-Accumulate Codes," H. Jin, A. Khandekar, and R. J. McEliece, in Proceedings of 2nd International Symposium on Turbo codes and Related Topics, pp. 1-8, September 2000.

The LDPC code output from the LDPC encoder 21 is provided to the bit interleaver 22.

The bit interleaver 22 is a data processing apparatus that interleaves data and includes a parity interleaver 23, a column twist interleaver 24, and a demultiplexer 25.

The parity interleaver 23 performs parity interleaving on the LDPC code from the LDPC encoder 21 to interleave parity bits of the LDPC code to different parity bit positions and provides the parity-interleaved LDPC code to the column twist interleaver 24.

The column twist interleaver 24 performs column twist interleaving on the LDPC code from the parity interleaver 23 and then provides the column-twist-interleaved LDPC code to the demultiplexer 25.

Thus, the LDPC code is transmitted after two or more code bits of the LDPC code are mapped to one orthogonally modulated symbol through the mapping unit 26 described below.

The column twist interleaver 24 performs permutation (for example, column twist interleaving described below) on the code bits of the LDPC code received from the parity interleaver 23 such that a plurality of code bits of the LDPC code corresponding to "1" in an arbitrary row in the parity check matrix used by the LDPC encoder 21 is not mapped to one symbol.

The demultiplexer 25 performs a reordering process on the LDPC code received from the column twist interleaver 24 such that the positions of two or more code bits of the LDPC code to be mapped to one symbol are reordered, obtaining an LDPC code with increased resistance to AWGN, and then provides the obtained LDPC code to the mapping unit 26.

The mapping unit 26 maps two or more code bits of the LDPC code from the demultiplexer 25 to each signal point that is determined according to a modulation scheme that the orthogonal modulator uses to perform orthogonal modulation (multi-value modulation).

More specifically, the mapping unit 26 converts the LDPC code from the demultiplexer 25 into symbols (symbol values) represented by signal points determined according to the modulation scheme on an IQ plane (IQ constellation) defined with an I axis representing I components of the same phases as carriers and a Q axis representing Q components orthogonal to carriers.

The modulation scheme that the OFDM transmitter of FIG. 1 uses to perform orthogonal modulation includes a modulation scheme defined in the DVB-T specification, examples of which include Quadrature Phase Shift Keying (QPSK), 16 Quadrature Amplitude Modulation (16QAM), 64QAM, 256QAM, 1024QAM, and 4096QAM. One of the modulation schemes that the orthogonal modulator uses to perform orthogonal modulation is preset, for example through operation by an operator who operates the transmitter of FIG. 1. Examples of other modulation schemes that the orthogonal modulator can use to perform orthogonal modulation include 4 Pulse Amplitude Modulation (4PAM).

The symbol obtained at the mapping unit 26 is provided to the time interleaver, which may interleaver different LDPC code words onto different OFDM symbols. The output of the time interleaver 30 is then fed to the frame builder of FIG. 1. The remaining parts of the transmitter shown in FIG. 1 perform orthogonal modulation of the sub-carrier signals of the OFDM symbol received from the mapping unit 26 to produce a modulated signal and then transmits the modulated signal.

Figure 9:
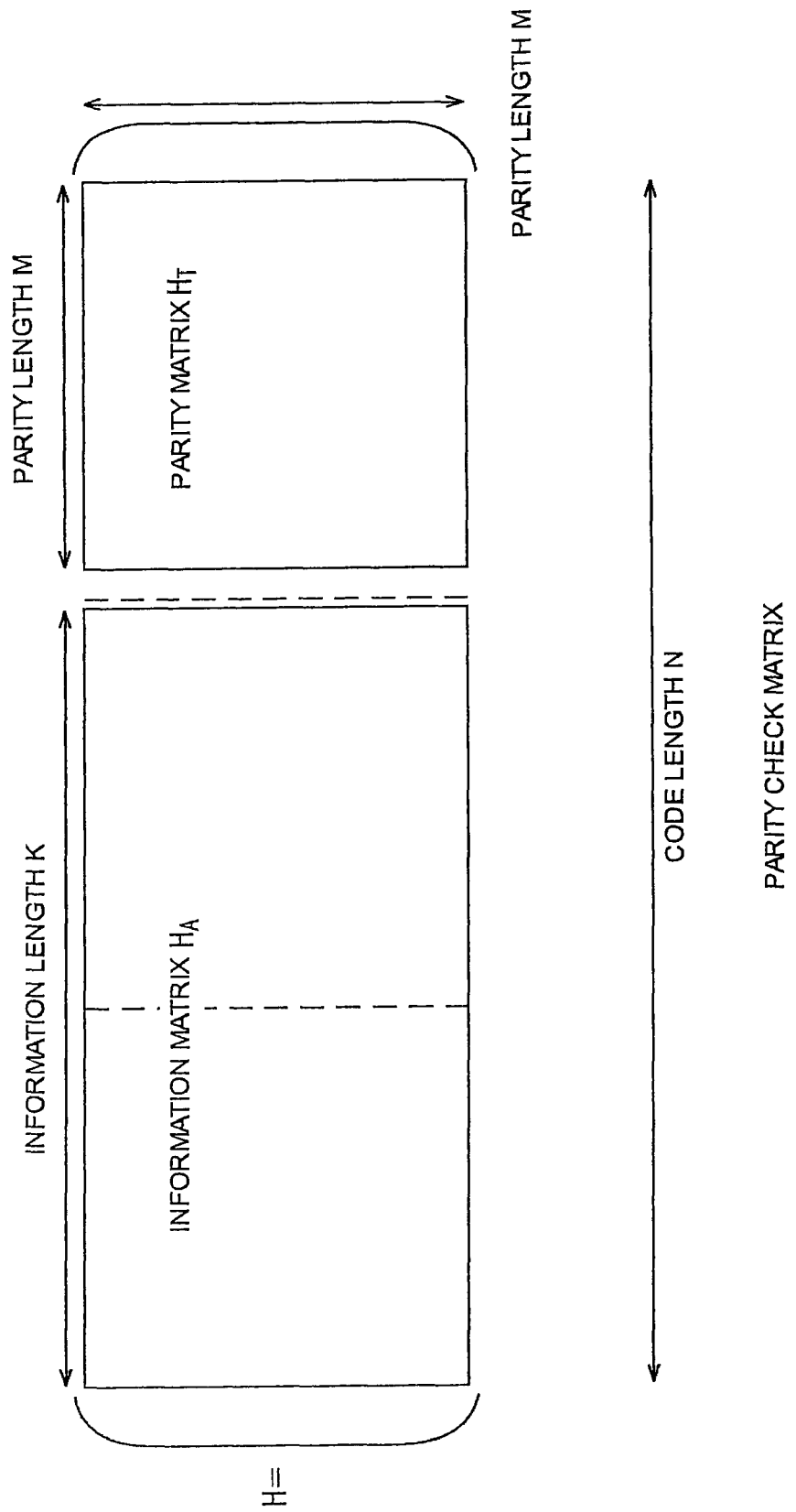
FIG. 9 illustrates a parity check matrix.

FIG. 9 illustrates a parity check matrix H that the LDPC encoder 21 of FIG. 8 uses for LDPC encoding.

The parity check matrix H has a Low-Density Generation Matrix (LDGM) structure and can be expressed by an equation "$H=[H_A|H_T]$" including an information matrix $H_A$ as a left component and a parity matrix $H_T$ as a right component, where the information matrix $H_A$ corresponds to information bits among the code bits of the LDPC code and the parity matrix $H_T$ corresponds to parity bits.

Here, the number of information bits and the number of parity bits among the code bits of one LDPC code (one codeword) are defined as an information length of K and a parity length of M and the number of the code bits is defined as a code length of N(=K+M).

The information length K and the parity length M of an LDPC code of a code length of N are determined based on a code rate. Thus, the parity check matrix H is an M×N matrix. Additionally, the information matrix $H_A$ is an M×K matrix and the parity matrix $H_T$ is an M×M matrix.

FIG. 10 illustrates a parity matrix $H_T$ of a parity check matrix H of an LDPC code defined in the DVB-S.2 specification.

The parity matrix $H_T$ of the parity check matrix H of an LDPC code defined in the DVB-S.2 specification has a stepwise structure such that elements of "1" of the parity matrix $H_T$ are arranged in a stepwise fashion as shown in FIG. 10. The first row of the parity check matrix H has a weight of 1 and the remaining rows have a weight of 2. The last column of the parity check matrix H has a weight of 1 and the remaining columns have a weight of 2.

The LDPC code of the parity check matrix H having the stepwise-structured parity matrix $H_T$ can be easily generated using the parity check matrix H.

More specifically, let a row vector c represent an LDPC code (codeword) and let $C^T$ represent a column vector obtained by transposing the row vector. In addition, let a row vector A represent an information bit part of the row vector c, which is the LDPC code and, let a row vector T represent a parity bit part thereof.

In this case, the row vector c can be expressed by an equation "c=[A|T]" including a row vector A as a left component and a row vector T as a right component, where the row vector A corresponds to information bits and the row vector T corresponds to parity bits.

The parity check matrix H and the row vector c=[A|T], which corresponds to the LDPC code, need to satisfy an equation "$Hc^T=0$." Thus, the value of each element of the row vector T corresponding to parity bits included in the row vector c=[A|T] can be sequentially obtained by setting an element of each row of the column vector $Hc^T$ in the equation "$Hc^T=0$" to zero in the order starting from the element of the first row, when the parity matrix $H_T$ in the parity check matrix $H=[H_A|H_T]$ has a stepwise structure as shown in FIG. 10.

FIGS. 11A and 11B illustrate a parity check matrix H of an LDPC code and column weights defined in the DVB-S.2 specification.

That is, FIG. 11A illustrates a parity check matrix H of an LDPC code and column weights defined in the DVB-S.2 specification.

First to KXth columns of the parity check matrix H have a column weight of X, the next K3 columns have a column weight of 3, the next M−1 columns have a column weight of 2, and the last column has a column weight of 1.

Here, the sum of the numbers of columns "KX+K3+M−1+1" is equal to the code length of N.

In the DVB-S.2 specification, the numbers of columns KX, K3, and M (parity length) and the column weight X are defined as shown in FIG. 111B.

That is, FIG. 11B illustrates the numbers of columns KX, K3, and M and the column weight X for each code rate of LDPC codes defined in the DVB-S.2 specification.

Two LDPC codes with respective code lengths of N of 64800 bits and 16200 bits are defined in the DVB-S.2 specification.

In addition, 11 nominal code rates 1/4, 1/3, 2/5, 1/2, 3/5, 2/3, 3/4, 4/5, 5/6, 8/9, and 9/10 are defined for the LDPC code whose code length N is 64800 bits and 10 nominal code rates 1/4, 1/3, 2/5, 1/2, 3/5, 2/3, 3/4, 4/5, 5/6, and 8/9 are defined for the LDPC code whose code length N is 16200 bits as shown in FIG. 11B.

For LDPC codes, it is known that the error rate of a code bit decreases as the weight of a column corresponding to the code bit in a parity check matrix H increases.

In the case of the parity check matrix H defined in the DVB-S.2 specification Shown in FIGS. 11A and 11B, the weight of a column increases as the ordinal number of the column decreases (i.e., as the column is closer to the left end of the parity check matrix H) and therefore a code bit in an LDPC code corresponding to the parity check matrix H is more robust against (resistant to) errors as the ordinal number of the code bit decreases (i.e., the first code bit is most resistant) and is more susceptible to errors as the ordinal number of the code bit increases (i.e., the last code bit is most susceptible).

Figure 12:
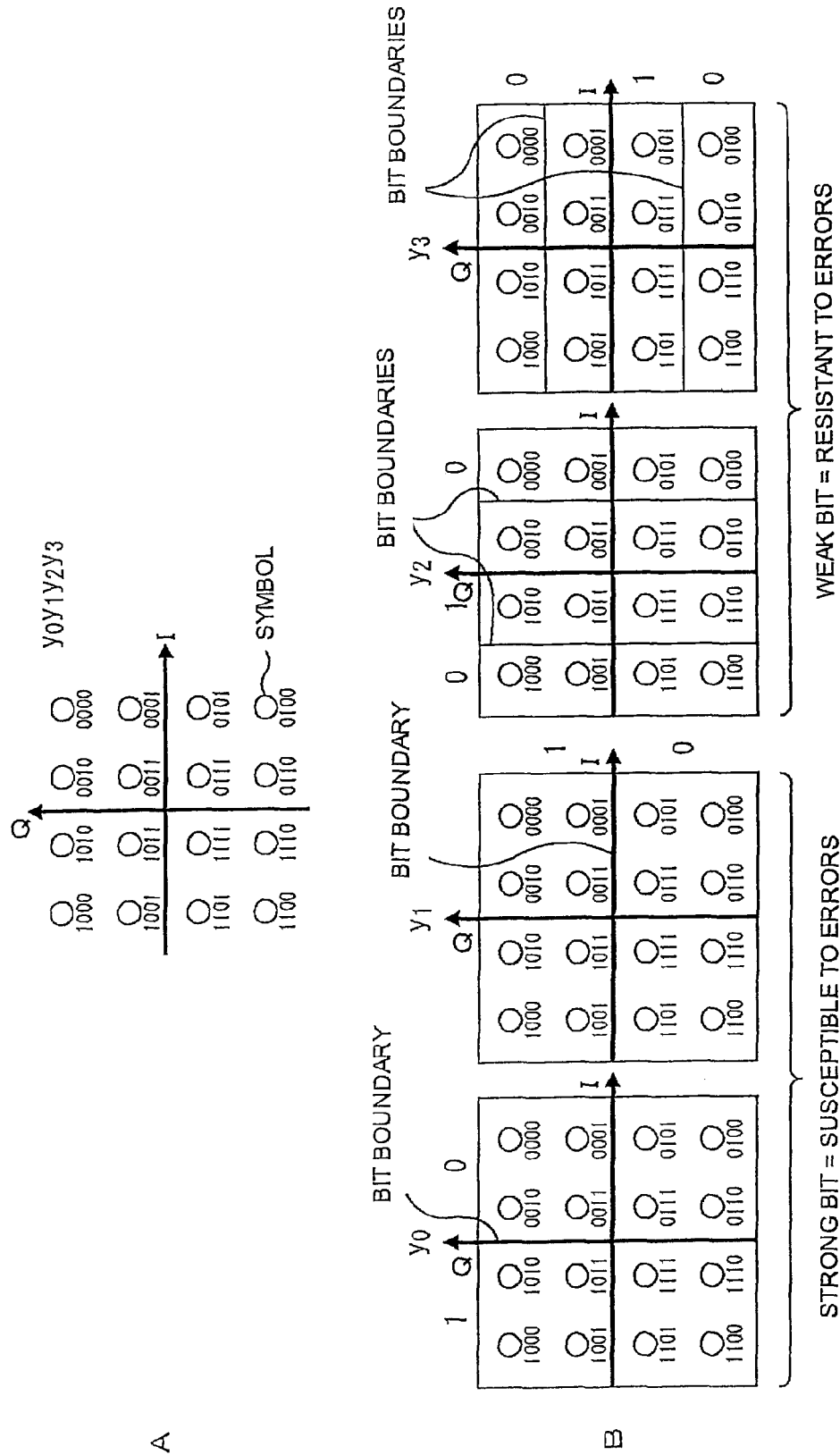
FIGS. 12a and 12b illustrate an arrangement of signal points of 16QAM.

FIGS. 12A and 12B illustrate an arrangement of (signal points corresponding to) 16 symbols in an IQ plane in the case where 16QAM is performed at the orthogonal modulator.

That is, FIG. 12A illustrates symbols of 16QAM.

In 16QAM, one symbol represents 4 bits and 16 ($=2^4$) symbols are provided. In addition, 16 symbols are arranged into a square of 4×4 symbols in the I and Q directions, centered at the origin of the IQ plane.

Here, when $y_0$, $y_1$, $y_2$, and $y_3$ denote 4 bits represented by one symbol of 16QAM, sequentially starting from the most significant bit (MSB), the mapping unit 26 of FIG. 8 maps 4 code bits of an LDPC code to a symbol of 4 bits $y_0$ to $y_3$ corresponding to the 4 code bits in the case where the modulation scheme is 16QAM.

FIG. 12B shows bit boundaries of four bits $y_0$ to $y_3$ represented by a 16QAM symbol.

Here, a bit boundary of a bit $y_i$ (i=0, 1, 2, 3 in FIGS. 12A and 12B) is a boundary between symbols with a bit $y_i$ of "0" and symbols with a bit $y_i$ of "1."

As shown in FIG. 12B, a boundary corresponding to the Q axis in the IQ plane is the only bit boundary for the first bit (i.e., the MSB) $y_0$ of the 4 bits $y_0$ to $y_3$ represented by a 16QAM symbol and a boundary corresponding to the I axis in the IQ plane is the only bit boundary for the second bit (i.e., the second MSB) $y_1$.

In addition, two boundaries, one between the first and second columns of symbols (counting from the left side) among the 4×4 symbols and the other between the third and fourth columns, are bit boundaries for the third bit $y_2$.

Further, two boundaries, one between the first and second rows of symbols (counting from the top) among the 4×4 symbols and the other between the third and fourth rows, are bit boundaries for the fourth bit $y_3$.

Each bit $y_i$ represented by a symbol is more resistant to errors as the number of symbols distant from the bit boundary increases and is more susceptible to errors as the number of symbols near the bit boundary increases.

When a bit resistant to (robust against) errors is referred to as a "strong bit" and a bit susceptible to (sensitive to) errors is referred to as a "weak bit," the first bit (i.e., the MSB) $y_0$ and the second bit $y_1$ are strong bits and the third bit $y_2$ and the fourth bit $y_3$ are weak bits as shown in FIGS. 12A and 12B.

FIGS. 13 to 15 illustrate an arrangement of (signal points corresponding to) 64 symbols in an IQ plane in the case where 64QAM is performed at the orthogonal modulator.

In 64QAM, one symbol represents 4 bits and 64 ($=2^6$) symbols are provided. In addition, 64 symbols are arranged into a square of 8×8 symbols in the I and Q directions, centered at the origin of the IQ plane.

Here, when $y_0$, $y_1$, $y_2$, $y_3$, $y_4$, and $y_5$ denote 6 bits represented by one symbol of 64QAM, sequentially starting from the most significant bit (MSB), the mapping unit 26 of FIG. 8 maps 6 code bits of an LDPC code to a symbol of 6 bits $y_0$ to $y_5$ corresponding to the 6 code bits in the case where the modulation scheme is 64QAM.

FIG. 13 shows bit boundaries of the first and second bits $y_0$ and $y_1$ among the 6 bits $y_0$ to $y_5$ represented by a 64QAM symbol, FIG. 14 shows bit boundaries of the third and fourth bits $y_2$ and $y_3$, and FIG. 15 shows bit boundaries of the fifth and sixth bits $y_4$ and $y_5$.

One bit boundary is present for each of the first and second bits $y_0$ and $y_1$ as shown in FIG. 14. Two bit boundaries are present for each of the third and fourth bits $y_2$ and $y_3$ as shown in FIG. 14 and four bit boundaries are present for each of the fifth and sixth bits $y_4$ and $y_5$ as shown in FIG. 15.

Accordingly, the first and second bits $y_0$ and $y_1$ among the 6 bits $y_0$ to $y_5$ represented by a 64QAM symbol are strongest bits, the third and fourth bits $y_2$ and $y_3$ are second strongest bits, and the fifth and sixth bits $y_4$ and $y_5$ are weak bits.

From FIGS. 13, 14, and 15, it can be seen that, in the case of bits of orthogonally modulated symbols, more significant bits are strong bits and less significant are weak bits.

The LDPC code output from the LDPC encoder 21 of FIG. 8 includes error-susceptible code bits and error-resistant code bits as described above.

The bits of symbols orthogonally modulated by the orthogonal modulator include strong bits and weak bits as described above with reference to FIGS. 12 to 15.

Accordingly, when error-susceptible code bits of an LDPC code are mapped to weak bits of orthogonally modulated symbols, overall resistance to errors is reduced.

Therefore, the invention suggests an interleaver that interleaves code bits of an LDPC code so that error-susceptible code bits of the LDPC code are mapped to strong bits of orthogonally modulated symbols.

The demultiplexer 25 of FIG. 8 performs the operation of this interleaver.

FIGS. 16A to 16D illustrate the operation of the demultiplexer 25 of FIG. 8.

Specifically, FIG. 16A illustrates an example functional configuration of the demultiplexer 25.

The demultiplexer 25 includes a memory 31 and a reordering unit 32. An LDPC code is provided to the memory 31. The memory 31 has a storage capacity for storing mb bits in a row (horizontal) direction and storing N/mb bits in a column (vertical) direction. Code bits of the LDPC code provided to the memory 31 are written in a column direction to the memory 31 and are read in a row direction from the memory 31 and the read code bits are then provided to the reordering unit 32.

Here, "m" represents the number of code bits of the LDPC code mapped to one symbol and "b" represents a specific positive integer (i.e., factor) by which "m" is multiplied to obtain an integral multiple of "m." In addition, "N" (=information length K+parity length M) represents the code length of the LDPC code as described above.

FIG. 16A illustrates an example configuration of the demultiplexer 25 when the modulation scheme is 64QAM. Accordingly, the number of code bits "m" of an LDPC code mapped to one symbol is 6.

In FIG. 16A, the factor "b" is 1 and therefore the memory 31 has a storage capacity of N/(6×1)×(6×1) bits in the column and row directions.

In the following, a storage region of the memory 31, which is one bit in a row direction and extends in a column direction, is referred to as a column as appropriate. In the example of FIG. 16A, the memory 31 includes 6 (=6×1) columns.

The demultiplexer 25 writes code bits of the LDPC code to the memory 31 in a column direction from the top to the bottom of each column, sequentially starting from the leftmost column to the right.

When code bits have been completely written up to the bottom of the rightmost column, code bits are read from the memory 31 in a row direction, sequentially starting from the first row of all columns of the memory 31 in units of 6 bits (i.e., mb bits), and the read code bits are provided to the reordering unit 32.

The reordering unit 32 reorders positions of 6 code bits received from the memory 31 and outputs the 6 reordered bits as 6 bits $y_0$, $y_1$, $y_2$, $y_3$, $y_4$, and $y_5$ representing one 64QAM symbol.

More specifically, when the 6 code bits read from the memory 31 in a row direction are denoted by $b_0$, $b_1$, $b_2$, $b_3$, $b_4$, and $b_5$ sequentially starting from the MSB, code bits including and adjacent to the bit "$b_0$" are error-resistant code bits and code bits including and adjacent to the bit "$b_5$" are error-susceptible code bits according to the column weight relationship described above with reference to FIG. 111.

The reordering unit 32 reorders positions of the 6 code bits $b_0$ to $b_5$ received from the memory 31 such that error-susceptible code bits among the 6 code bits $b_0$ to $b_5$ from the memory 31 are allocated to strong bits among the 6 bits $y_0$ to $y_5$ representing one 64QAM symbol.

Various companies have suggested a variety of methods for reordering the 6 code bits $b_0$ to $b_5$ from the memory 31 and allocating them to 6 bits $y_0$ to $y_5$ representing one 64QAM symbol, respectively.

FIG. 16B illustrates a first reordering method, FIG. 16C illustrates a second reordering method, and FIG. 16D illustrates a third reordering method.

In FIGS. 16B to 16D, a line connecting bits $b_i$ and $y_j$ indicates that a code bit $b_i$ is allocated to a symbol bit $y_j$ (i.e., the position of the code bit $b_i$ is changed to that of the symbol bit $y_j$), similar to FIGS. 17A and 17B described below.

While the first reordering method of FIG. 16B suggests using one of three reordering types, the second reordering method of FIG. 16C suggests using one of two reordering types.

The third reordering method of FIG. 16D suggests sequential selection and usage of 6 reordering types.

Figure 16:
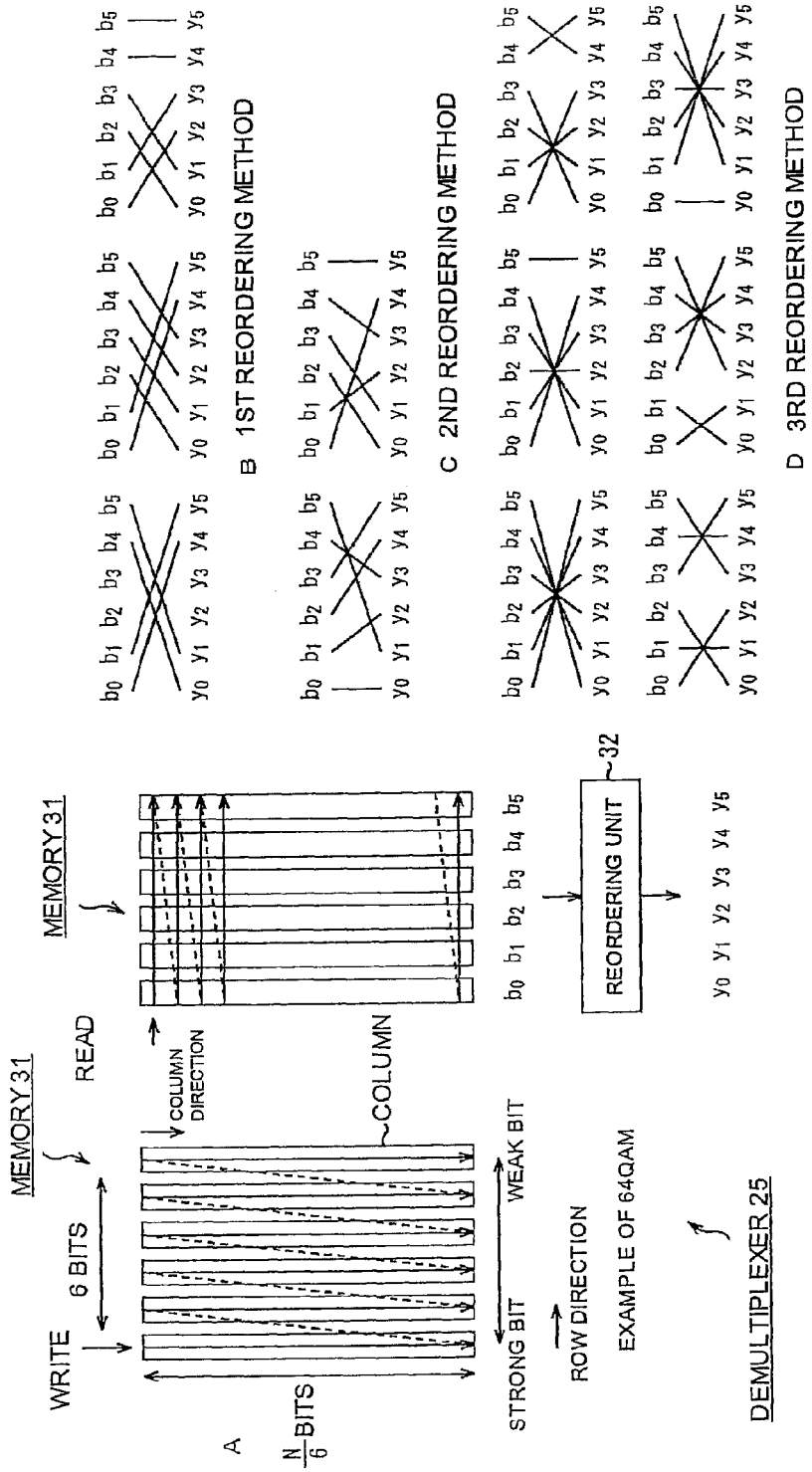
FIGS. 16a to 16d illustrate the operation of a demultiplexer 25.

FIGS. 17A and 17B illustrate an example configuration of a demultiplexer 25 and a fourth reordering method in the case where the modulation method is 64QAM (so that the number of code bits "m" of an LDPC code mapped to one symbol is 6 as in FIG. 16) and the factor "b" is 2.

When the factor "b" is 2, the memory 31 has a storage capacity of N/(6×2)×(6×2) bits in the column and row directions and has 12 (=6×2) columns.

FIG. 17A illustrates the order in which code bits of an LDPC code are written to the memory 31.

The demultiplexer 25 writes code bits of the LDPC code to the memory 31 in a column direction from the top to the bottom of each column, sequentially starting from the leftmost column to the right as described above with reference to FIG. 16A.

When code bits have been completely written up to the bottom of the rightmost column, code bits are read from the memory 31 in a row direction, sequentially starting from the first row of all columns of the memory 31 in units of 12 bits (i.e., mb bits), and the read code bits are provided to the reordering unit 32.

The reordering unit 32 reorders positions of 12 code bits received from the memory 31 according to the fourth reordering method and outputs the 12 reordered bits as 12 bits representing two symbols (i.e., b symbols) of 64QAM, i.e., 6 bits $y_0$, $y_1$, $y_2$, $y_3$, $y_4$, and $y_5$ representing one 64QAM symbol and 6 bits $y_0$, $y_1$, $y_2$, $y_3$, $y_4$, and $y_5$ representing the other symbol.

FIG. 17B illustrates the fourth reordering method performed by the reordering unit 32 of FIG. 17A.

The optimum of the reordering methods, which minimizes error rates in AWGN communication paths, depends on the code rate of an LDPC code or the like.

How the parity interleaver 23 of FIG. 8 performs parity interleaving will now be described with reference to FIGS. 18 to 20.

Figure 18:
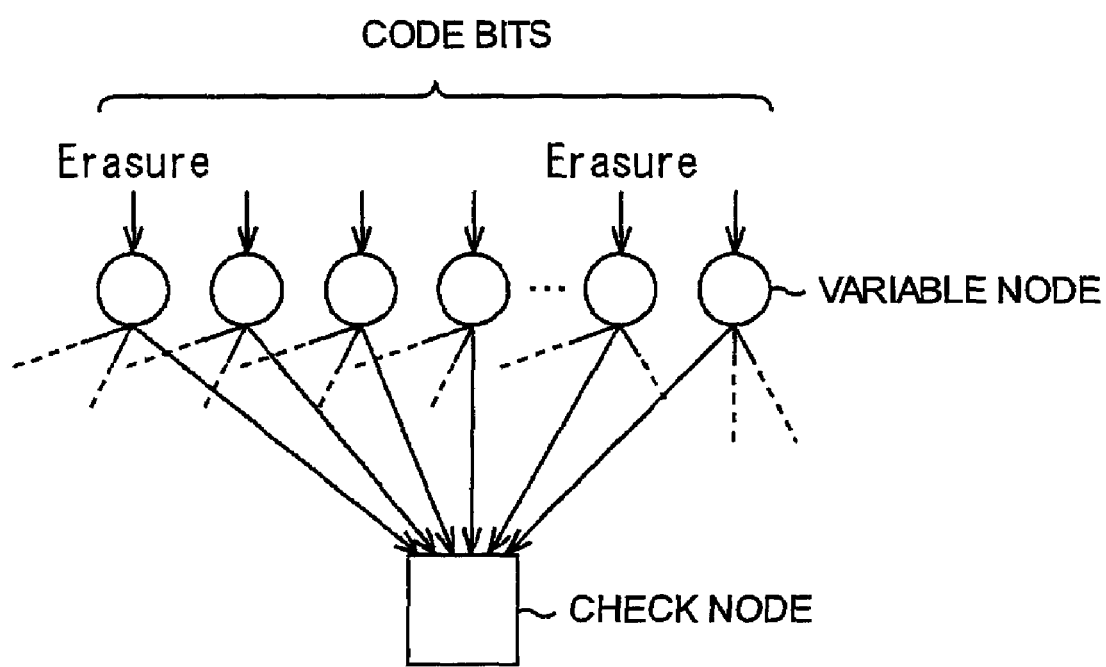
FIG. 18 illustrates a Tanner graph for decoding of an LDPC code.

FIG. 18 illustrates (part of) a Tanner graph of a parity check matrix of an LDPC code.

If an error such as an erasure simultaneously occurs in two or more variable nodes connected to (or two or more code bits corresponding to) a check node, then the check node returns a message with a probability of "0" being equal to the probability of "1" to every variable node connected to the check node as shown in FIG. 18. Therefore, the decoding performance is reduced if multiple variable nodes connected to the same check node are erased.

Figure 11:
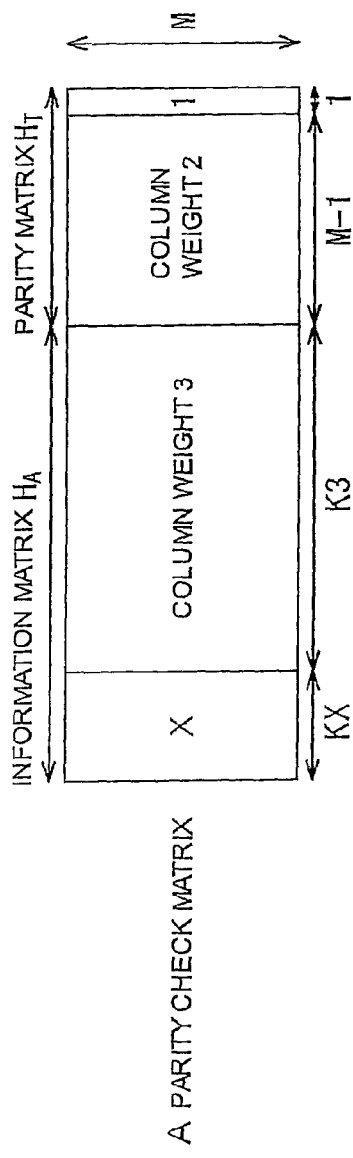
FIGS. 11a and 11b illustrate a parity check matrix of an LDPC code and column weights defined in the DVB-S.2 specification.

An LDPC code defined in the DVB-S.2 specification, which is output by the LDPC encoder 21 of FIG. 8, is an IRA code and a parity matrix $H_T$ of the parity check matrix H has a stepwise structure as shown in FIG. 11.

FIGS. 19A and 19B illustrate a parity matrix $H_T$ having a stepwise structure and a Tanner graph corresponding to the parity matrix $H_T$.

That is, FIG. 19A illustrates a stepwise-structured parity matrix $H_T$ and FIG. 19B illustrates a Tanner graph corresponding to the parity matrix $H_T$ of FIG. 19A.

When the parity matrix $H_T$ has a stepwise structure, variable nodes whose messages are obtained using adjacent code bits (parity bits) of an LDPC code, corresponding to columns including elements having a value of "1" in the parity matrix $H_T$, are connected to the same check node in the Tanner graph of the parity matrix $H_T$.

Accordingly, if an error such as a burst error or erasure simultaneously occurs in adjacent parity bits, the decoding performance is reduced since a check node connected to variable nodes corresponding respectively to the erroneous parity bits (i.e., variable nodes whose messages are obtained using the parity bits) returns a message with a probability of "0" being equal to the probability of "1" to every variable node connected to the check node. The decoding performance is also reduced when the burst length, which is the number of bits erroneous due to the burst, is great.

Then, the parity interleaver 23 of FIG. 8 performs parity interleaving on the LDPC code from the LDPC encoder 21 to interleave parity bits of the LDPC code to different parity bit positions in order to prevent a reduction in the decoding performance.

Figure 20:
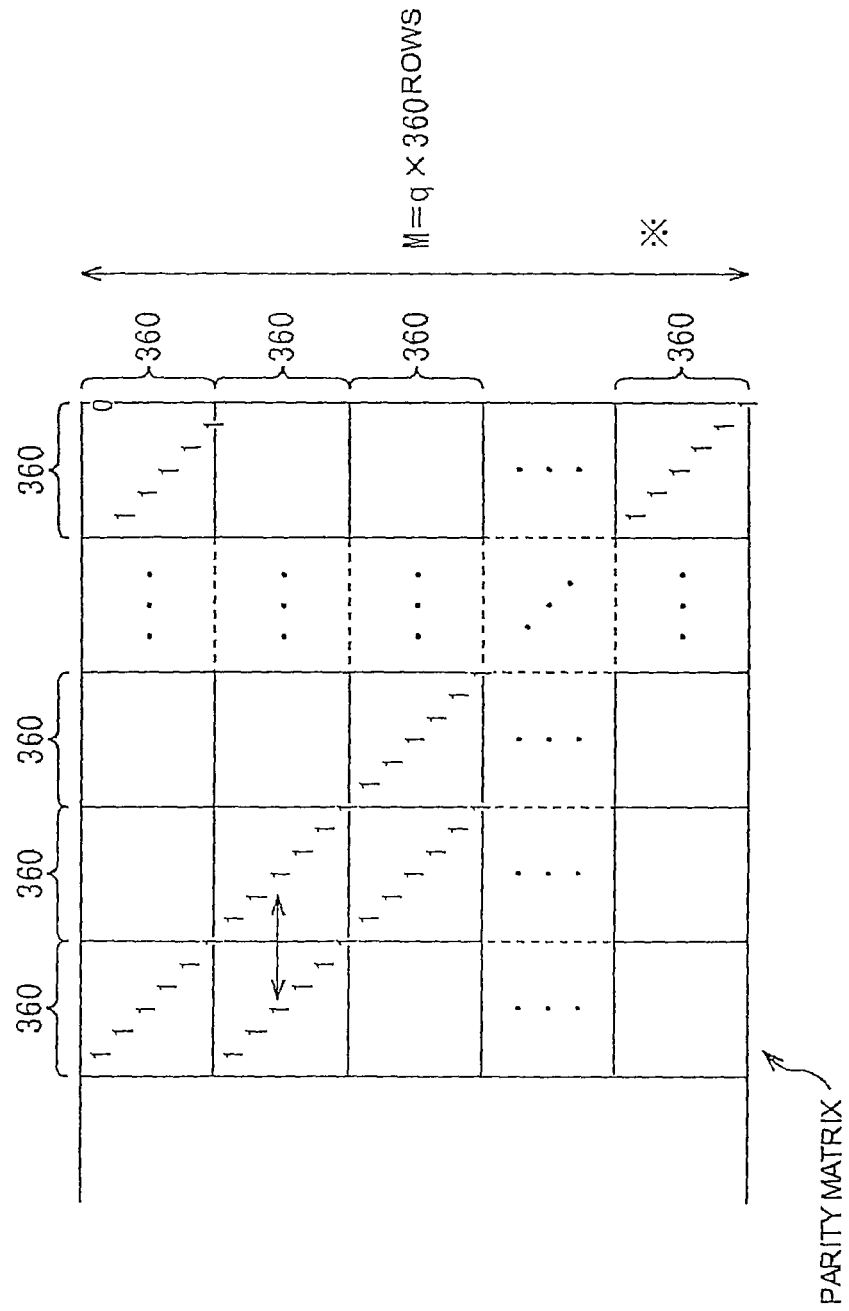
FIG. 20 illustrates a parity matrix $H_T$ of a parity check matrix H corresponding to an LDPC code after parity interleaving is performed on the LDPC code.

FIG. 20 illustrates a parity matrix $H_T$ of a parity check matrix H corresponding to an LDPC code after the parity interleaver 23 of FIG. 8 performs parity interleaving on the LDPC code.

Here, an information matrix $H_A$ in the parity check matrix H corresponding to the LDPC code defined in the DVB-S.2 specification output from the LDPC encoder 21 has a cyclic structure.

The term "cyclic structure" refers to a structure in which a column, when cyclically shifted, matches another column. Examples of the cyclic structure include a structure in which the position of an element of "1" of each row of every P columns corresponds to that of the first of the P columns that has been cyclically shifted in a column direction by a value proportional to the value "q" obtained by dividing the parity length "M." In the following, the number of columns "P" in the cyclic structure is referred to as a unit number of columns having a cyclic structure as appropriate.

Examples of the LDPC code defined in the DVB-S.2 specification output from the LDPC encoder 21 include two types of LDPC codes with respective code lengths of N of 64800 bits and 16200 bits as described above with reference to FIG. 11.

Now, the following description will be given focusing on the type of LDPC codes having a code length N of 64800 bits among the two types of LDPC codes with respective code lengths of N of 64800 bits and 16200 bits. 11 nominal code rates are defined for the LDPC code whose code length N is 64800 bits as described above with reference to FIG. 11.

For any LDPC code having a code length N of 64800 bits of each of the 11 nominal code rates, the unit number of columns P having a cyclic structure is defined as "360," which is one of the divisors (excluding 1 and M) of the parity length M, in the DVB-S.2 specification.

For an LDPC code having a code length N of 64800 bits of each of the 11 nominal code rates, the parity length M is calculated to be a non-prime value according to an equation M=q×P=q×360 using a value "q" that varies depending on the code rate. Accordingly, similar to the unit number of columns P having a cyclic structure, the value "q" is another of the divisors (excluding 1 and M) of the parity length M and is calculated by dividing the parity length M by the unit number of columns P having a cyclic structure (i.e., the parity length M is the product of the divisors "P" and "q" of the parity length M).

When K is the information length, x is an integer equal to or greater than 0 and less than P, and y is an integer equal to or greater than 0 and less than q, the parity interleaver 23 performs parity interleaving on the LDPC code received from the LDPC encoder 21 to interleave a K+qx+y+1th code bit among parity bits, which are K+1th to K+M(=N)th code bits of the LDPC code, to a K+Py+x+1th code bit position.

According to this parity interleaving method, (parity bits corresponding to) variable nodes connected to the same check node are at a distance corresponding to the unit number of columns P having a cyclic structure (360 bits in this example), thereby preventing simultaneous error occurrence in a plurality of variable nodes connected to the same check node. This can improve resistance to burst errors.

The LDPC code, which has undergone the parity interleaving operation such that the K+qx+y+1th code bit is interleaved to the K+Py+x+1th code bit position, is identical to an LDPC code of a parity check matrix (hereinafter referred to as a converted parity check matrix) that is obtained by performing column permutation on the original parity check matrix H to replace (specifically, exchange) the K+Py+x+1th column of the original parity check matrix H with the K+qx+y+1th column.

The parity matrix of the converted parity check matrix has a pseudo-cyclic structure whose unit number of columns is "P" ("360" in FIG. 20) as shown in FIG. 20

Here, the term "pseudo-cyclic structure" refers to a structure in which a portion of the parity matrix, excluding a specific part of the parity matrix, has a cyclic structure. A converted parity check matrix obtained by performing column permutation corresponding to parity interleaving on a parity check matrix of an LDPC code defined in the DVB-S.2 specification has a 360×360 right-corner portion (corresponding to a shifted matrix described below) which is only one element of "1" short of the cyclic structure (i.e., the 360×360 right-corner portion has an element of "0" rather than "1" that is required in the cyclic structure). Since the converted parity check matrix does not have a (complete) cyclic structure, it is referred to as having a "pseudo-cyclic structure."

Actually, the converted parity check matrix of FIG. 20 is obtained by performing row permutation, in addition to the column permutation corresponding to parity interleaving, on the original parity check matrix H to allow the converted parity check matrix to include component matrices described below.

How the column twist interleaver 24 of FIG. 8 performs column twist interleaving as a permutation process will now be described with reference to FIGS. 21 to 24.

The transmitter of FIG. 8 transmits two or more code bits of the LDPC code as one symbol as described above in order to improve the efficiency of use of frequencies. For example, QPSK is used as a modulation method when two code bits are transmitted as one symbol and 16QAM is used as a modulation method when four code bits are transmitted as one symbol.

If an error such as an erasure occurs in a symbol in the case where two or more code bits are transmitted as the symbol as described above, all code bits of the symbol become erroneous (i.e., are erased).

Accordingly, for improving decoding performance, in order to reduce the probability of (code bits corresponding to) variable nodes connected to the same check node being simultaneously erased, it is necessary to prevent variable nodes corresponding to code bits of one symbol from being connected to the same check node.

On the other hand, in the case of the parity check matrix H of the LDPC code defined in the DVB-S.2 specification output from the LDPC encoder 21, the information matrix $H_A$ in the parity check matrix H has a cyclic structure and the parity matrix $H_T$ has a stepwise structure as described above. In the case of the converted parity check matrix which is the parity check matrix of the LDPC code that has been subjected to parity interleaving, the parity matrix also has a cyclic structure (specifically, a pseudo-cycle structure) as described above with reference to FIG. 20.

In the example shown in FIG. 20, neighboring 1's are 360 columns away, and column permutation alone is performed through interleaving, although row permutation is also applied in this example. Parity bits become resistant to burst errors only with this arrangement.

Figures 21A, 21B:
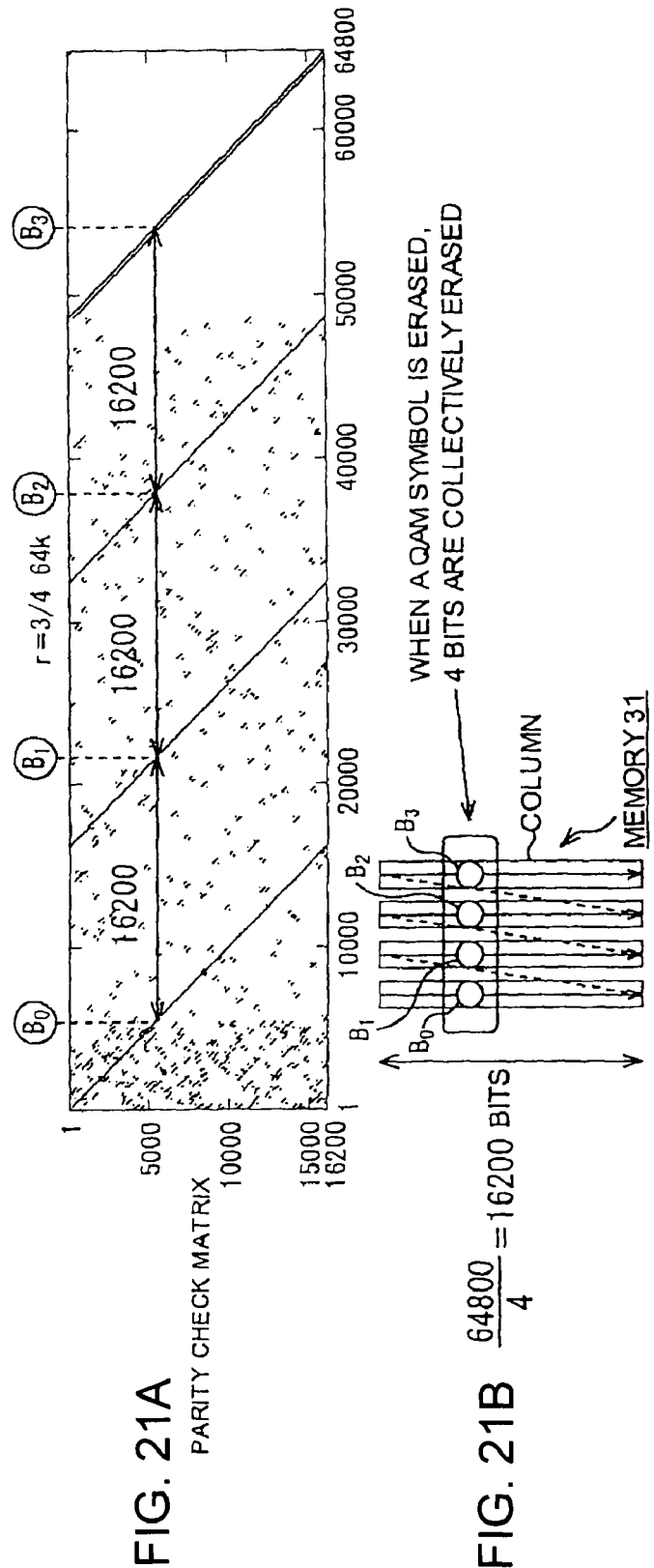
FIGS. 21a and 21b illustrate a converted parity check matrix.

FIGS. 21A and 21B illustrate a converted parity check matrix.

Specifically, FIG. 21A illustrates a converted parity check matrix of a parity check matrix H of an LDPC code having a code length N of 64800 bits and a code rate (r) of 3/4.

In FIG. 21A, the position of each element having a value of "1" in the converted parity check matrix is shown by a dot "•".

FIG. 21B illustrates an operation that the demultiplexer 25 of FIG. 8 performs on an LDPC code of the converted parity check matrix of FIG. 21A, i.e., an LDPC code that has been subjected to parity interleaving. This interleaving is disadvantageous in channels with erasures.

In FIG. 21B, using 16QAM as a modulation method, code bits of the parity-interleaved LDPC code are written in a column direction to four columns which constitute the memory 31 of the demultiplexer 25.

The code bits written in a column direction to the four columns of the memory 31 are read in a row direction in units of 4 bits as one symbol.

In this case, the four code bits $B_0$, $B_1$, $B_2$, and $B_3$ of one symbol may include a plurality of code bits corresponding to "1" in an arbitrary row in the converted parity check matrix of FIG. 21A. In this case, variable nodes corresponding to the four code bits $B_0$, $B_1$, $B_2$, and $B_3$ are connected to the same check node.

Accordingly, if an erasure occurs in a symbol in the case where the four code bits $B_0$, $B_1$, $B_2$, and $B_3$ of the symbol include code bits corresponding to "1" in an arbitrary row in the converted parity check matrix, it is difficult to obtain an appropriate message for the same check node connected to variable nodes corresponding respectively to the code bits $B_0$, $B_1$, $B_2$, and $B_3$, thereby reducing the decoding performance.

When a code rate other than 3/4 is employed, a plurality code bits corresponding to a plurality of variable nodes connected to the same check node may constitute one 16QAM symbol.

Therefore, the column twist interleaver 24 performs column twist interleaving on the parity-interleaved LDPC code from the parity interleaver 23 to interleave the code bits of the parity-interleaved LDPC code so that a plurality of code bits corresponding to "1" in an arbitrary row in the converted parity check matrix are not mapped to one symbol.

Figure 22:
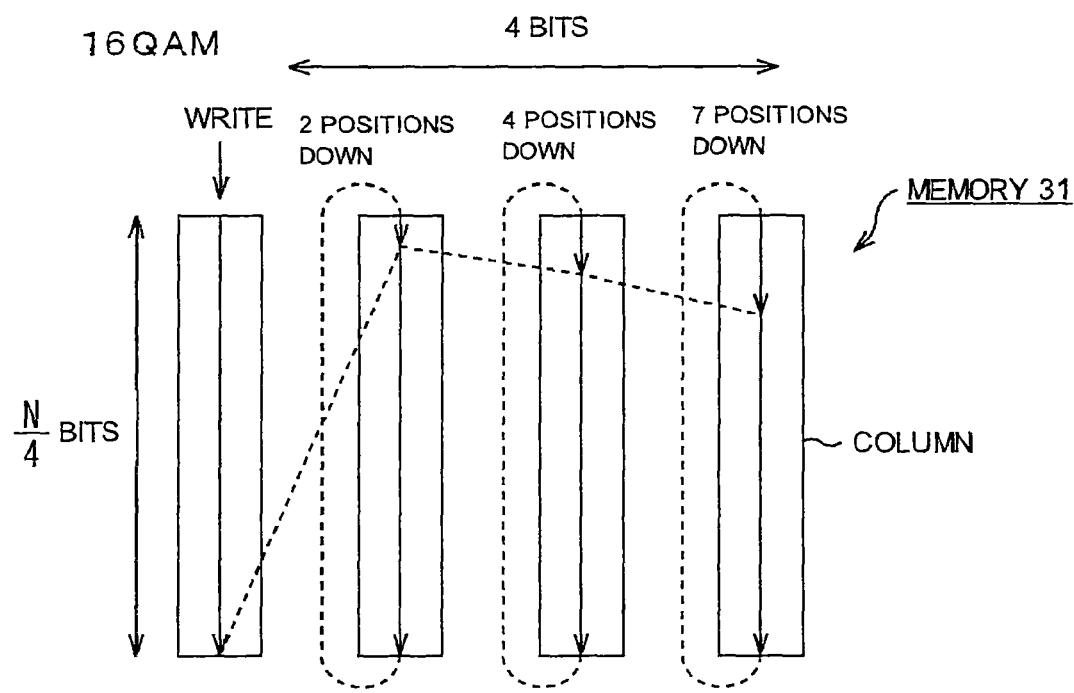
FIG. 22 illustrates the operation of a column twist interleaver 24.

FIG. 22 illustrates how column twist interleaving is performed.

Figure 17:
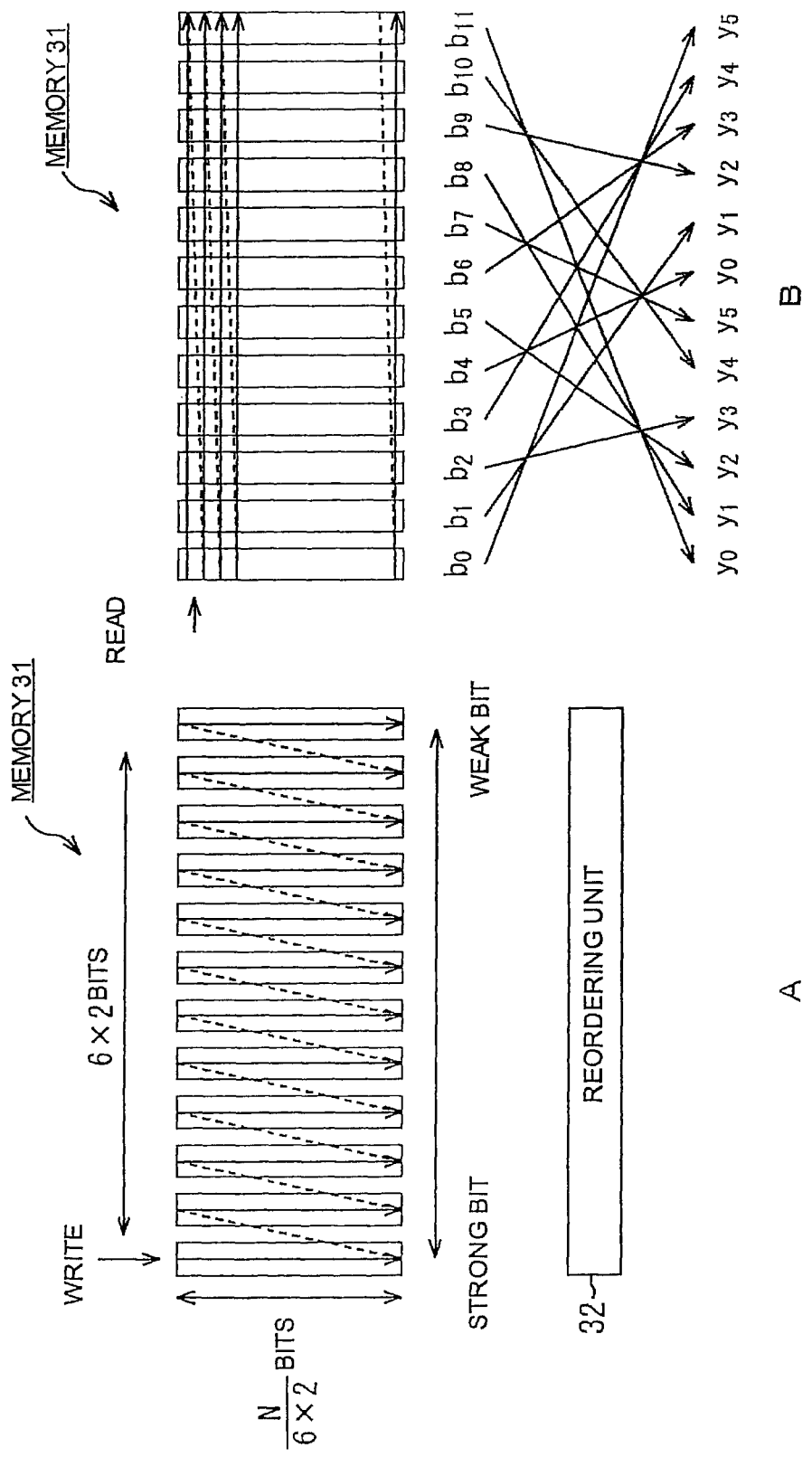
FIGS. 17a and 17b illustrate the operation of the demultiplexer 25.

Specifically, FIG. 22 illustrates the memory 31 of the demultiplexer 25 shown in FIGS. 16 and 17.

The memory 31 has a storage capacity for storing mb bits in a row (horizontal) direction and storing N/mb bits in a column (vertical) direction and includes mb columns as described above with reference to FIG. 16. The column twist interleaver 24 performs column twist interleaving by controlling a writing start position in each column in the memory 31, at which writing starts in the column, when code bits of an LDPC code are written to the memory 31 in a column direction and are read from the memory 31 in a row direction.

More specifically, the column twist interleaver 24 appropriately changes the writing start position at which code bits begin to be written in each of the plurality of columns so that a plurality of code bits read in a row direction to constitute one symbol does not include a plurality of code bits corresponding to "1" in an arbitrary row of the converted parity check matrix. That is, the column twist interleaver 24 permutes code bits of the LDPC code so that a plurality of code bits corresponding to "1" in an arbitrary row of the parity check matrix are not incorporated into the same symbol.

FIG. 22 illustrates an example configuration of the memory 31 in the case where 16QAM is employed as a modulation method and the factor "b" described with reference to FIG. 16 is "1." Accordingly, the number of code bits "m" of the LDPC code mapped to one symbol is 4 and the memory 31 includes 4 (=mb) columns.

The column twist interleaver 24 of FIG. 22 (instead of the demultiplexer 25 of FIG. 16) writes code bits of the LDPC code to the memory 31 in a column direction from the top to the bottom of each of the four columns of the memory 31, sequentially starting from the leftmost column to the right.

When code bits have been completely written up to the rightmost column, the column twist interleaver 24 reads code bits in units of 4 bits (mb bits) in a row direction, starting from the first row of all columns of the memory 31, and outputs the read code bits as a column-twist-interleaved LDPC code to the reordering unit 32 of the demultiplexer 25 shown in FIGS. 16 and 17.

When the address of the first (top) position of each column is represented by "0" and the address of each position along a column direction is represented by a sequentially increasing integer, the column twist interleaver 24 of FIG. 22 determines that the address of a writing start position in the leftmost column is "0," the address of a writing start position in the second column (from the left) is "2," the address of a writing start position in the third column is "4," and the address of a writing start position in the fourth column is "7."

After code bits have been written to a column having a writing start position at an address other than "0" up to the bottom position of the column, the column twist interleaver 24 returns to the first position of the column at an address of "0" and continues writing code bits to the column up to a position immediately prior to the writing start position. The column twist interleaver 24 then performs writing to the next right column.

Performing column twist interleaving as described above can prevent a plurality of code bits corresponding to a plurality of variable nodes connected to the same check node from being allocated to one symbol of 16QAM (i.e., from being incorporated into the same symbol) for an LDPC code of every code rate having a code length N of 64800 as defined in the DVB-S.2 specification. In particular, code bits belonging to the same check mode are not incorporated into the same QAM symbol for all 11 codes of 64 k. This can improve the decoding performance in a communication path in which an erasure occurs.

FIG. 23 illustrates the number of columns of the memory 31 required for column twist interleaving and the addresses of writing start positions in association with each modulation method for an LDPC code of each of the 11 code rates having a code length N of 64800 as defined in the DVB-S.2 specification.

The number of bits "m" of one symbol is 2 and the factor "b" is 1 when one of the first to third reordering methods of FIG. 16 is employed in the reordering process of the demultiplexer 25 shown in FIG. 8 and QPSK is employed as the modulation method.

In this case, the memory 31 has 2 columns for storing 2×1 (=mb) bits in a row direction, and stores 64800/(2×1) bits in a column direction as shown in FIG. 23. The writing start position of the 1st of the 2 columns of the memory 31 is at an address of "0" and the writing start position of the 2nd column is at an address of "2."

In addition, the number of bits "m" of one symbol is 2 and the factor "b" is 2 when the fourth reordering method of FIG. 17 is employed in the reordering process of the demultiplexer 25 shown in FIG. 8 and QPSK is employed as the modulation method.

In this case, the memory 31 has 4 columns for storing 2×2 bits in a row direction, and stores 64800/(2×2) bits in a column direction as shown in FIG. 23. The writing start position of the 1st of the 4 columns of the memory 31 is at an address of "0," the writing start position of the 2nd column is at an address of "2," the writing start position of the 3rd column is at an address of "4," and the writing start position of the 4th column is at an address of "7."

In addition, the number of bits "m" of one symbol is 4 and the factor "b" is 1 when one of the first to third reordering methods of FIG. 16 is employed in the reordering process of the demultiplexer 25 shown in FIG. 8 and 16QAM is employed as the modulation method.

In this case, the memory 31 has 4 columns for storing 4×1 bits in a row direction, and stores 64800/(4×1) bits in a column direction as shown in FIG. 23. The writing start position of the 1st of the 4 columns of the memory 31 is at an address of "0," the writing start position of the 2nd column is at an address of "2," the writing start position of the 3rd column is at an address of "4," and the writing start position of the 4th column is at an address of "7."

In addition, the number of bits "m" of one symbol is 4 and the factor "b" is 2 when the fourth reordering method of FIG. 17 is employed in the reordering process of the demultiplexer 25 shown in FIG. 8 and 16QAM is employed as the modulation method.

In this case, the memory 31 has 8 columns for storing 4×2 bits in a row direction, and stores 64800/(4×2) bits in a column direction as shown in FIG. 23. The writing start position of the 1st of the 8 columns of the memory 31 is at an address of "0," the writing start position of the 2nd column is at an address of "0," the writing start position of the 3rd column is at an address of "2," the writing start position of the 4th column is at an address of "4," the writing start position of the 5th column is at an address of "4," the writing start position of the 6th column is at an address of "5," the writing start position of the 7th column is at an address of "7," and the writing start position of the 8th column is at an address of "7."

In addition, the number of bits "m" of one symbol is 6 and the factor "b" is 1 when one of the first to third reordering methods of FIG. 16 is employed in the reordering process of the demultiplexer 25 shown in FIG. 8 and 64QAM is employed as the modulation method.

In this case, the memory 31 has 6 columns for storing 6×1 bits in a row direction, and stores 64800/(6×1) bits in a column direction as shown in FIG. 23. The writing start position of the 1st of the 6 columns of the memory 31 is at an address of "0," the writing start position of the 2nd column is at an address of "2," the writing start position of the 3rd column is at an address of "5," the writing start position of the 4th column is at an address of "9," the writing start position of the 5th column is at an address of "10," and the writing start position of the 6th column is at an address of "13."

In addition, the number of bits "m" of one symbol is 6 and the factor "b" is 2 when the fourth reordering method of FIG. 17 is employed in the reordering process of the demultiplexer 25 shown in FIG. 8 and 64QAM is employed as the modulation method.

In this case, the memory 31 has 12 columns for storing 6×2 bits in a row direction, and stores 64800/(6×2) bits in a column direction as shown in FIG. 23. The writing start position of the 1st of the 12 columns of the memory 31 is at an address of "0," the writing start position of the 2nd column is at an address of "0," the writing start position of the 3rd column is at an address of "2," the writing start position of the 4th column is at an address of "2," the writing start position of the 5th column is at an address of "3," the writing start position of the 6th column is at an address of "4," the writing start position of the 7th column is at an address of "4," the writing start position of the 8th column is at an address of "5," the writing start position of the 9th column is at an address of "5," the writing start position of the 10th column is at an address of "7," the writing start position of the 11th column is at an address of "8," and the writing start position of the 12th column is at an address of "9."

In addition, the number of bits "m" of one symbol is 8 and the factor "b" is 1 when one of the first to third reordering methods of FIG. 16 is employed in the reordering process of the demultiplexer 25 shown in FIG. 8 and 256QAM is employed as the modulation method.

In this case, the memory 31 has 8 columns for storing 8×1 bits in a row direction, and stores 64800/(8×1) bits in a column direction as shown in FIG. 23. The writing start position of the 1st of the 8 columns of the memory 31 is at an address of "0," the writing start position of the 2nd column is at an address of "0," the writing start position of the 3rd column is at an address of "2," the writing start position of the 4th column is at an address of "4," the writing start position of the 5th column is at an address of "4," the writing start position of the 6th column is at an address of "5," the writing start position of the 7th column is at an address of "7," and the writing start position of the 8th column is at an address of "7."

In addition, the number of bits "m" of one symbol is 8 and the factor "b" is 2 when the fourth reordering method of FIG. 17 is employed in the reordering process of the demultiplexer 25 shown in FIG. 8 and 256QAM is employed as the modulation method.

In this case, the memory 31 has 16 columns for storing 8×2 bits in a row direction, and stores 64800/(8×2) bits in a column direction as shown in FIG. 23. The writing start position of the 1st of the 16 columns of the memory 31 is at an address of "0," the writing start position of the 2nd column is at an address of "2," the writing start position of the 3rd column is at an address of "2," the writing start position of the 4th column is at an address of "2," the writing start position of the 5th column is at an address of "2," the writing start position of the 6th column is at an address of "3," the writing start position of the 7th column is at an address of "7," the writing start position of the 8th column is at an address of "15," the writing start position of the 9th column is at an address of "16," the writing start position of the 10th column is at an address of "20," the writing start position of the 11th column is at an address of "22," the writing start position of the 12th column is at an address of "22," the writing start position of the 13th column is at an address of "27," the writing start position of the 14th column is at an address of "27," the writing start position of the 15th column is at an address of "28," and the writing start position of the 16th column is at an address of "32."

In addition, the number of bits "m" of one symbol is 10 and the factor "b" is 1 when one of the first to third reordering methods of FIG. 16 is employed in the reordering process of the demultiplexer 25 shown in FIG. 8 and 1024QAM is employed as the modulation method.

In this case, the memory 31 has 10 columns for storing 10×1 bits in a row direction, and stores 64800/(10×1) bits in a column direction as shown in FIG. 23. The writing start position of the 1st of the 10 columns of the memory 31 is at an address of "0," the writing start position of the 2nd column is at an address of "3," the writing start position of the 3rd column is at an address of "6," the writing start position of the 4th column is at an address of "8," the writing start position of the 5th column is at an address of "11," the writing start position of the 6th column is at an address of "13," the writing start position of the 7th column is at an address of "15," the writing start position of the 8th column is at an address of "17," the writing start position of the 9th column is at an address of "18," and the writing start position of the 10th column is at an address of "20."

In addition, the number of bits "m" of one symbol is 10 and the factor "b" is 2 when the fourth reordering method of FIG. 17 is employed in the reordering process of the demultiplexer 25 shown in FIG. 8 and 1024QAM is employed as the modulation method.

In this case, the memory 31 has 20 columns for storing 10×2 bits in a row direction, and stores 64800/(10×2) bits in a column direction as shown in FIG. 23. The writing start position of the 1st of the 20 columns of the memory 31 is at an address of "0," the writing start position of the 2nd column is at an address of "1," the writing start position of the 3rd column is at an address of "3," the writing start position of the 4th column is at an address of "4," the writing start position of the 5th column is at an address of "5," the writing start position of the 6th column is at an address of "6," the writing start position of the 7th column is at an address of "6," the writing start position of the 8th column is at an address of "9," the writing start position of the 9th column is at an address of "13," the writing start position of the 10th column is at an address of "14," the writing start position of the 11th column is at an address of "14," the writing start position of the 12th column is at an address of "16," the writing start position of the 13th column is at an address of "21," the writing start position of the 14th column is at an address of "21," the writing start position of the 15th column is at an address of "23," the writing start position of the 16th column is at an address of "25," the writing start position of the 17th column is at an address of "25," the writing start position of the 18th column is at an address of "26," the writing start position of the 19th column is at an address of "28," and the writing start position of the 20th column is at an address of "30."

In addition, the number of bits "m" of one symbol is 12 and the factor "b" is 1 when one of the first to third reordering methods of FIG. 16 is employed in the reordering process of the demultiplexer 25 shown in FIG. 8 and 4096QAM is employed as the modulation method.

In this case, the memory 31 has 12 columns for storing 12×1 bits in a row direction, and stores 64800/(12×1) bits in a column direction as shown in FIG. 23. The writing start position of the 1st of the 12 columns of the memory 31 is at an address of "0," the writing start position of the 2nd column is at an address of "0," the writing start position of the 3rd column is at an address of "2," the writing start position of the 4th column is at an address of "2," the writing start position of the 5th column is at an address of "3," the writing start position of the 6th column is at an address of "4," the writing start position of the 7th column is at an address of "4," the writing start position of the 8th column is at an address of "5," the writing start position of the 9th column is at an address of "5," the writing start position of the 10th column is at an address of "7," the writing start position of the 11th column is at an address of "8," and the writing start position of the 12th column is at an address of "9."

In addition, the number of bits "m" of one symbol is 12 and the factor "b" is 2 when the fourth reordering method of FIG. 17 is employed in the reordering process of the demultiplexer 25 shown in FIG. 8 and 4096QAM is employed as the modulation method.

In this case, the memory 31 has 24 columns for storing 12×2 bits in a row direction, and stores 64800/(12×2) bits in a column direction as shown in FIG. 23. The writing start position of the 1st of the 24 columns of the memory 31 is at an address of "0," the writing start position of the 2nd column is at an address of "5," the writing start position of the 3rd column is at an address of "8," the writing start position of the 4th column is at an address of "8," the writing start position of the 5th column is at an address of "8," the writing start position of the 6th column is at an address of "8," the writing start position of the 7th column is at an address of "10," the writing start position of the 8th column is at an address of "10," the writing start position of the 9th column is at an address of "10," the writing start position of the 10th column is at an address of "12," the writing start position of the 11th column is at an address of "13," the writing start position of the 12th column is at an address of "16," the writing start position of the 13th column is at an address of "17," the writing start position of the 14th column is at an address of "19," the writing start position of the 15th column is at an address of "21," the writing start position of the 16th column is at an address of "22," the writing start position of the 17th column is at an address of "23," the writing start position of the 18th column is at an address of "26," the writing start position of the 19th column is at an address of "37," the writing start position of the 20th column is at an address of "39," the writing start position of the 21st column is at an address of "40," the writing start position of the 22nd column is at an address of "41," the writing start position of the 23rd column is at an address of "41," and the writing start position of the 24th column is at an address of "41."

FIG. 24 illustrates the number of columns of the memory 31 required for column twist interleaving and the addresses of writing start positions in association with each modulation method for an LDPC code of each of the 10 code rates having a code length N of 16200 as defined in the DVB-S.2 specification.

The number of bits "m" of one symbol is 2 and the factor "b" is 1 when one of the first to third reordering methods of FIG. 16 is employed in the reordering process of the demultiplexer 25 shown in FIG. 8 and QPSK is employed as the modulation method.

In this case, the memory 31 has 2 columns for storing 2×1 bits in a row direction, and stores 16200/(2×1) bits in a column direction as shown in FIG. 24. The writing start position of the 1st of the 2 columns of the memory 31 is at an address of "0" and the writing start position of the 2nd column is at an address of "0."

In addition, the number of bits "m" of one symbol is 2 and the factor "b" is 2 when the fourth reordering method of FIG. 17 is employed in the reordering process of the demultiplexer 25 shown in FIG. 8 and QPSK is employed as the modulation method.

In this case, the memory 31 has 4 columns for storing 2×2 bits in a row direction, and stores 16200/(2×2) bits in a column direction as shown in FIG. 24. The writing start position of the 1st of the 4 columns of the memory 31 is at an address of "0," the writing start position of the 2nd column is at an address of "2," the writing start position of the 3rd column is at an address of "3," and the writing start position of the 4th column is at an address of "3."

In addition, the number of bits "m" of one symbol is 4 and the factor "b" is 1 when one of the first to third reordering methods of FIG. 16 is employed in the reordering process of the demultiplexer 25 shown in FIG. 8 and 16QAM is employed as the modulation method.

In this case, the memory 31 has 4 columns for storing 4×1 bits in a row direction, and stores 16200/(4×1) bits in a column direction as shown in FIG. 24. The writing start position of the 1st of the 4 columns of the memory 31 is at an address of "0," the writing start position of the 2nd column is at an address of "2," the writing start position of the 3rd column is at an address of "3," and the writing start position of the 4th column is at an address of "3."

In addition, the number of bits "m" of one symbol is 4 and the factor "b" is 2 when the fourth reordering method of FIG. 17 is employed in the reordering process of the demultiplexer 25 shown in FIG. 8 and 16QAM is employed as the modulation method.

In this case, the memory 31 has 8 columns for storing 4×2 bits in a row direction, and stores 16200/(4×2) bits in a column direction as shown in FIG. 24. The writing start position of the 1st of the 8 columns of the memory 31 is at an address of "0," the writing start position of the 2nd column is at an address of "0," the writing start position of the 3rd column is at an address of "0," the writing start position of the 4th column is at an address of "1," the writing start position of the 5th column is at an address of "7," the writing start position of the 6th column is at an address of "20," the writing start position of the 7th column is at an address of "20," and the writing start position of the 8th column is at an address of "21."

In addition, the number of bits "m" of one symbol is 6 and the factor "b" is 1 when one of the first to third reordering methods of FIG. 16 is employed in the reordering process of the demultiplexer 25 shown in FIG. 8 and 64QAM is employed as the modulation method.

In this case, the memory 31 has 6 columns for storing 6×1 bits in a row direction, and stores 16200/(6×1) bits in a column direction as shown in FIG. 24. The writing start position of the 1st of the 6 columns of the memory 31 is at an address of "0," the writing start position of the 2nd column is at an address of "0," the writing start position of the 3rd column is at an address of "2," the writing start position of the 4th column is at an address of "3," the writing start position of the 5th column is at an address of "7," and the writing start position of the 6th column is at an address of "7."

In addition, the number of bits "m" of one symbol is 6 and the factor "b" is 2 when the fourth reordering method of FIG. 17 is employed in the reordering process of the demultiplexer 25 shown in FIG. 8 and 64QAM is employed as the modulation method.

In this case, the memory 31 has 12 columns for storing 6×2 bits in a row direction, and stores 16200/(6×2) bits in a column direction as shown in FIG. 24. The writing start position of the 1st of the 12 columns of the memory 31 is at an address of "0," the writing start position of the 2nd column is at an address of "0," the writing start position of the 3rd column is at an address of "0," the writing start position of the 4th column is at an address of "2," the writing start position of the 5th column is at an address of "2," the writing start position of the 6th column is at an address of "2," the writing start position of the 7th column is at an address of "3," the writing start position of the 8th column is at an address of "3," the writing start position of the 9th column is at an address of "3," the writing start position of the 10th column is at an address of "6," the writing start position of the 11th column is at an address of "7," and the writing start position of the 12th column is at an address of "7."

In addition, the number of bits "m" of one symbol is 8 and the factor "b" is 1 when one of the first to third reordering methods of FIG. 16 is employed in the reordering process of the demultiplexer 25 shown in FIG. 8 and 256QAM is employed as the modulation method.

In this case, the memory 31 has 8 columns for storing 8×1 bits in a row direction, and stores 16200/(8×1) bits in a column direction as shown in FIG. 24. The writing start position of the 1st of the 8 columns of the memory 31 is at an address of "0," the writing start position of the 2nd column is at an address of "0," the writing start position of the 3rd column is at an address of "0," the writing start position of the 4th column is at an address of "1," the writing start position of the 5th column is at an address of "7," the writing start position of the 6th column is at an address of "20," the writing start position of the 7th column is at an address of "20," and the writing start position of the 8th column is at an address of "21."

In addition, the number of bits "m" of one symbol is 10 and the factor "b" is 1 when one of the first to third reordering methods of FIG. 16 is employed in the reordering process of the demultiplexer 25 shown in FIG. 8 and 1024QAM is employed as the modulation method.

In this case, the memory 31 has 10 columns for storing 10×1 bits in a row direction, and stores 16200/(10×1) bits in a column direction as shown in FIG. 24. The writing start position of the 1st of the 10 columns of the memory 31 is at an address of "0," the writing start position of the 2nd column is at an address of "1," the writing start position of the 3rd column is at an address of "2," the writing start position of the 4th column is at an address of "2," the writing start position of the 5th column is at an address of "3," the writing start position of the 6th column is at an address of "3," the writing start position of the 7th column is at an address of "4," the writing start position of the 8th column is at an address of "4," the writing start position of the 9th column is at an address of "5," and the writing start position of the 10th column is at an address of "7."

In addition, the number of bits "m" of one symbol is 10 and the factor "b" is 2 when the fourth reordering method of FIG. 17 is employed in the reordering process of the demultiplexer 25 shown in FIG. 8 and 1024QAM is employed as the modulation method.

In this case, the memory 31 has 20 columns for storing 10×2 bits in a row direction, and stores 16200/(10×2) bits in a column direction as shown in FIG. 24. The writing start position of the 1st of the 20 columns of the memory 31 is at an address of "0," the writing start position of the 2nd column is at an address of "0," the writing start position of the 3rd column is at an address of "0," the writing start position of the 4th column is at an address of "2," the writing start position of the 5th column is at an address of "2," the writing start position of the 6th column is at an address of "2," the writing start position of the 7th column is at an address of "2," the writing start position of the 8th column is at an address of "2," the writing start position of the 9th column is at an address of "5," the writing start position of the 10th column is at an address of "5," the writing start position of the 11th column is at an address of "5," the writing start position of the 12th column is at an address of "5," the writing start position of the 13th column is at an address of "5," the writing start position of the 14th column is at an address of "7," the writing start position of the 15th column is at an address of "7," the writing start position of the 16th column is at an address of "7," the writing start position of the 17th column is at an address of "7," the writing start position of the 18th column is at an address of "8," the writing start position of the 19th column is at an address of "8," and the writing start position of the 20th column is at an address of "10."

In addition, the number of bits "m" of one symbol is 12 and the factor "b" is 1 when one of the first to third reordering methods of FIG. 16 is employed in the reordering process of the demultiplexer 25 shown in FIG. 8 and 4096QAM is employed as the modulation method.

In this case, the memory 31 has 12 columns for storing 12×1 bits in a row direction, and stores 16200/(12×1) bits in a column direction as shown in FIG. 24. The writing start position of the 1st of the 12 columns of the memory 31 is at an address of "0," the writing start position of the 2nd column is at an address of "0," the writing start position of the 3rd column is at an address of "0," the writing start position of the 4th column is at an address of "2," the writing start position of the 5th column is at an address of "2," the writing start position of the 6th column is at an address of "2," the writing start position of the 7th column is at an address of "3," the writing start position of the 8th column is at an address of "3," the writing start position of the 9th column is at an address of "3," the writing start position of the 10th column is at an address of "6," the writing start position of the 11th column is at an address of "7," and the writing start position of the 12th column is at an address of "7."

In addition, the number of bits "m" of one symbol is 12 and the factor "b" is 2 when the fourth reordering method of FIG. 17 is employed in the reordering process of the demultiplexer 25 shown in FIG. 8 and 4096QAM is employed as the modulation method.

In this case, the memory 31 has 24 columns for storing 12×2 bits in a row direction, and stores 16200/(12×2) bits in a column direction as shown in FIG. 24. The writing start position of the 1st of the 24 columns of the memory 31 is at an address of "0," the writing start position of the 2nd column is at an address of "0," the writing start position of the 3rd column is at an address of "0," the writing start position of the 4th column is at an address of "0," the writing start position of the 5th column is at an address of "0," the writing start position of the 6th column is at an address of "0," the writing start position of the 7th column is at an address of "0," the writing start position of the 8th column is at an address of "1," the writing start position of the 9th column is at an address of "1," the writing start position of the 10th column is at an address of "1," the writing start position of the 11th column is at an address of "2," the writing start position of the 12th column is at an address of "2," the writing start position of the 13th column is at an address of "2," the writing start position of the 14th column is at an address of "3," the writing start position of the 15th column is at an address of "7," the writing start position of the 16th column is at an address of "9," the writing start position of the 17th column is at an address of "9," the writing start position of the 18th column is at an address of "9," the writing start position of the 19th column is at an address of "10," the writing start position of the 20th column is at an address of "10, the writing start position of the 21st column is at an address of "10, the writing start position of the 22nd column is at an address of "10," the writing start position of the 23rd column is at an address of "10," and the writing start position of the 24th column is at an address of "11."

A transmission procedure performed by the transmitter of FIG. 8 will now be described with reference to a flow chart of FIG. 25.

The LDPC encoder 21 waits until target data is received and encodes the received target data into an LDPC code and provides the LDPC code to the bit interleaver 22 at step S101 and the procedure then proceeds to step S102.

At step S102, the bit interleaver 22 performs bit interleaving on the LDPC code from the LDPC encoder 21 and provides the bit-interleaved LDPC code to the mapping unit 26 and the procedure then proceeds to step S103.

More specifically, at step S102, the parity interleaver 23 in the bit interleaver 22 performs parity interleaving on the LDPC code from the LDPC encoder 21 and provides the parity-interleaved LDPC code to the column twist interleaver 24.

The column twist interleaver 24 performs column twist interleaving on the LDPC code from the parity interleaver 23 and the demultiplexer 25 performs a reordering process on the LDPC code column-twist-interleaved by the column twist interleaver 24. The demultiplexer 25 then provides the reordered LDPC code to the mapping unit 26.

At step S103, the mapping unit 26 maps m code bits of the LDPC code from The demultiplexer 25 to a symbol represented by a signal point determined according to a modulation scheme that the orthogonal modulator uses to perform orthogonal modulation and provides the mapped symbol to the orthogonal modulator and the procedure then proceeds to step S104.

At step S104, the orthogonal modulator performs orthogonal modulation of carriers on the symbol from the mapping unit 26 and the procedure then proceeds to step S105 and transmits the orthogonally modulated signal and the procedure is then terminated.

Figure 25:
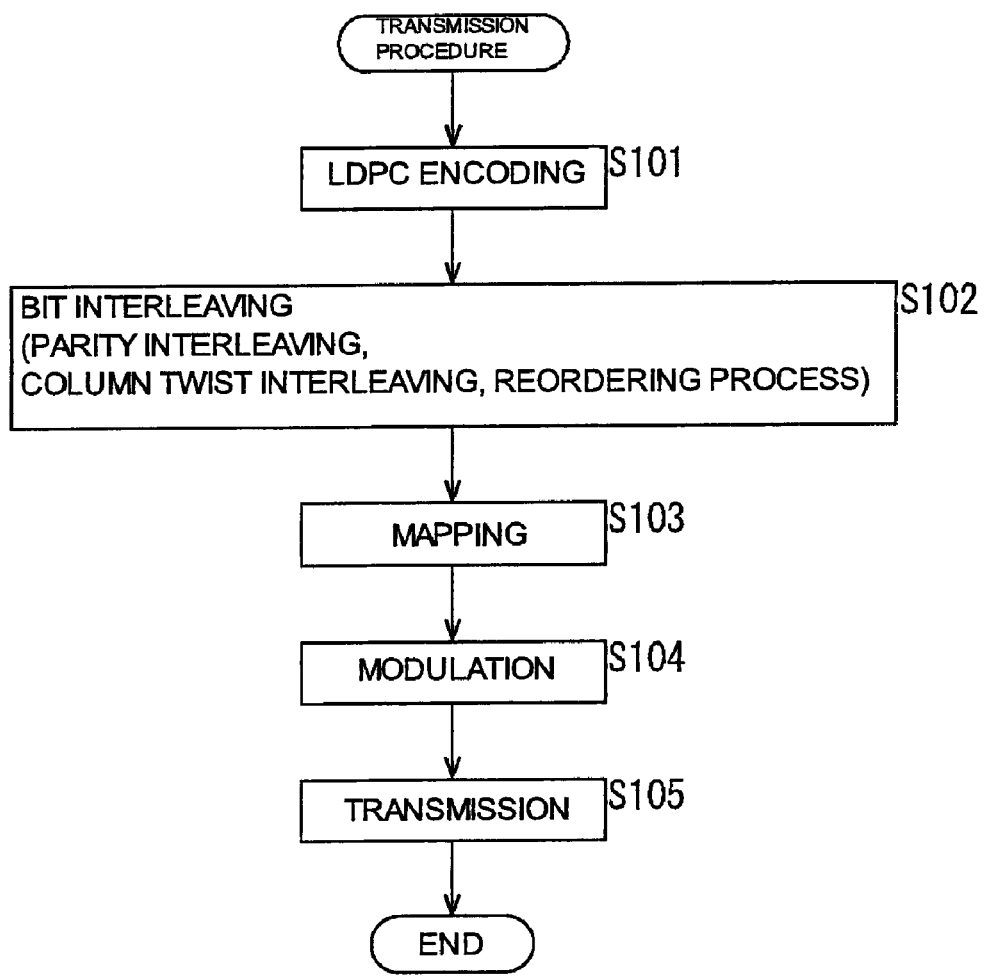
FIG. 25 is a flow chart illustrating a transmission procedure.

The transmission procedure of FIG. 25 is repeated.

Performing the parity interleaving or column twist interleaving as described above can increase resistance to erasures or burst errors when a plurality of code bits of an LDPC code is transmitted as one symbol.

The parity interleaver 23, which is a block for performing parity interleaving, and the column twist interleaver 24, which is a block for performing column twist interleaving, may be constructed integrally although the parity interleaver 23 and the column twist interleaver 24 are shown as being separately constructed in FIG. 8 for ease of explanation.

More specifically, both of the parity interleaver and the column twist interleaver can write and read code bits to and from the memory and can be represented by a matrix that converts an address (write address) at which a code bit is written to an address (read address) at which a code bit is read.

Accordingly, it is possible to obtain an LDPC code that has been parity-interleaved and then been column-twist-interleaved by converting code bits using a matrix obtained by multiplying a matrix representing parity interleaving and a matrix representing column twist interleaving.

The demultiplexer 25 may also be constructed integrally with the parity interleaver 23 and the column twist interleaver 24.

More specifically, a reordering process performed by the demultiplexer 25 may also be represented by a matrix that converts a write address of the memory 31 which stores an LDPC code to a read address.

Accordingly, it is possible to collectively perform parity interleaving, column twist interleaving, and a reordering process using a matrix obtained by multiplying a matrix representing parity interleaving, a matrix representing column twist interleaving, and a matrix representing a reordering process.

It is also possible to perform either parity interleaving or column twist interleaving alone.

Simulations for measuring bit error rates that were performed with the Transmitter of FIG. 8 will now be described with reference to FIGS. 26 to 28.

Simulations were performed using a communication path with a flutter of 0 dB D/U.

Figure 26A:
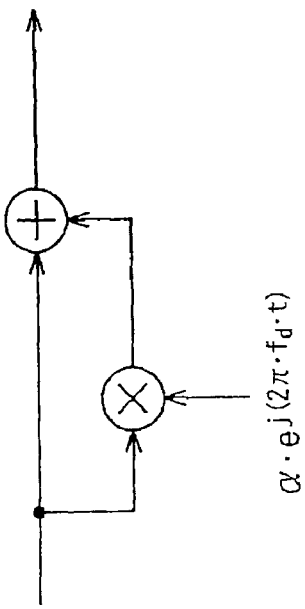
FIGS. 26a and 26b illustrate a model of a communication path employed in simulations.
Figure 26B:
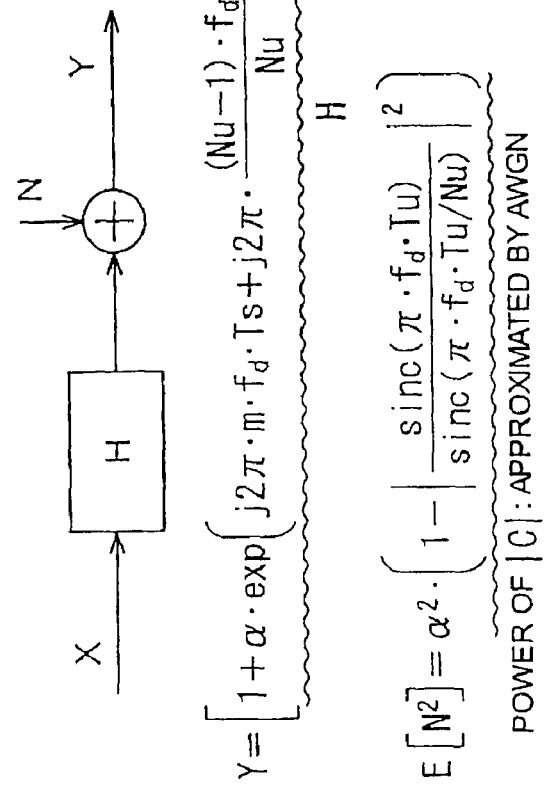

FIGS. 26A and 26B illustrate a model of a communication path employed in the simulations.

Specifically, FIG. 26A shows a model of a flutter employed in the simulations. Simulations were performed using a model corresponding to one carrier extracted at the receiving side after an FFT is performed on an OFDM symbol that was transmitted through the channel. Note that t is time, $f_d$ is the Doppler frequency and $1/\alpha^2=D/U$.

FIG. 26B illustrates a model of the communication path having the flutter whose model is shown in FIG. 26A.

"H" in FIG. 26B denotes the model of the flutter of FIG. 26A. "N" denotes Inter-Carrier Interference (ICI) in FIG. 26B. Further, m is the symbol number $T_s$ is the symbol length (sec), $T_u$ is the effective symbol length (sec), and $N_u$ is the number of OFDM carriers. In the simulations, an expectation $E[N^2]$ of power of the ICI was approximated by AWGN.

Figure 28:
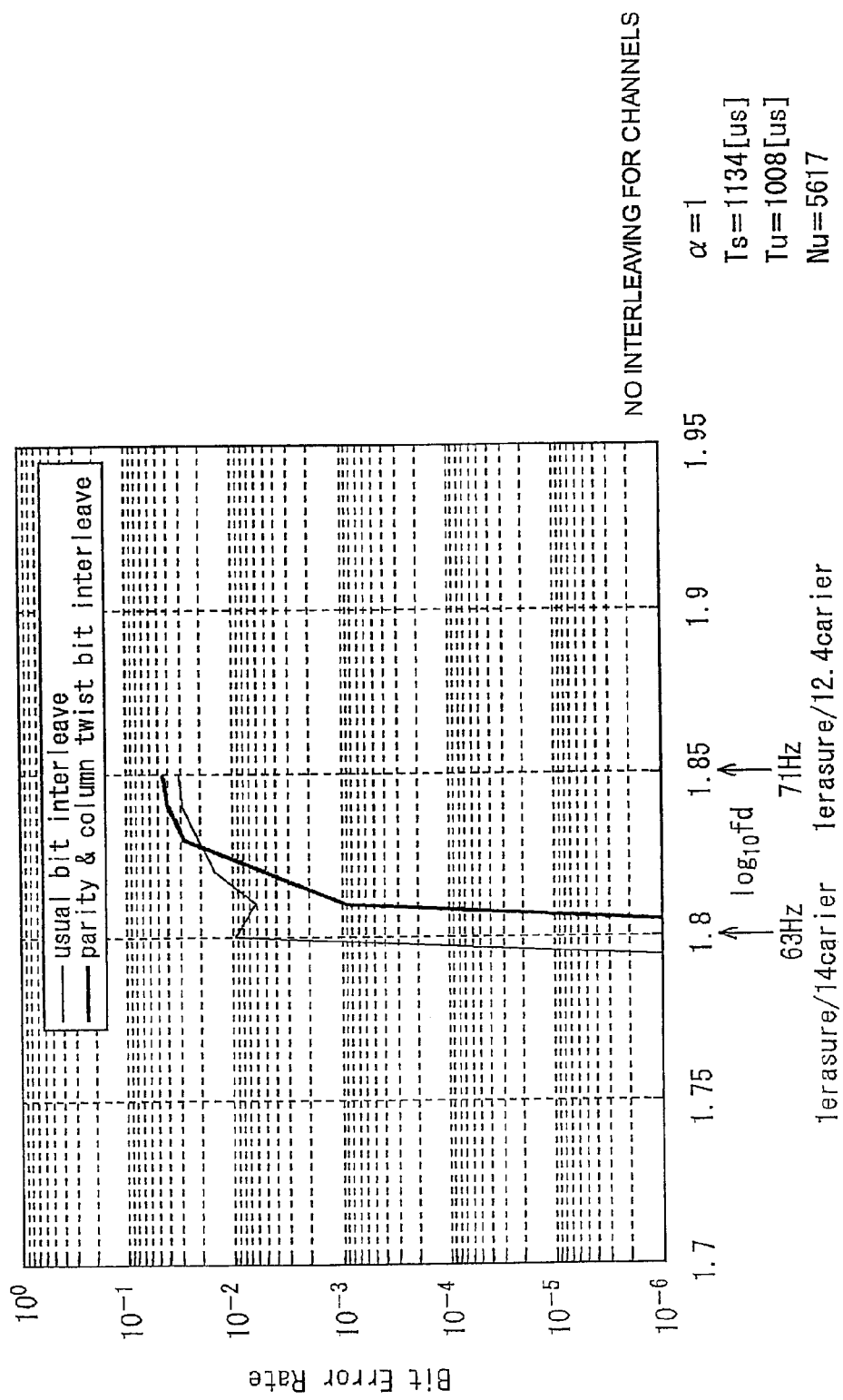
FIG. 28 illustrates relations between Doppler frequencies $f_d$ and error rates obtained from simulations.

FIGS. 27 and 28 illustrate relations between Doppler frequencies $f_d$ of flutters and error rates from the simulations.

More specifically, FIG. 27 shows relations between error rates and Doppler frequencies $f_d$ when the modulation scheme is 16QAM, the code rate (r) is 3/4, and the reordering method is the first reordering method. FIG. 28 shows relations between error rates and Doppler frequencies $f_d$ when the modulation scheme is 64QAM, the code rate (r) is 5/6, and the reordering method is the first reordering method.

In FIGS. 27 and 28, a bold line indicates a relation between error rates and Doppler frequencies $f_d$ when parity interleaving, column twist interleaving, and a reordering process were all carried out and a thin line indicates a relation between error rates and Doppler frequencies $f_d$ when only the reordering process among the three processes was carried out.

It can be seen from any of FIGS. 27 and 28 that error rates are improved (i.e., lowered) when parity interleaving, column twist interleaving, and a reordering process were all carried out, compared when only the reordering process is carried out.

Receiver

Figure 29:
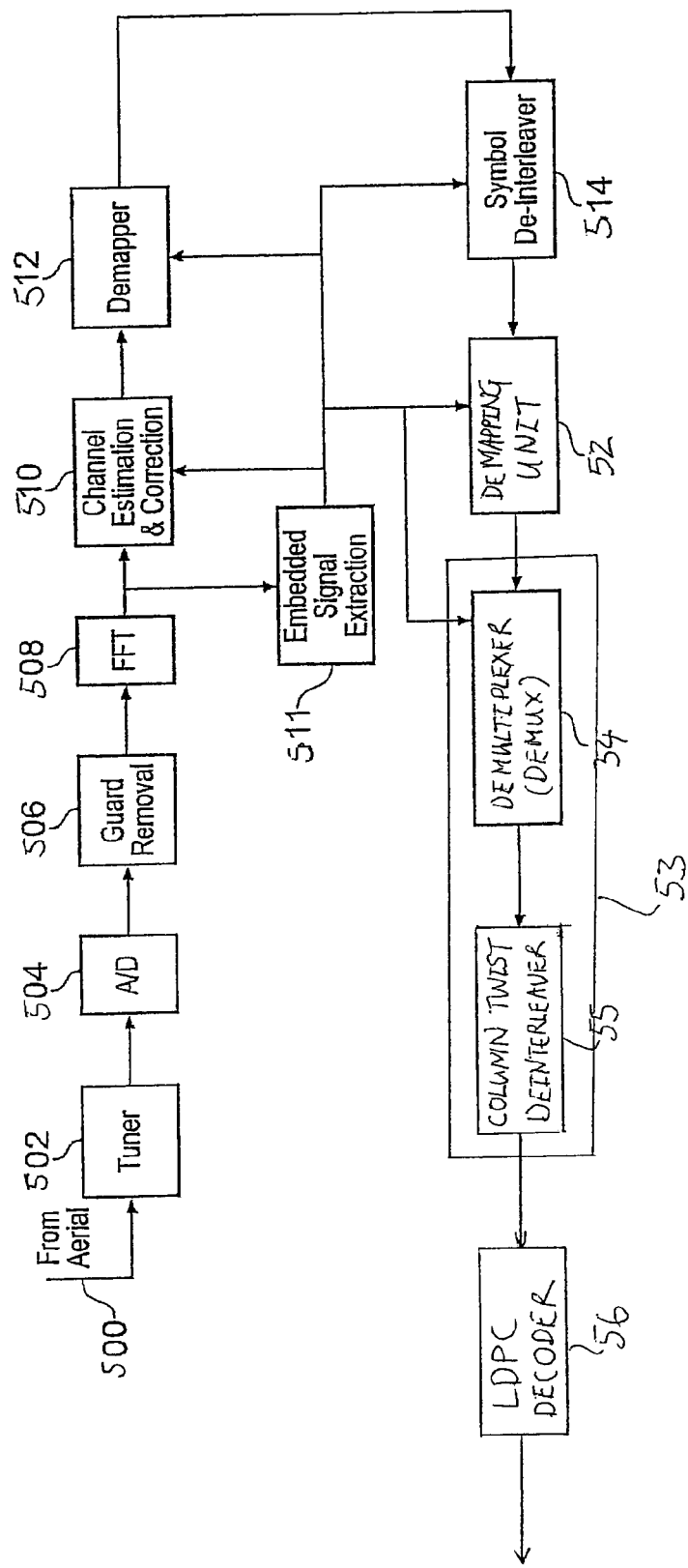
FIG. 29 is a schematic block diagram of a Coded OFDM receiver which may be used, for example, with the DVB-T2 standard.

FIG. 29 provides an example illustration of a receiver which may be used to detect OFDM symbols and to recover data bits from the sub-carrier signals of the OFDM symbols. As shown in FIG. 29, an OFDM signal is received by an antenna 500 and detected by a tuner 502 and converted into a digital form by an analogue-to-digital converter 504. A guard interval removal processor 506 removes the guard interval from a received OFDM symbol, before the data is recovered from the OFDM symbol using a Fast Fourier Transform (FFT) processor 508 in combination with a channel estimator and correction 510 in co-operation with a embedded-signalling decoding unit 511, in accordance with known techniques. The demodulated data symbols are recovered from a demapper 512 and fed to a symbol de-interleaver 514, which operates to effect the reverse mapping of the received data symbols to re-generate an output symbol stream with de-interleaved data symbols. The symbol de-interleaver 514 will be described in more detail shortly.

Bit Interleaver and LDPC Decoder

As shown in FIG. 29, the receiver also includes a demapping unit 52, a deinterleaver 53, and an LDPC decoder 56. The demapping unit 52 receives symbols (with respective values of I and Q-axis directions) from the symbol de-interleaver 514 and operates to de-map the symbols into encoded bits of an LDPC code and provides the encoded bits of the LDPC code to the bit deinterleaver 53. The de-mapping of the received data symbols to effected by identifying the bits which are represented by the data symbol identified from the sub-carrier signal of the OFDM symbol.

The bit deinterleaver 53 includes a demultiplexer 54 and a column twist deinterleaver 55 and performs de-interleaving on the code bits of the LDPC code from the demapping unit 52.

More specifically, the demultiplexer 54 performs an inverse reordering process, which is the reverse of the reordering process performed by the demultiplexer 25 of FIG. 8, on the LDPC code from the demapping unit 52. Specifically, the demultiplexer 54 performs an inverse reordering process to restore the positions of the code bits reordered by the reordering process into original positions and provides the inversely reordered LDPC code to the column twist deinterleaver 55.

The column twist deinterleaver 55 performs an inverse column twist deinterleaving process, which is the reverse of column twist interleaving as the permutation process performed by the column twist interleaver 24 of FIG. 8, on the LDPC code from the demultiplexer 54. Specifically, the column twist deinterleaver 55 performs an inverse permutation process (for example, column twist deinterleaving) for restoring the original order of the code bits of the LDPC code reordered by column twist interleaving as the permutation process of the code bits.

More specifically, the column twist deinterleaver 55 performs column twist deinterleaving by writing and reading the code bits of the LDPC code to and from a memory for deinterleaving that is constructed similarly to the memory 31 shown in FIG. 22.

However, the column twist deinterleaver 55 writes a code bit in a row direction to the memory for deinterleaving using a read address, at which the code bit was read from the memory 31, as a write address. In addition, the column twist deinterleaver 55 reads a code bit in a column direction from the memory for deinterleaving using a write address, at which the code bit was written to the memory 31, as a read address.

The column twist deinterleaver 55 provides the column-twist-deinterleaved LDPC code to the LDPC decoder 56.

Although parity interleaving, column twist interleaving, and a reordering process were sequentially performed on the LDPC code provided from the demapping unit 52 to the deinterleaver 53, the deinterleaver 53 performs only the two processes, i.e., an inverse reordering process corresponding to the reordering process and column twist deinterleaving corresponding to column twist interleaving, on the LDPC code. Thus, the deinterleaver 53 does not perform parity deinterleaving corresponding to parity interleaving (i.e., the reverse of parity interleaving). That is, the deinterleaver 53 does not perform parity deinterleaving for restoring the original order of the code bits of the LDPC code reordered by parity interleaving.

Accordingly, the LDPC code, on which the inverse reordering process and column twist deinterleaving have been performed and no parity deinterleaving has been performed, is provided from (the column twist deinterleaver 55 of) the deinterleaver 53 to the LDPC decoder 56.

The LDPC decoder 56 performs LDPC decoding on the LDPC code from the deinterleaver 53 using a converted parity check matrix, obtained by performing at least column permutation corresponding to parity interleaving on the parity check matrix H that the LDPC encoder 21 of FIG. 8 used for LDPC encoding, and then outputs the resulting data as decoded target data.

Figure 30:
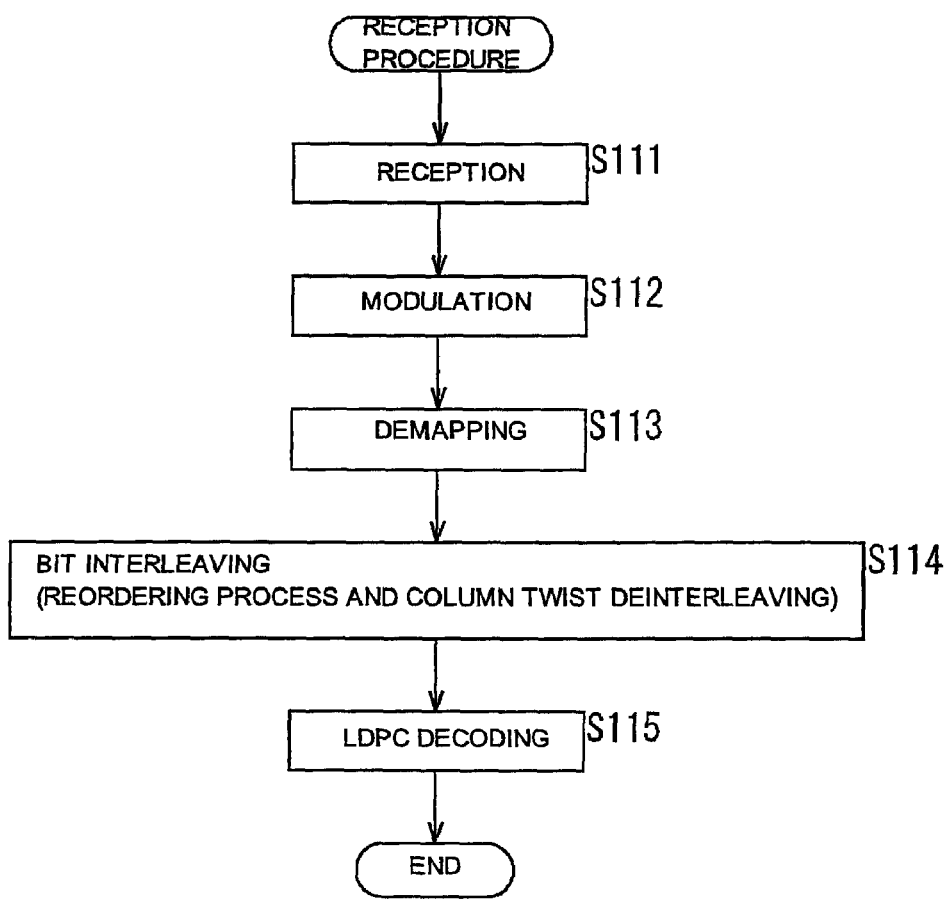
FIG. 30 is a flow chart illustrating a reception procedure.

FIG. 30 is a flow chart illustrating a reception procedure performed by the receiver of FIG. 29.

The orthogonal demodulator receives a modulated signal from the transmitter at step S111. The procedure then proceeds to step S112 to perform orthogonal demodulation on the modulated signal. The orthogonal demodulator then provides a symbol obtained through the orthogonal demodulation to the demapping unit 52 and the procedure then proceeds from step S112 to step S113.

At step S113, the demapping unit 52 de-maps the symbol from the orthogonal demodulator into code bits of an LDPC code and provides the code bits of an LDPC code to the deinterleaver 53. The procedure then proceeds to step S114.

At step S114, the deinterleaver 53 performs deinterleaving on the code bits of the LDPC code from the demapping unit 52 and the procedure then proceeds to step S115.

More specifically, at step S114, the demultiplexer 54 in the deinterleaver 53 performs an inverse reordering process on the LDPC code from the demapping unit 52 and provides the resulting LDPC code to the column twist deinterleaver 55.

The column twist deinterleaver 55 performs column twist deinterleaving on the LDPC code from the demultiplexer 54 and provides the resulting LDPC code to the LDPC decoder 56.

At step S115, the LDPC decoder 56 performs LDPC decoding on the LDPC code from the column twist deinterleaver 55 using a converted parity check matrix, obtained by performing at least column permutation corresponding to parity interleaving on the parity check matrix H that the LDPC encoder 21 of FIG. 8 used for LDPC encoding, and then provides the resulting data as decoded target data. The procedure is then terminated.

The reception procedure of FIG. 30 is repeated.

The demultiplexer 54, which performs an inverse reordering process, and the column twist deinterleaver 55, which performs column twist deinterleaving, may be constructed integrally although the demultiplexer 54 and the column twist deinterleaver 55 are shown as being separately constructed in FIG. 29 in the same manner as in FIG. 8 for ease of explanation.

In the case where the transmitter of FIG. 8 does not perform column twist interleaving, there is no need to provide the column twist deinterleaver 55 in the receiver of FIG. 29.

Reference will now be made to how the LDPC decoder 56 of FIG. 29 performs LDPC decoding.

The LDPC decoder 56 of FIG. 29 performs LDPC decoding of the LDPC code from the column twist deinterleaver 55, on which the inverse reordering process and column twist deinterleaving have been performed and no parity deinterleaving has been performed, using a converted parity check matrix obtained by performing at least column permutation corresponding to parity interleaving on the parity check matrix H that the LDPC encoder 21 of FIG. 8 used for LDPC encoding.

Here, LDPC decoding, which is performed using the converted parity check matrix so as to reduce the size of circuitry and limit the operating frequency within a range that can be fully achievable, has been previously suggested (for example, see Japanese Patent Application Publication No. 2004-343170).

First, LDPC decoding using the previously-suggested converted parity check matrix is described with reference to FIGS. 31 to 34.

Figure 31:
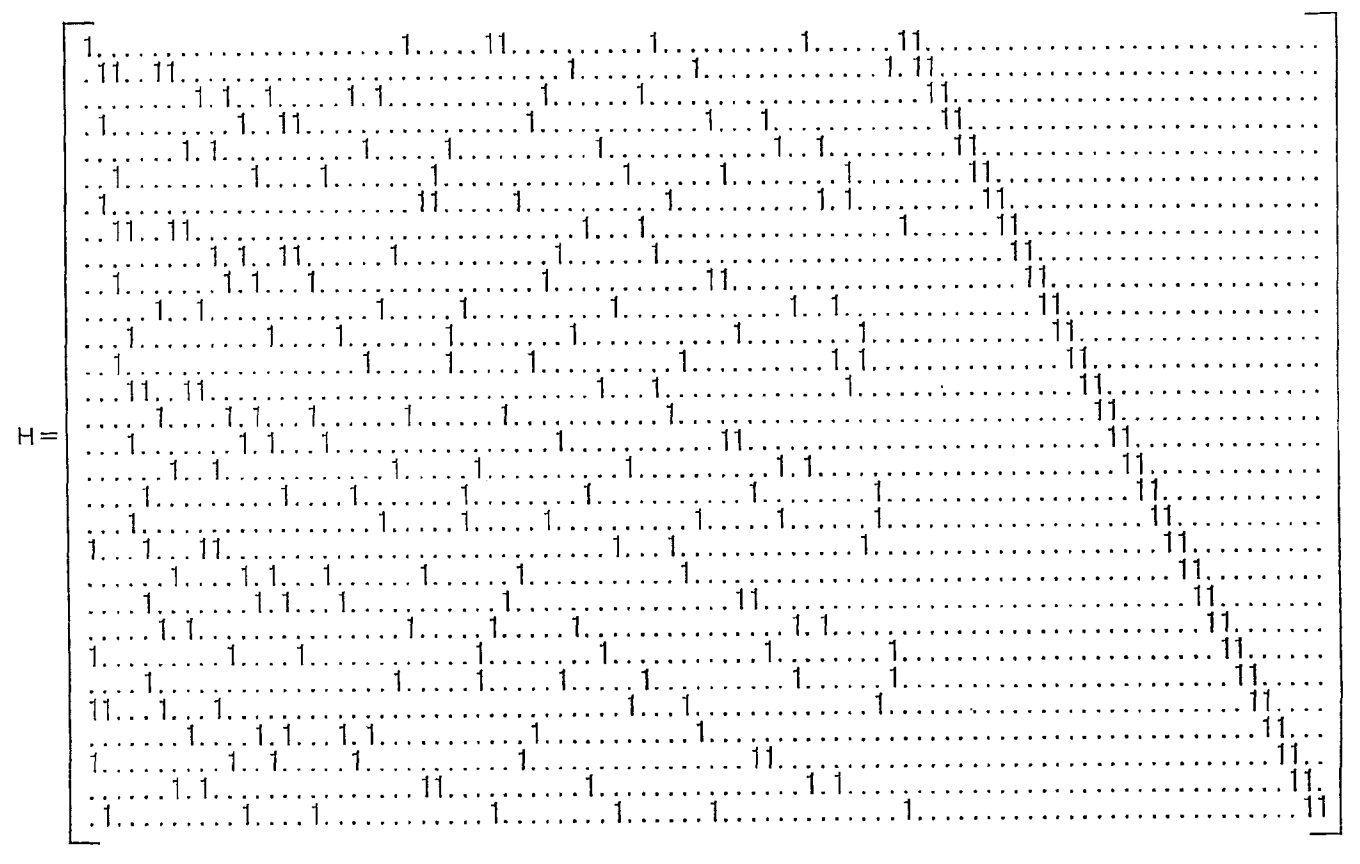

FIG. 31 illustrates an example parity check matrix H of an LDPC code having a code length N of 90 and a code rate of 2/3.

In FIG. 31, "0" is represented by a period "." as in FIGS. 32 and 33 described below.

A parity matrix in the parity check matrix H of FIG. 31 has a stepwise structure.

Figure 32:
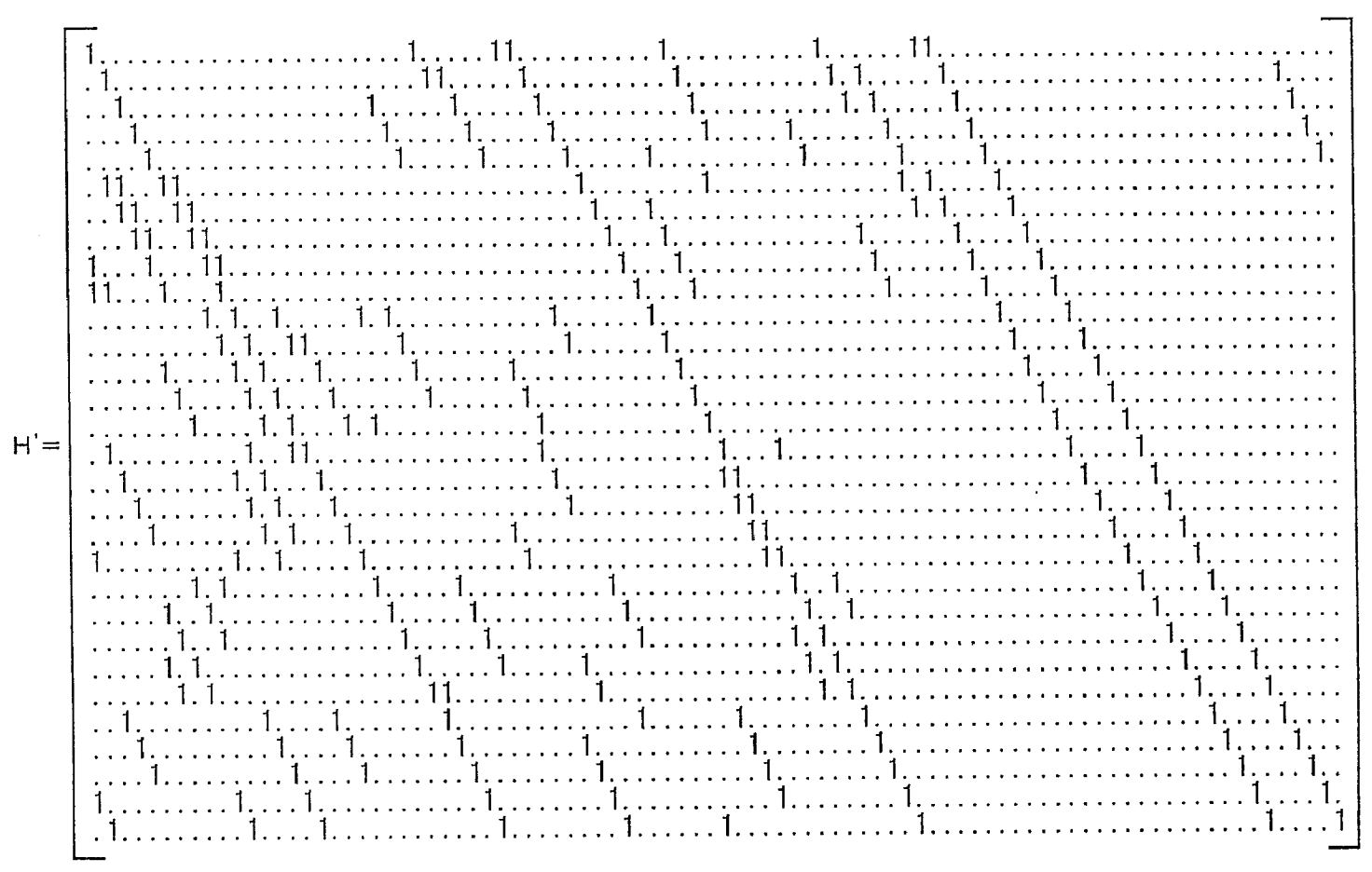

FIG. 32 illustrates a parity check matrix H' obtained by performing row permutation of Mathematical Expression (8) and column permutation of Mathematical Expression (9) on the parity check matrix H of FIG. 31.

$$\text{Row Permutation: } 6s+t+1\text{th row} \to 5t+s+1\text{th row} \quad (8)$$

$$\text{Column Permutation: } 6x+y+61\text{th column} \to 5y+x+61\text{th column} \quad (9)$$

In Mathematical Expressions (8) and (9), s, t, x, and y are integers such that $0 \leq s < 5$, $0 \leq t < 6$, $0 \leq x < 5$, and $0 \leq y < 6$.

According to the row permutation of Mathematical Expression (8), 1st, 7th, 13th, 19th, and 25th rows, whose ordinal numbers yield "1" as a remainder when divided by 6, are changed to (specifically, exchanged with) 1st, 2nd, 3rd, 4th, and 5th rows, respectively, and 2nd, 8th, 14th, 20th, and 26th rows, whose ordinal numbers yield "2" as a remainder when divided by 6, are changed to 6th, 7th, 8th, 9th, and 10th rows, respectively.

According to the column permutation of Mathematical Expression (9), 61st, 67th, 73rd, 79th, and 89th columns among (parity) columns subsequent to 60th column, whose ordinal numbers yield "1" as a remainder when divided by 6, are changed to 61st, 62nd, 63rd, 64th, and 65th columns, respectively, and 62nd, 68th, 74th, 80th, and 86th columns, whose ordinal numbers yield "2" as a remainder when divided by 6, are changed to 66th, 67th, 68th, 69th, and 70th columns, respectively.

A matrix obtained by performing row and column permutation on the parity check matrix H of FIG. 31 in this manner is the parity check matrix H' of FIG. 32.

Here, performing the row permutation of the parity check matrix H does not affect the order of the code bits of the LDPC code.

The column permutation of Mathematical Expression (9) corresponds to parity interleaving that is performed to interleave the K+qx+y+1th code bit to the K+Py+x+1th code bit position as described above when the information length K is "60," the unit number of columns P having a cyclic structure is "5," and the divisor q(M/P) of the parity length M (30 in this example) is "6."

A zero vector is output if the parity check matrix H' of FIG. 32, which is hereinafter referred to as a "converted parity check matrix" as appropriate, is multiplied by an LDPC code obtained by performing the same permutation as Mathematical Expression (9) on the LDPC code of the parity check matrix H of FIG. 31 which is hereinafter referred to as an "original parity check matrix" as appropriate. More specifically, when "c'" represents a row vector obtained by performing column permutation of Mathematical Expression (9) on a row vector "c" as an LDPC code (a codeword) of the original parity check matrix H, $Hc^T$ is a zero vector due to the nature of the parity check matrix and therefore $H'c'^T$ is also a zero vector.

Thus, the converted parity check matrix H' of FIG. 32 is a parity check matrix of the LDPC code c' obtained by performing column permutation of Mathematical Expression (9) on the LDPC code c of the original parity check matrix H.

Accordingly, the same LDPC code of the original parity check matrix H as that obtained through decoding using the parity check matrix H can be obtained by LDPC-decoding the column-permutated LDPC code c', which was produced by performing the column permutation of Mathematical Expression (9) on the LDPC code c of the original parity check matrix H, using the converted parity check matrix H' of FIG. 32 and then performing the reverse of the column permutation of (9) on the decoded LDPC code c'.

Figure 33:
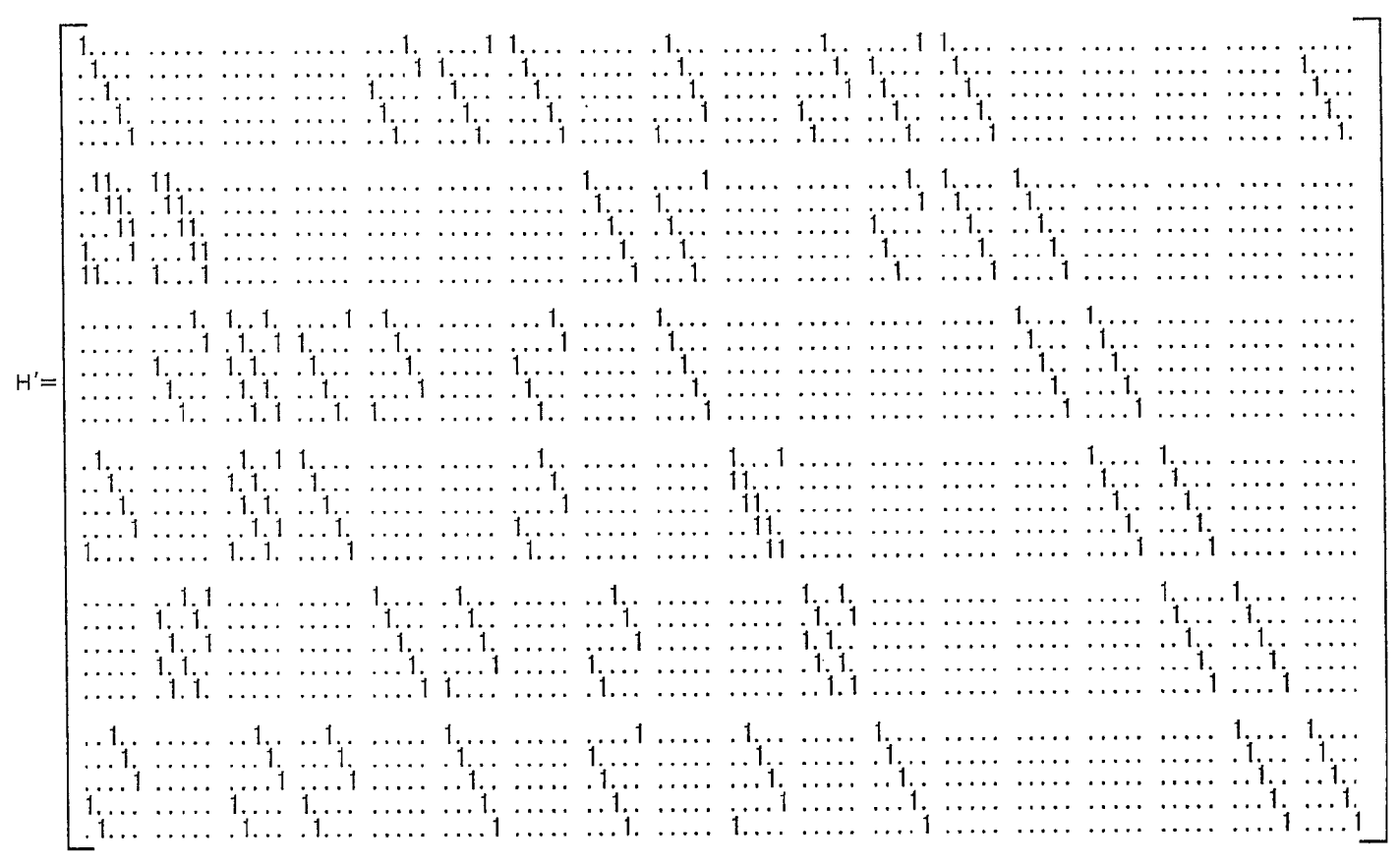

FIG. 33 illustrates the converted parity check matrix H' of FIG. 32 in which elements are shown as being arranged in units of 5×5 matrices spaced from each other.

In FIG. 33, the converted parity check matrix H' is shown as a combination of 5×5 unit matrices, matrices, each of which is produced by replacing one or more "1s" of a 5×5 unit matrix with "0s" (hereinafter referred to as "quasi-unit matrices" as appropriate), matrices produced by cyclically shifting unit matrices or quasi-unit matrices (hereinafter referred to as "shifted matrices" as appropriate), matrices, each of which is the sum of two or more of a unit matrix, a quasi-unit matrix, and a shifted matrix (hereinafter referred to as "sum matrices" as appropriate), and 5×5 zero matrices.

That is, the converted parity check matrix H' of FIG. 33 can be a matrix including 5×5 unit matrices, quasi-unit matrices, shifted matrices, sum matrices, and 5×5 zero matrices. Thus, the 5×5 matrices, which constitute the converted parity check matrix H', will now be referred to as "component matrices" as appropriate.

Decoding of an LDPC code represented by a parity check matrix represented by P×P component matrices can be performed using an architecture which simultaneously performs P check node calculations and P variable node calculations.

Figure 34:
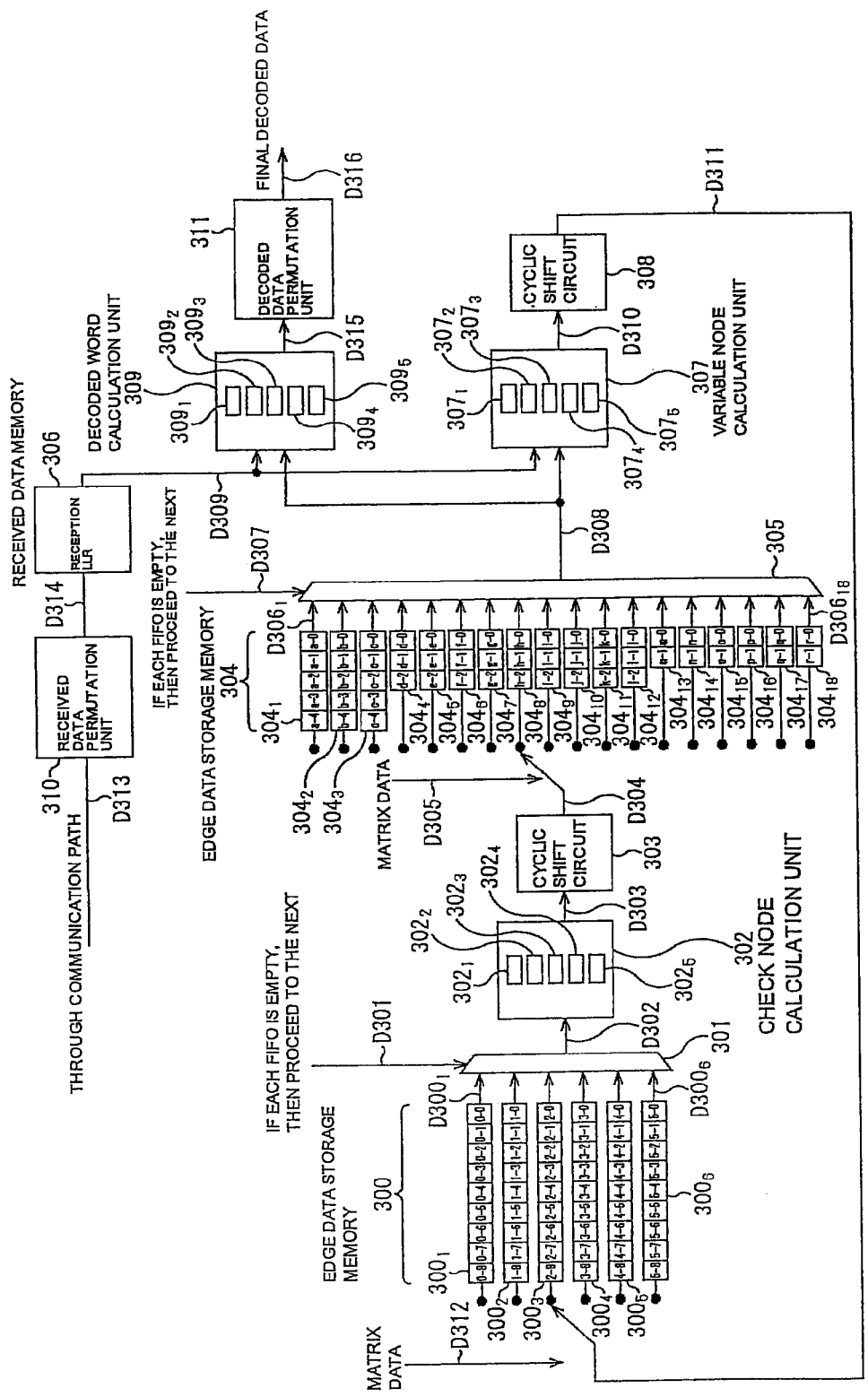
FIG. 34 is a block diagram illustrating an example configuration of a decoding device that performs P node calculations in parallel.

FIG. 34 is a block diagram illustrating an example configuration of a decoding device that performs decoding as described above.

More specifically, FIG. 34 illustrates an example configuration of a decoding device that performs decoding of an LDPC code using the converted parity check matrix H' of FIG. 33 obtained by performing at least the column permutation of Mathematical Expression (9) on the original parity check matrix H of FIG. 31.

The decoding device of FIG. 34 includes an edge data storage memory 300 including 6 FIFOs $300_1$ to $300_6$, a selector 301 for selecting one of the FIFOs $300_1$ to $300_6$, a check node calculation unit 302, two cyclic-shift circuits 303 and 308, an edge data storage memory 304 including 18 FIFOs $304_1$ to $304_{18}$, a selector 305 for selecting one of the FIFOs $304_1$ to $304_{18}$, a received data memory 306 for storing received information, a variable node calculation unit 307, a decoded word calculation unit 309, a received data permutation unit 310, and a decoded data permutation unit 311.

First, reference is made to a method for storing data in the edge data storage memories 300 and 304.

The edge data storage memory 300 includes the same number of 6 FIFOs $300_1$ to $300_6$ as a number obtained by dividing the number of rows "30" of the converted parity check matrix H' of FIG. 33 by the number of rows "5" of each component matrix. Each FIFO $300_y$ (y=1, 2, ..., 6) includes respective storage regions of multiple stages, to or from each of which messages corresponding to the same number of "5" edges as the number of rows and the number of columns of each component matrix can be simultaneously written or read. The number of the stages of storage regions of each FIFO $300_y$ is "9" which is equal to the maximum of the numbers of 1s (Hamming weights) in a row direction of the converted parity check matrix of FIG. 33.

Data (i.e., messages $v_i$ from variable nodes) corresponding to positions of "1" of the first to fifth rows of the converted parity check matrix H' of FIG. 33 is stored in the FIFO $300_1$ in a horizontal direction in every row simultaneously while disregarding "0." Specifically, when (j,i) represents an element of jth row and ith column, data corresponding to positions of "1" of a 5×5 unit matrix of (1,1) to (5,5) of the converted parity check matrix H' is stored in the storage region of the first stage of the FIFO $300_1$. Data corresponding to positions of "1" of a shifted matrix of (1,21) to (5,25) of the converted parity check matrix H', which is obtained by cyclically shifting a 5×5 unit matrix to the right by 3 elements, is stored in the storage region of the second stage. Similarly, data is stored in the storage regions of the 3rd to 8th stages in association with the converted parity check matrix H'. Data corresponding to positions of "1" of a shifted matrix of (1,81) to (5,90) of the converted parity check matrix H', which is obtained by replacing "1" in first row with "0" in the 5×5 unit matrix and cyclically shifting the 5×5 unit matrix to the left by 1 element, is stored in the storage region of the ninth stage.

Data corresponding to positions of "1" from the 6th to 10th rows of the converted parity check matrix H' of FIG. 33 is stored in the FIFO $300_2$. Specifically, data corresponding to positions of "1" of a first shifted matrix included in a sum matrix of (6,1) to (10,5) of the converted parity check matrix H', which is obtained by adding the first shifted matrix obtained by cyclically shifting a 5×5 unit matrix to the right by 1 element and a second shifted matrix obtained by cyclically shifting a 5×5 unit matrix to the right by 2 elements, is stored in the storage region of the first stage of the FIFO $300_2$. Data corresponding to positions of "1" of the second shifted matrix included in the sum matrix of (6,1) to (10,5) of the converted parity check matrix H' is stored in the storage region of the second stage of the FIFO $300_2$.

More specifically, when a component matrix having a weight of 2 or more is represented by the sum of two or more of a P×P unit matrix with a weight of 1, a quasi-unit matrix produced by replacing one or more "1s" of the unit matrix with "0s," and a shifted matrix produced by cyclically shifting the unit matrix or quasi-unit matrix, data corresponding to positions of "1" of the unit matrix with a weight of 1, the quasi-unit matrix, or the shifted matrix (i.e., messages corresponding to edges belonging to the unit matrix, the quasi-unit matrix, or the shifted matrix) is stored at the same address (the same FIFO among the FIFOs $300_1$ to $300_6$).

Data is also stored in the storage regions of the 3rd to 9th stages in association with the converted parity check matrix H'.

Similarly, data is stored in the FIFOs $300_3$ to $300_6$ in association with the converted parity check matrix H'.

The edge data storage memory 304 includes the same number of 18 FIFOs $304_1$ to $304_{18}$ as a number obtained by dividing the number of columns "90" of the converted parity check matrix H' by the number of columns "5" of each component matrix. Each FIFO $304_x$ (x=1, 2, ..., 18) includes respective storage regions of multiple stages, to or from each of which messages corresponding to the same number of "5" edges as the number of rows and the number of columns of each converted component matrix H' can be simultaneously written or read.

Data (i.e., messages $u_j$ from check nodes) corresponding to positions of "1" of the first to fifth columns of the converted parity check matrix H' of FIG. 33 is stored in the FIFO $304_1$ in a vertical direction in every column simultaneously while disregarding "0." Specifically, data corresponding to positions of "1" of a 5×5 unit matrix of (1,1) to (5,5) of the converted parity check matrix H' is stored in the storage region of the first stage of the FIFO $304_1$. Data corresponding to positions of "1" of a first shifted matrix included in a sum matrix of (6,1) to (10,5) of the converted parity check matrix H', which is obtained by adding a first shifted matrix produced by cyclically shifting a 5×5 unit matrix to the right by 1 element and a second shifted matrix produced by cyclically shifting a 5×5 unit matrix to the right by 2 elements, is stored in the storage region of the second stage. Data corresponding to positions of "1" of the second shifted matrix included in the sum matrix of (6,1) to (10,5) of the converted parity check matrix H' is stored in the storage region of the third stage.

More specifically, when a component matrix having a weight of 2 or more is represented by the sum of two or more of a P×P unit matrix with a weight of 1, a quasi-unit matrix produced by replacing one or more "1s" of the unit matrix with "0s," and a shifted matrix produced by cyclically shifting the unit matrix or quasi-unit matrix, data corresponding to positions of "1" of the unit matrix with a weight of 1, the quasi-unit matrix, or the shifted matrix (i.e., messages corresponding to edges belonging to the unit matrix, the quasi-unit matrix, or the shifted matrix) is stored at the same address (the same FIFO among the FIFOs $304_1$ to $304_{18}$).

Data is also stored in the storage regions of the 4th and 5th stages in association with the converted parity check matrix H'. The number of the stages of storage regions of the FIFO $304_1$ is "5" which is equal to the maximum of the numbers of 1s (Hamming weights) in a row direction in the first to fifth columns of the converted parity check matrix H'.

Similarly, data is stored in the FIFOs $304_2$ and $304_3$ in association with the converted parity check matrix H' and the length (i.e., the number of stages) of each FIFO is "5." Similarly, data is stored in the FIFOs $304_4$ to $304_{12}$ in association with the converted parity check matrix H' and the length of each FIFO is "3." Similarly, data is stored in the FIFOs $304_{13}$ to $304_{18}$ in association with the converted parity check matrix H' and the length of each FIFO is "2."

Reference will now be made to the operation of the decoding device of FIG. 34.

In the edge data storage memory 300 including 6 FIFOs $300_1$ to $300_6$, a FIFO for storing data is selected from the FIFOs $300_1$ to $300_6$ according to information (Matrix data) D312 indicating a row in the converted parity check matrix H', to which 5 messages D311, received from the cyclic-shift circuit 308 located upstream of the edge data storage memory 300, belong, and the 5 messages D311 are collected and stored in the selected FIFO in order. When data is read from the edge data storage memory 300, first, 5 messages $D300_1$ are read in order from the FIFO $300_1$ and are then provided to the selector 301 located downstream of the edge data storage memory 300. After messages are completely read from the FIFO $300_1$, messages are read in order from the FIFOs $300_2$ to including $D300_6$ in the edge data storage memory 300 and are then provided to the selector 301 in the same manner.

The selector 301 selects 5 messages received from a FIFO from which data is currently being read among the FIFOs $300_1$ to $300_6$ according to a selection signal D301 and provides the selected messages as messages D302 to the check node calculation unit 302.

The check node calculation unit 302 includes 5 check node calculators $302_1$ to $302_5$ and performs check node calculations according to Equation (7) using the messages D302 (corresponding to messages $v_i$ in Equation (7)) received through the selector 301 and provides 5 messages D303 (corresponding to messages $u_j$ in Equation (7)) obtained through the check node calculations to the cyclic-shift circuit 303.

The cyclic-shift circuit 303 cyclically shifts the 5 messages D303 obtained by the check node calculation unit 302 based on information (Matrix data) D305 indicating the number of elements by which an original unit matrix was cyclically shifted to obtain each corresponding edge in the converted parity check matrix H' and provides the cyclically shifted messages as messages D304 to the edge data storage memory 304.

In the edge data storage memory 304 including 18 FIFOs $304_1$ to $304_{18}$, a FIFO for storing data is selected from the FIFOs $304_1$ to $304_{18}$ according to information D305 indicating a row in the converted parity check matrix H', to which 5 messages D304, received from the cyclic-shift circuit 303 located upstream of the edge data storage memory 304, belong, and the 5 messages D304 are collected and stored in the selected FIFO in order. When data is read from the edge data storage memory 304, first, 5 messages $D306_1$ are read in order from the FIFO $304_1$ and are then provided to the selector 305 located downstream of the edge data storage memory 304. After data is completely read from the FIFO $304_1$, messages are read in order from the FIFOs $304_2$ to $304_{18}$ (including $306_{18}$) in the edge data storage memory 304 and are then provided to the selector 305 in the same manner.

The selector 305 selects 5 messages received from a FIFO from which data is currently being read among the FIFOs $304_1$ to $304_{18}$ according to a selection signal D307 and provides the selected messages as messages D308 to both the variable node calculation unit 307 and the decoded word calculator 309.

On the other hand, the received data permutation unit 310 performs column permutation of Mathematical Expression (9) to permute an LDPC code D313 received through a communication path and provides the resulting data as received data D314 to the received data memory 306. The received data memory 306 calculates and stores a reception Log-Likelihood Ratio (LLR) from the received data D314 received from the received data permutation unit 310 and provides reception LLRs in groups of 5 LLRs as received values D309 to both the variable node calculation unit 307 and the decoded word calculation unit 309.

The variable node calculation unit 307 includes 5 variable node calculators $307_1$ to $307_5$ and performs variable node calculations according to Equation (1) using the messages D308 (corresponding to messages $u_j$ in Equation (1)) received through the selector 305 and the 5 received values D309 (corresponding to received values $u_{0i}$ in Equation (1)) received from the received data memory 306 and then provides 5 messages D310 (corresponding to messages $v_i$ in Equation (1)) obtained through the variable node calculations to the cyclic-shift circuit 308.

The cyclic-shift circuit 308 cyclically shifts the 5 messages $D310_1$ to $D310_5$ calculated by the variable node calculation unit 307 based on information indicating the number of elements by which an original unit matrix was cyclically shifted to obtain each corresponding edge in the converted parity check matrix H' and provides the cyclically shifted messages as messages D311 to the edge data storage memory 300.

The LDPC code can be decoded once by performing the above operations once. After decoding the LDPC code a predetermined number of times, the decoding device of FIG. 34 obtains and outputs final decoded data through the decoded word calculation unit 309 and the decoded data permutation unit 311.

More specifically, the decoded word calculation unit 309 includes 5 decoded word calculators $309_1$ to $309_5$ and performs, as a final process of a plurality of decoding procedures, calculation of decoded data (i.e., a decoded word) based on Equation (5) using the 5 messages D308 (corresponding to messages $u_j$ in Equation (5)) output from the selector 305 and the 5 received values D309 (corresponding to received values $u_{0i}$ in Equation (5)) received from the received data memory 306 and provides the calculated decoded data D315 to the decoded data permutation unit 311.

The decoded data permutation unit 311 performs the reverse of the column permutation of Mathematical Expression (9) on the decoded data D315 received from the decoded word calculation unit 309 to change the order of the decoded data D315 and then outputs the resulting data as final decoded data D316.

As described above, one or both of the row permutation and column permutation is performed on the parity check matrix (i.e., original parity check matrix) to convert it into a parity check matrix (i.e., converted parity check matrix) that can be represented by a combination of component matrices, i.e., a combination of a P×P unit matrix, a quasi-unit matrix produced by replacing one or more "1s" of the unit matrix with "0s," a shifted matrix produced by cyclically shifting the unit matrix or quasi-unit matrix, a sum matrix produced by adding two or more of the unit matrix, the quasi-unit matrix, or the shift matrix, and a P×P zero matrix. This parity check matrix conversion makes it possible to employ, when an LDPC code is decoded, an architecture which simultaneously performs P check node calculations and P variable node calculations. Simultaneously performing P node calculations limits the operating frequency within a range that can be fully achievable, thereby making it possible to perform decoding a number of times.

Similar to the decoding device of FIG. 34, the LDPC decoder 56 included in The receiver of FIG. 29 is designed to decode an LDPC code by simultaneously performing P check node calculations and P variable node calculations.

More specifically, when it is assumed for ease of explanation that the parity check matrix of an LDPC code output from the LDPC encoder 21 included in the transmitter of FIG. 8 is a parity check matrix H in which a parity matrix has a stepwise structure, for example as shown in FIG. 31, the parity interleaver 23 in the transmitter performs parity interleaving to interleave a K+qx+y+1th code bit to a K+Py+x+1th code bit position with the information length K being "60," the unit number of columns P having a cyclic structure being "5," and the divisor q (=M/P) of the parity length M being "6."

Since this parity interleaving corresponds to the column permutation of Mathematical Expression (9) as described above, the LDPC decoder 56 does not need to perform the column permutation of Mathematical Expression (9).

Therefore, in the receiver of FIG. 29, an LDPC code that has not been subjected to parity deinterleaving, that is, an LDPC code with column permutation of Mathematical Expression (9) performed, is provided from the column twist deinterleaver 55 to the LDPC decoder 56 as described above. The LDPC decoder 56 performs the same processes as those of the decoding device of FIG. 34 except that column permutation of Mathematical Expression (9) is not performed in the LDPC decoder 56.

Figure 35:
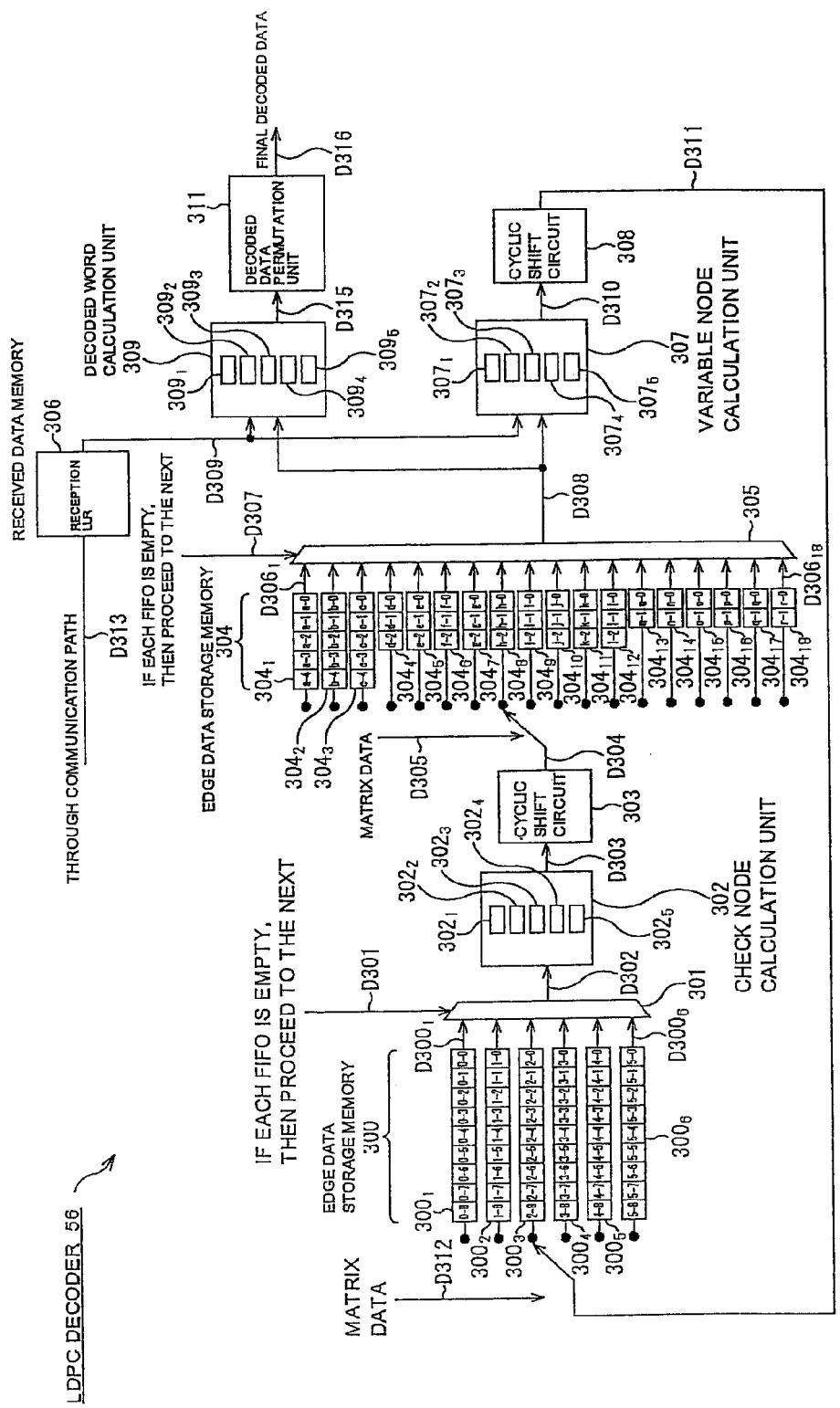
FIG. 35 shows an example configuration of an LDPC decoder 56.

More specifically, FIG. 35 shows an example configuration of the LDPC decoder 56 of FIG. 29.

The LDPC decoder 56 shown in FIG. 35 has the same configuration as that of the decoding device of FIG. 34 except that the received data permutation unit 310 of FIG. 34 is not provided and performs the same processes as those of the decoding device of FIG. 34 except that column permutation of Mathematical Expression (9) is not performed in the LDPC decoder 56 and thus a description of the same configuration and processes is omitted herein.

The LDPC decoder 56 can be reduced in size compared to the decoding device of FIG. 34 since the LDPC decoder 56 can be constructed without the received data permutation unit 310 as described above.

Although, for ease of explanation, FIGS. 31 to 35 have been described with reference to an example where the code length N of an LDPC code is 90, the information length K is 60, the unit number of columns P having a cyclic structure (i.e., the number of rows and the number of columns of a component matrix) is 5, and the divisor q (=M/P) of the parity length M is 6, the code length N, the information length K, the unit number of columns P having a cyclic structure, and the divisor q (=M/P) are not limited to these values.

Thus, while the LDPC encoder 21 in the transmitter of FIG. 8 outputs an LDPC code, for example having a code length N of 64800, an information length K of N−Pq (=N−M), a unit number of columns P having a cyclic structure of 360, and a divisor q of M/P, the LDPC decoder 56 of FIG. 35 can be applied to LDPC-decode the LDPC code by simultaneously performing P check node calculations and P variable node calculations.

The above series of processes can be performed not only by hardware but also by software. When the series of processes are performed by software, a program implementing the software is installed in a general-purpose computer or the like.

Figure 36:
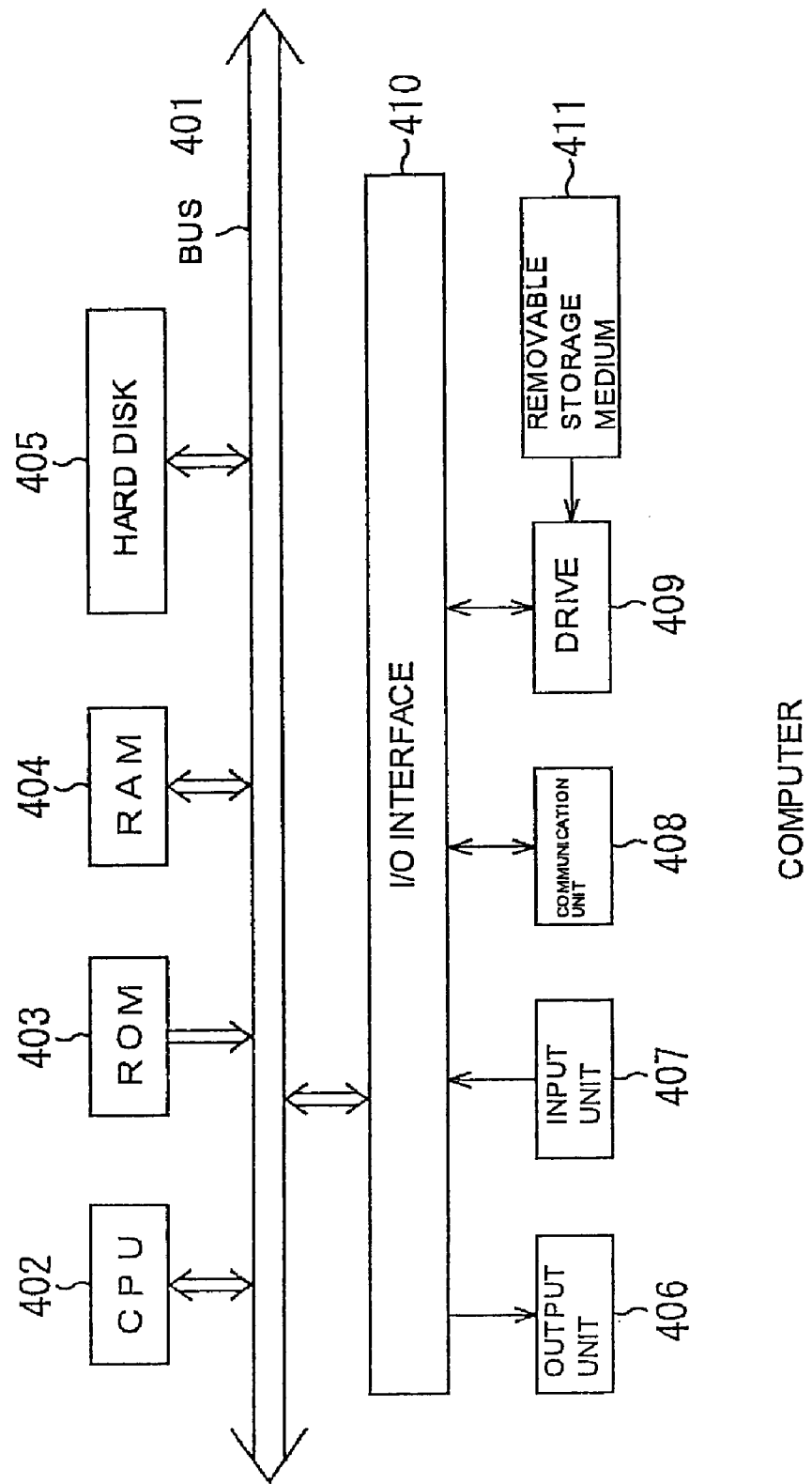
FIG. 36 is a block diagram illustrating an example configuration of an embodiment of a computer to which the invention is applied.

FIG. 36 illustrates an example configuration of an embodiment of a computer with a program for performing the above series of processes installed therein.

The program can be previously recorded in a hard disk 405 or ROM 403 as a recording medium embedded in the computer.

The program may also be temporarily or permanently stored (or recorded) in a removable recording medium 411 such as a floppy disk, a Compact Disc-Read Only Memory (CD-ROM), a Magneto-Optical Disc (MOD), a Digital Versatile Disc (DVD), a magnetic disk, or a semiconductor memory. This removable recording medium 411 can be provided as a so-called software package.

Instead of installing the program from the removable recording medium 411 as described above to a computer, the program may be transmitted wirelessly from a download site to a computer through a satellite for digital satellite broadcasting or may be transmitted by wire to a computer through a network such as a Local Area Network (LAN) or the Internet and the computer may receive the transmitted program through a communication unit 408 and may install the received program in an embedded hard disk 405.

The computer may include a Central Processing Unit (CPU) 402. The CPU 402 is coupled to an input/output (JO) interface 410 through a bus 401. The CPU 402 executes a program stored in the Read Only Memory (ROM) 403 when a command, which the user has input, for example by operating an input unit 407 including a keyboard, a mouse, a microphone, and the like has been received through the JO interface 410. Alternatively, the CPU 402 loads into a Random Access Memory (RAM) 404 and executes a program stored in the hard disk 405, a program that has been installed in the hard disk 405 after being received from a satellite or network through the communication unit 408, or a program that has been installed in the hard disk 405 after being read from the removable recording medium 411 installed in a drive 409. By executing the program in this manner, the CPU 402 performs the processes described above with reference to the flow charts or the processes performed by the components described above with reference to the block diagrams. Then, as needed, the CPU 402 outputs results of the processes, for example through an output unit 406 including a Liquid Crystal Display (LCD), a speaker, or the like via the I/O interface 410 or transmits the process results through the communication unit 408 or records the process results in the hard disk 405.

In the above description, it should be noted that the steps describing the program causing the computer to perform various types of processing are not necessarily performed chronologically in the order described above with reference to the flow charts and may be performed in parallel or individually (for example, through parallel processing or object-oriented processing).

The program may be operated with one computer or may be operated with multiple computers in a distributed manner. The program may also be transferred to a remote computer so as to be executed in the remote computer.

Those skilled in the art will appreciate that the embodiments of the invention are not limited to those described above and various changes can be made without departing from the scope of the invention as disclosed in the accompanying claims.

More specifically, although parity interleaving or column twist interleaving, which is a permutation process, is performed on an LDPC code defined in the DVB-S.2 specification in the above embodiments, parity interleaving may be applied to an LDPC code of a parity check matrix in which an information matrix does not have a cyclic structure, provided that a parity matrix in the parity check matrix has a stepwise structure, and the column twist interleaving as a permutation process may be applied to, for example, an LDPC code of a parity check matrix which is converted into a pseudo-cyclic structure through at least column permutation or a Quasi-Cyclic (QC)-LDPC code of a parity check matrix which has a cyclic structure in its entirety.

That is, the parity check matrix of an LDPC code that is to be subjected to parity interleaving only needs to include a parity matrix having a stepwise structure and does not need to include an information matrix having a cyclic structure.

The parity check matrix of an LDPC code that is to be subjected to column twist interleaving as a permutation process is not limited to any specific structure.

In addition, the permutation process only needs to be able to permute code bits of an LDPC code such that a plurality of code bits corresponding to "1" in an arbitrary row of the parity check matrix are not incorporated into the same symbol and can be performed using a method other than column twist interleaving. More specifically, the permutation process can be performed by controlling write and read addresses, for example using a memory in which data is stored in only one direction instead of the memory 31 in which data is stored in column and row directions.

Symbol Interleaver

It has been proposed that the number of modes, which are available within the DVB-T2 standard should be extended to include a 1k mode, a 16k mode and a 32k mode. The following description is provided to illustrate the operation of a symbol interleaver in accordance with the present technique, although it will be appreciated that the symbol interleaver can be used with other modes and other DVB standards.

To create a new modes, several elements are to be defined, one of which is the symbol interleaver 33. The bit to constellation mapper 26, symbol interleaver 33 and the frame builder 35 are shown in more detail in FIG. 37.

As explained above, the present technique provides a facility for providing a quasi-optimal mapping of the data symbols onto the OFDM sub-carrier signals. According to the example technique the symbol interleaver is provided to effect the optimal mapping of input data symbols onto OFDM sub-carrier signals in accordance with a permutation code and generator polynomial, which has been verified by simulation analysis. The symbol interleaver therefore combines with the bit interleaver and the LDPC encoding to improve the performance of communicating data on communications channels such as those proposed for DVB.

Figure 37:
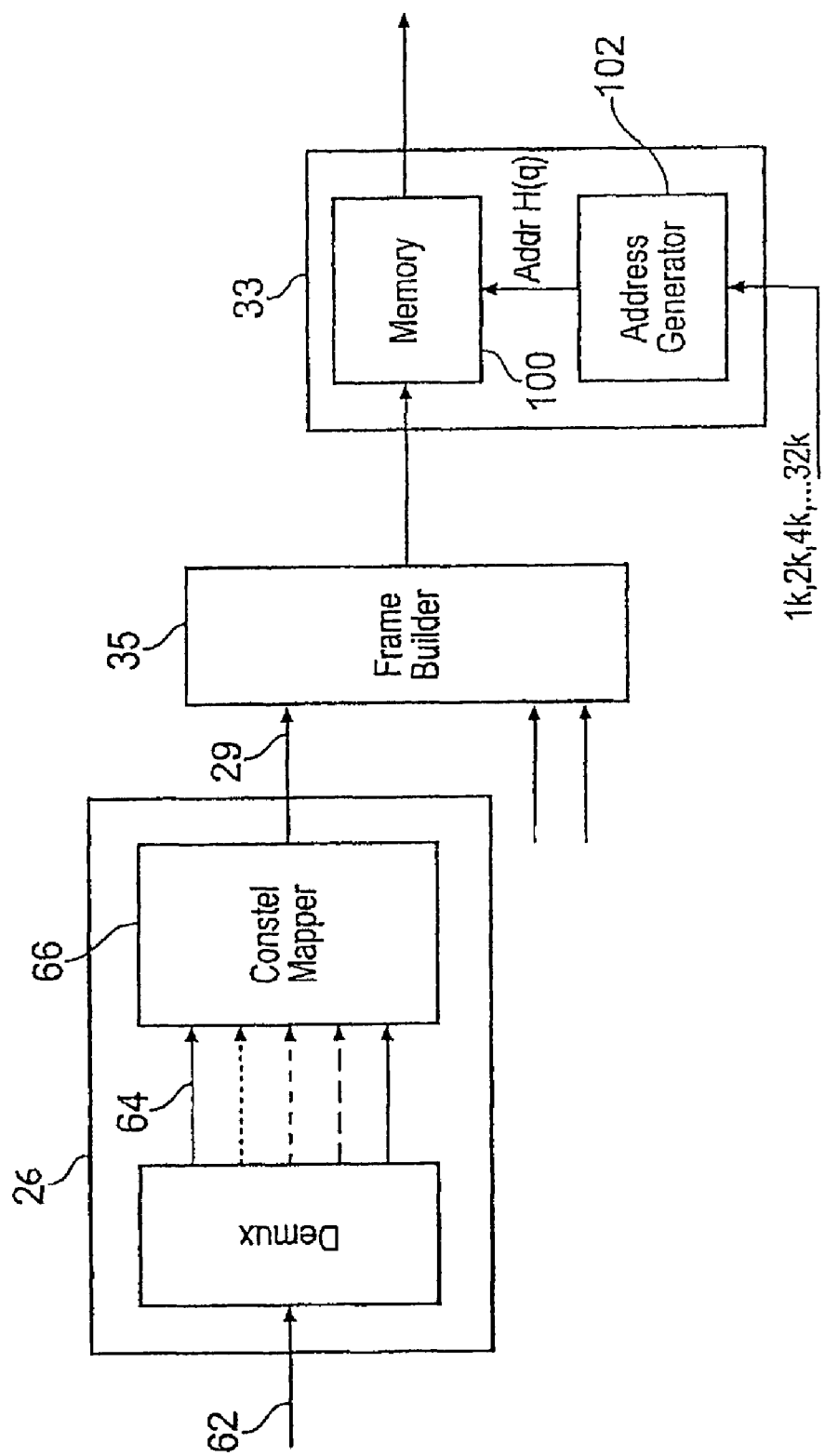
FIG. 37 is a schematic block diagram of parts of the transmitter shown in FIG. 1 in which a symbol mapper and a frame builder illustrate the operation of an interleaver.

As shown in FIG. 37 a more detailed example illustration of the bit to symbol constellation mapper 26 and the frame builder 35 is provided to illustrate an example embodiment of the present technique. Data bits received from the bit interleaver 26 via a channel 62 are grouped into sets of bits to be mapped onto a data cell, in accordance with a number of bits per symbol provided by the modulation scheme. The groups of bits, which forms a data word, are fed in parallel via data channels 64 the a mapping processor 66. The mapping processor 66 then selects one of the data symbols, in accordance with a pre-assigned mapping. The constellation point, is represented by a real and an imaginary component is provided to the output channel 29 as one of a set of inputs to the frame builder 35.

The frame builder 35 receives the data cells from the bit to constellation mapper 26 through channel 29, together with data cells from the other channels. After building a frame of many OFDM cell sequences, the cells of each OFDM symbol are then written into an interleaver memory 100 and read out of the interleaver memory 100 in accordance with write addresses and read addresses generated by an address generator 102. According to the write-in and read-out order, interleaving of the data cells is achieved, by generating appropriate addresses. The operation of the address generator 102 and the interleaver memory 100 will be described in more detail shortly with reference to FIGS. 38, 39 and 40. The interleaved data cells are then combined with pilot and synchronisation symbols received from the pilot and embedded signalling former 36 into an OFDM symbol builder 37, to form the OFDM symbol, which is fed to the OFDM modulator 38 as explained above.

Figure 38:
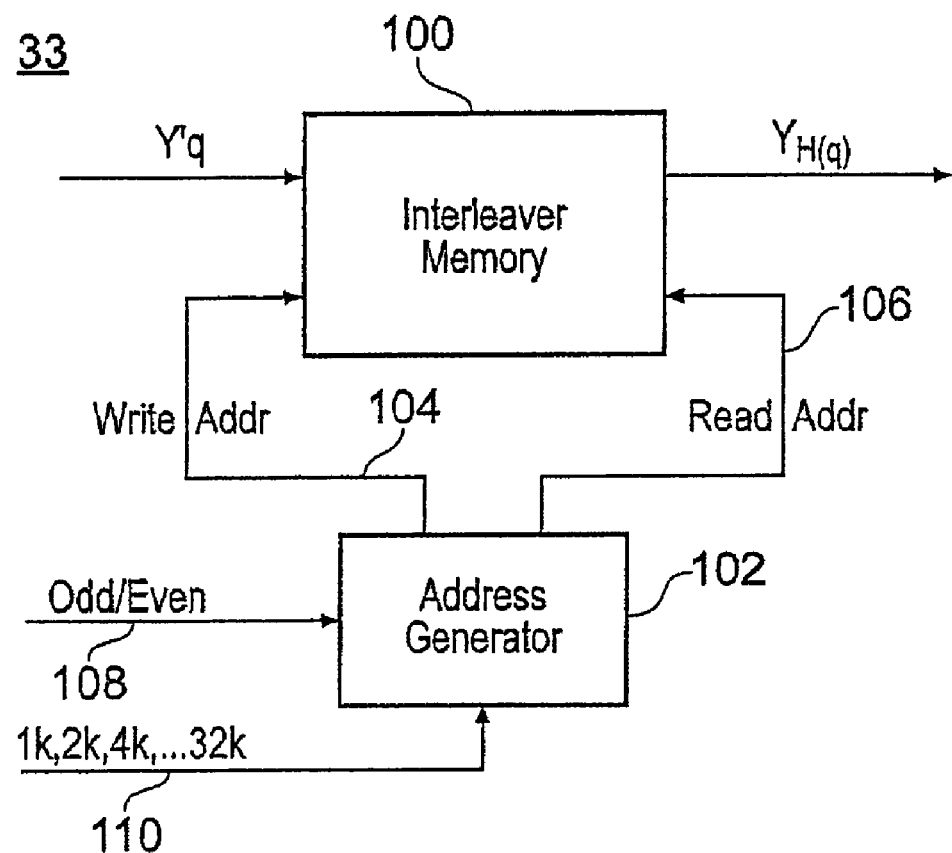
FIG. 38 is a schematic block diagram of the symbol interleaver shown in FIG. 37.

FIG. 38 provides an example of parts of the symbol interleaver 33, which illustrates the present technique for interleaving symbols. In FIG. 38 the input data cells from the frame builder 35 are written into the interleaver memory 100. The data cells are written into the interleaver memory 100 according to a write address fed from the address generator 102 on channel 104, and read out from the interleaver memory 100 according to a read address fed from the address generator 102 on a channel 106. The address generator 102 generates the write address and the read address as explained below, depending on whether the OFDM symbol is odd or even, which is identified from a signal fed from a channel 108, and depending on a selected mode, which is identified from a signal fed from a channel 110. As explained, the mode can be one of a 1k mode, 2k mode, 4k mode, 8k mode, 16k mode or a 32k mode. As explained below, the write address and the read address are generated differently for odd and even symbols as explained with reference to FIG. 39, which provides an example implementation of the interleaver memory 100.

Figure 39:
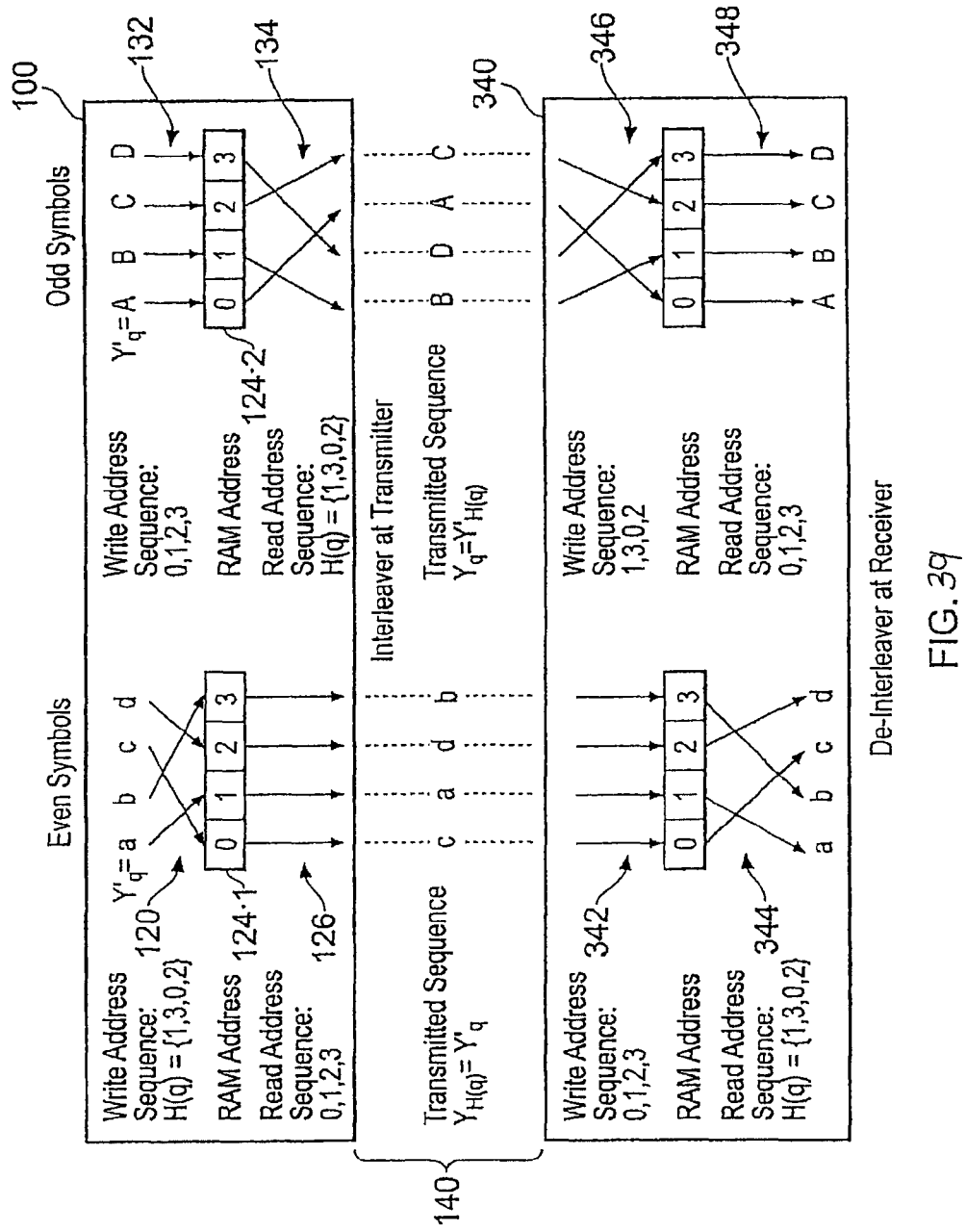
FIG. 39 is a schematic block diagram of an interleaver memory shown in FIG. 38 and the corresponding symbol de-interleaver in the receiver.

In the example shown in FIG. 39, the interleaver memory is shown to comprise an upper part 100 illustrating the operation of the interleaver memory in the transmitter and a lower part 340, which illustrates the operation of the de-interleaver memory in the receiver. The interleaver 100 and the de-interleaver 340 are shown together in FIG. 39 in order to facilitate understanding of their operation. As shown in FIG. 39 a representation of the communication between the interleaver 100 and the de-interleaver 340 via other devices and via a transmission channel has been simplified and represented as a section 140 between the interleaver 100 and the de-interleaver 340. The operation of the interleaver 100 is described in the following paragraphs:

Although FIG. 39 provides an illustration of only four input data cells onto an example of four sub-carrier signals of an OFDM symbol, it will be appreciated that the technique illustrated in FIG. 39 can be extended to a larger number of sub-carriers such as 756 for the 1k mode 1512 for the 2k mode, 3024 for the 4k mode and 6048 for the 8k mode, 12096 for the 16k mode and 24192 for the 32k mode.

The input and output addressing of the interleaver memory 100 shown in FIG. 39 is for odd and even symbols. For an even OFDM symbol the data cells are taken from the input channel 120 and written into the interleaver memory 124.1 in accordance with a sequence of addresses 120 generated for each OFDM symbol by the address generator 102. The write addresses are applied for the even symbol so that as illustrated interleaving is effected by the shuffling of the write-in addresses. Therefore, for each interleaved symbol y(h(q))=y'(q).

For odd symbols the same interleaver memory 124.2 is used. However, as shown in FIG. 39 for the odd symbol the write-in order 132 is in the same address sequence used to read out the previous even symbol 126. This feature allows the odd and even symbol interleaver implementations to only use one interleaver memory 100 provided the read-out operation for a given address is performed before the write-in operation. The data cells written into the interleaver memory 124.2 during odd symbols are then read out in a sequence 134 generated by the address generator 102 for the next even OFDM symbol and so on. Thus only one address is generated per symbol, with the read-in and write-out for the odd/even OFDM symbol being performed contemporaneously.

In summary, as represented in FIG. 39, once the set of addresses H(q) has been calculated for all active sub-carriers, the input vector $Y'=(y'_0, y'_1, y'_2, \ldots y'_{Nmax-1})$ is processed to produce the interleaved vector $Y=(y_0, y_1, y_2, \ldots y_{Nmax-1})$ defined by:

$y_{H(q)}=y'_q$ for even symbols for $q=0, \ldots, N_{max}-1$
$y_q=y'_{H(q)}$ for odd symbols for $q=0, \ldots, N_{max}-1$ In other words, for even OFDM symbols the input words are written in a permutated way into a memory and read back in a sequential way, whereas for odd symbols, they are written sequentially and read back permutated. In the above case, the permutation H(q) is defined by the following table:

TABLE 1 permutation for simple case where Nmax = 4

| q | 0 | 1 | 2 | 3 |
|---|---|---|---|---|
| H(q) | 1 | 3 | 0 | 2 |

As shown in FIG. 39, the de-interleaver 340 operates to reverse the interleaving applied by the interleaver 100, by applying the same set of addresses as generated by an equivalent address generator, but applying the write-in and read-out addresses in reverse. As such, for even symbols, the write-in addresses 342 are in sequential order, whereas the read out address 344 are provided by the address generator. Correspondingly, for the odd symbols, the write-in order 346 is determined from the set of addresses generated by the address generator, whereas read out 348 is in sequential order.

Address Generation for Operating Modes

Figure 40:
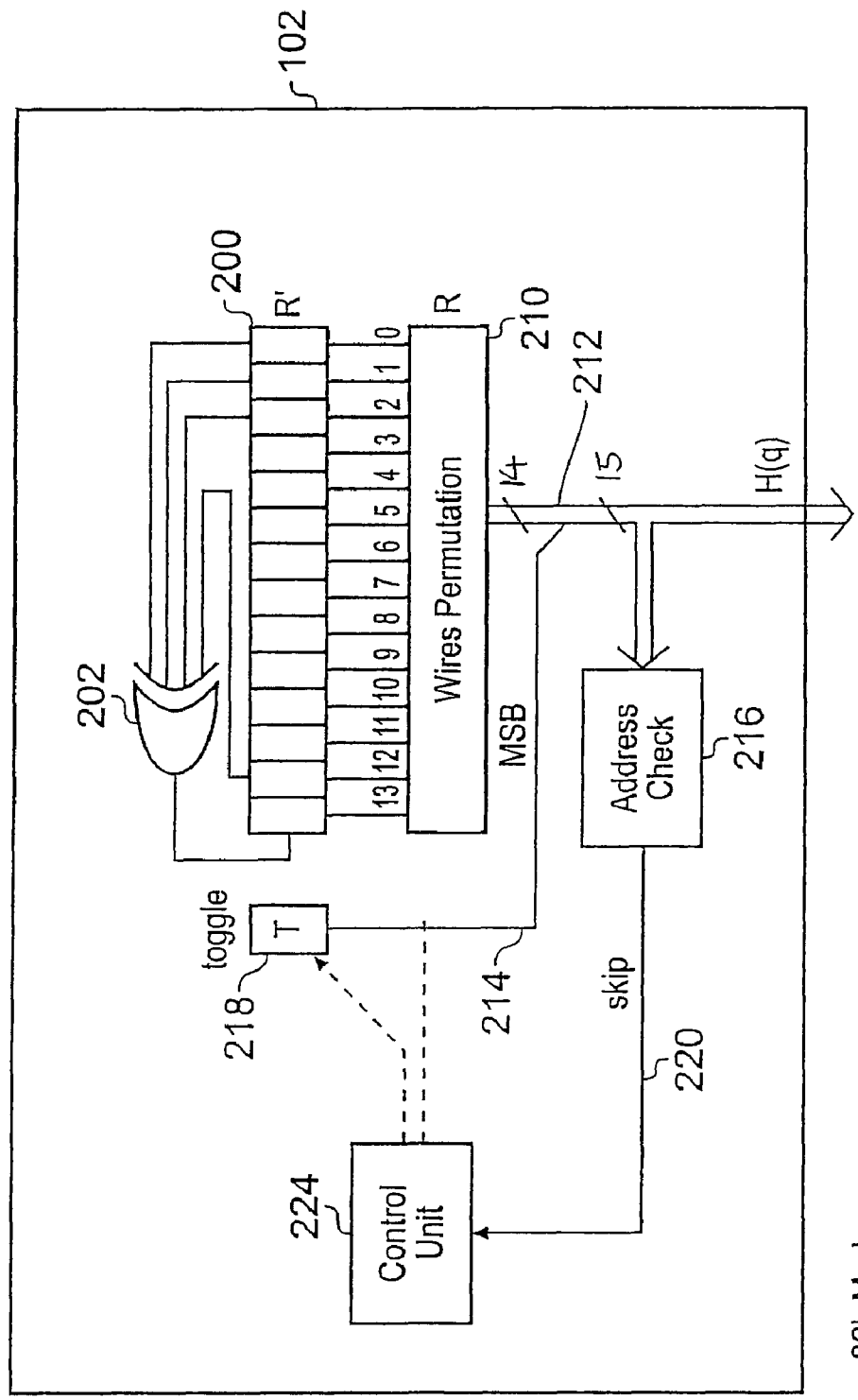
FIG. 40 is a schematic block diagram of an address generator shown in FIG. 38 for the 32k mode.
Figure 41A:
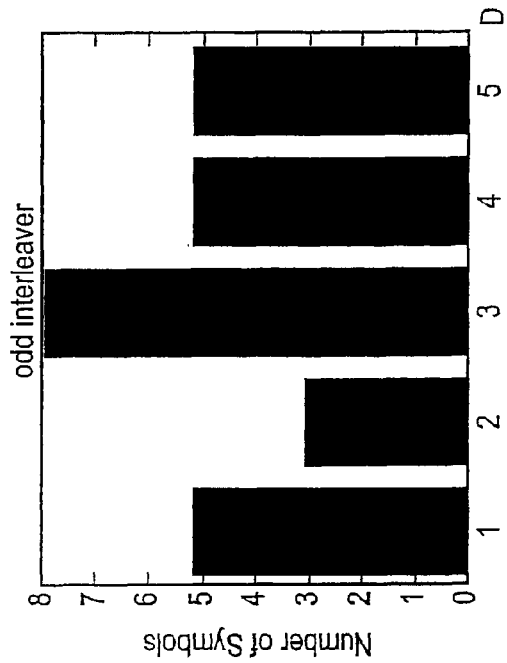
Figure 41B:
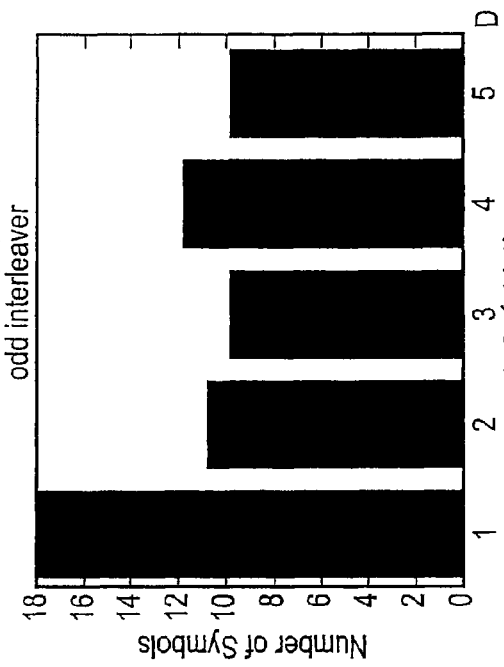
Figure 41C:
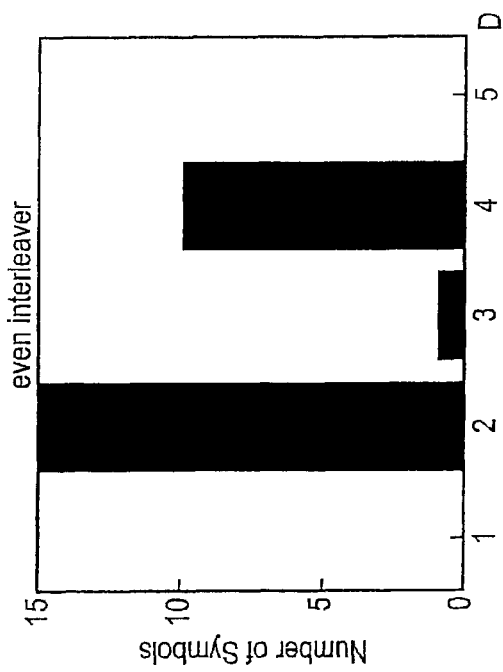
FIG. 41(c) is a diagram illustrating comparative results for an address generator using a different permutation code for even and FIG. 41(d) is a corresponding diagram for odd symbols.
Figure 41D:
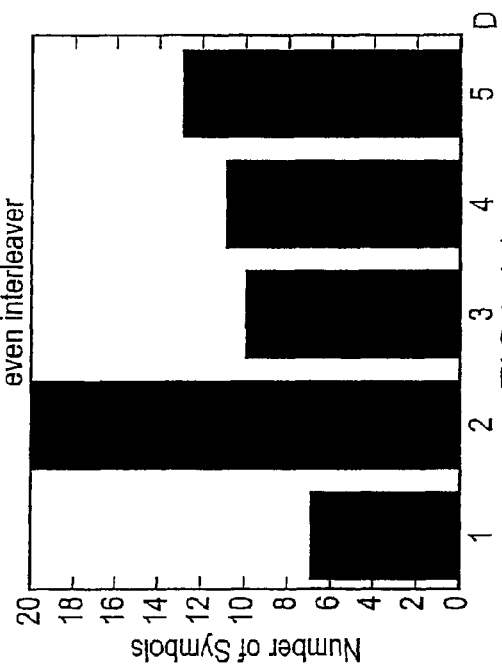

A schematic block diagram of the algorithm used to generate the permutation Function H(q) is represented in FIG. 40 for a 32k mode. However, as will be appreciated, the 32K mode interleaver of FIG. 40 can be adapted to operate as an interleaver according to a 1k, 2k, 4k, 8k or a 16k mode by making appropriate adaptation of the generator polynomial and the permutation code as explained below.

In FIG. 40 a linear feed back shift register is formed by thirteen register stages 200 and a xor-gate 202 which is connected to the stages of the shift register 200 in accordance with a generator polynomial. Therefore, in accordance with the content of the shift register 200 a next bit of the shift register is provided from the output of the xor-gate 202 by xoring the content of shift registers R[0], R[1], R[2], R[12] according to the generator polynomial:

$$R'_i[13]=R'_{i-1}[0] \oplus R'_{i-1}[1] \oplus R'_{i-1}[2] \oplus R'_{i-1}[12]$$

According to the generator polynomial a pseudo random bit sequence is generated from the content of the shift register 200. However, in order to generate an address for the 32k mode as illustrated, a permutation circuit 210 is provided which effectively permutes the order of the bits within the shift register 200 from an order $R'_i[n]$ to an order $R_i[n]$ at the output of the permutation circuit 210. Fourteen bits from the output of the permutation circuit 210 are then fed on a connecting channel 212 to which is added a most significant bit via a channel 214 which is provided by a toggle circuit 218. A fifteen bit address is therefore generated on channel 212. However, in order to ensure the authenticity of an address, an address check circuit 216 analyses the generated address to determine whether it exceeds a predetermined maximum value. The predetermined maximum value may correspond to the maximum number of sub-carrier signals, which are available for data symbols within the OFDM symbol, available for the mode which is being used. However, the interleaver for the 32k mode may also be used for other modes, so that the address generator 102 may also be used for the 2k mode, 4k mode, 8k mode, 16k mode and the 32k mode, by adjusting accordingly the number of the maximum valid address.

If the generated address exceeds the predetermined maximum value then a control signal is generated by the address check unit 216 and fed via a connecting channel 220 to a control unit 224. If the generated address exceeds the predetermined maximum value then this address is rejected and a new address regenerated for the particular symbol.

For the 32k mode, an $(N_r-1)$ bit word $R'_i$ is defined, with $N_r=\log_2 M_{max}$, where $M_{max}=32768$ using a LFSR (Linear Feedback Shift Register).

The polynomials used to generate this sequence is:

32K mode: $R'_i[13]=R'_{i-1}[0] \oplus R'_{i-1}[1] \oplus R'_{i-1}[2] \oplus R'_{i-1}[12]$ where i varies from 0 to $M_{max}-1$ Once one $R'_i$, word has been generated, the $R'_i$, word goes through a permutation to produce another $(N_r-1)$ bit word called $R_i$. $R_i$ is derived from $R'_i$ by the bit permutations given as follows:

| | $R'_i$ bit positions | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| $R_i$ bit positions | 6 | 5 | 0 | 10 | 8 | 1 | 11 | 12 | 2 | 9 | 4 | 3 | 13 | 7 |

As an example, this means that for the mode 32K, the bit number 12 of $R'_i$ is sent to bit position number 5 of $R_i$.

The address H(q) is then derived from $R_i$ through the following equation:

$$H(q) = (i \bmod 2) \cdot 2^{N_r-1} + \sum_{j=0}^{N_r-2} R_i(j) \cdot 2^j$$

The (i mod 2)·$2^{N_r-1}$ part of the above equation is represented in FIG. 40 by the toggle block T 218.

An address check is then performed on H(q) to verify that the generated address is within the range of acceptable addresses: if (H(q)<$N_{max}$), where $N_{max}$=24192, for example, in the 32K mode, then the address is valid. If the address is not valid, the control unit is informed and it will try to generate a new H(q) by incrementing the index i.

The role of the toggle block is to make sure that we do not generate an address exceeding $N_{max}$ twice in a row. In effect, if an exceeding value was generated, this means that the MSB (i.e. the toggle bit) of the address H(q) was one. So the next value generated will have a MSB set to zero, insuring to produce a valid address. The additional bit, therefore reduces a likelihood that if an address exceeds the predetermined maximum valid address, then the next address will be a valid address. In one example the additional bit is the most significant bit.

The following equations sum up the overall behaviour and help to understand the loop structure of this algorithm:

$$q = 0;$$
$$\text{for } (i = 0; i < M_{max}; i = i+1)$$
$$\begin{cases} H(q) = (i \bmod 2) \cdot 2^{N_r-1} + \sum_{j=0}^{N_r-2} R_i(j) \cdot 2^j; \\ \text{if } (H(q) < N_{max}) \ q = q+1; \end{cases}$$

Analysis Supporting the Address Generator

The selection of the polynomial generator and the permutation code explained above for the address generator 102 for each operating mode, for example the 32k mode, has been identified following simulation analysis of the relative performance of the interleaver. The relative performance of the interleaver has been evaluated using a relative ability of the interleaver to separate successive symbols or an "interleaving quality". As mentioned above, effectively the interleaving must perform for both odd and even symbols, in order to use a single interleaver memory. The relative measure of the interleaver quality is determined by defining a distance D (in number of sub-carriers). A criterion C is chosen to identify a number of sub-carriers that are at distance≦D at the output of the interleaver that were at distance≦D at the input of the interleaver, the number of sub-carriers for each distance D then being weighted with respect to the relative distance. The criterion C is evaluated for both odd and even OFDM symbols. Minimising C produces a superior quality interleaver.

$$C = \sum_{1}^{d=D} N_{even}(d)/d + \sum_{1}^{d=D} N_{odd}(d)/d$$

where: $N_{even}(d)$ and $N_{odd}(d)$ are number of sub-carriers in an even and odd symbol respectively at the output of the interleaver that remain within d sub-carrier spacing of each other.

Analysis of the interleaver identified above for the 32k mode for a value of D=5 is shown in FIG. 41(*a*) for the even OFDM symbols and in FIG. 41(*b*) for the odd OFDM symbol. According to the above analysis, the value of C for the permutation code identified above for the 32k mode produced a value of C=21.75, that the weighted number of sub-carriers with symbols which are separated by five or less in the output according to the above equation was 21.75.

A corresponding analysis is provided for an alternative permutation code for even OFDM symbols in FIG. 41(*c*) for odd OFDM symbols in FIG. 41(*d*). As can be seen in comparison to the results illustrated in FIGS. 41(*a*) and 41(*b*), there are more components present which represent symbols separated by small distances such as D=1, and D=2, when compared with the results shown in FIGS. 41(*a*) and 41(*b*), illustrating that the permutation code identified above for the 32k mode symbol interleaver produces a superior quality interleaver.

Alternative Permutation Codes

The following fifteen alternative possible codes ([n]$R_i$ bit positions, where n=1 to 15) have been found to provide a symbol interleaver with a good quality as determined by the criterion C identified above.

|  | $R'_i$ bit positions | | | | | | | | | | | | | |
| --- | --- | --- | --- | --- | --- | --- | --- | --- | --- | --- | --- | --- | --- | --- |
|  | 13 | 12 | 11 | 10 | 9 | 8 | 7 | 6 | 5 | 4 | 3 | 2 | 1 | 0 |
| [1]$R_i$ bit positions | 0 | 6 | 1 | 7 | 2 | 11 | 12 | 5 | 9 | 8 | 3 | 10 | 4 | 13 |
| [2]$R_i$ bit positions | 9 | 5 | 0 | 7 | 2 | 8 | 3 | 6 | 12 | 11 | 4 | 1 | 10 | 13 |
| [3]$R_i$ bit positions | 9 | 12 | 0 | 1 | 2 | 13 | 5 | 8 | 6 | 3 | 7 | 4 | 10 | 11 |
| [4]$R_i$ bit positions | 13 | 8 | 1 | 12 | 11 | 0 | 9 | 5 | 3 | 7 | 6 | 2 | 10 | 4 |
| [5]$R_i$ bit positions | 5 | 8 | 7 | 0 | 3 | 2 | 11 | 4 | 13 | 6 | 1 | 10 | 12 | 9 |
| [6]$R_i$ bit positions | 8 | 9 | 5 | 13 | 0 | 10 | 7 | 1 | 12 | 3 | 2 | 4 | 11 | 6 |
| [7]$R_i$ bit positions | 11 | 10 | 0 | 7 | 2 | 9 | 8 | 1 | 5 | 3 | 6 | 4 | 12 | 13 |
| [8]$R_i$ bit positions | 11 | 4 | 0 | 13 | 10 | 12 | 5 | 7 | 2 | 8 | 3 | 1 | 6 | 9 |
| [9]$R_i$ bit positions | 4 | 0 | 5 | 1 | 12 | 2 | 10 | 3 | 13 | 9 | 6 | 11 | 8 | 7 |
| [10]$R_i$ bit positions | 4 | 7 | 0 | 8 | 10 | 1 | 6 | 3 | 2 | 9 | 11 | 12 | 13 | 5 |
| [11]$R_i$ bit positions | 4 | 6 | 0 | 13 | 12 | 1 | 11 | 2 | 8 | 3 | 10 | 7 | 9 | 5 |
| [12]$R_i$ bit positions | 0 | 5 | 1 | 9 | 2 | 12 | 3 | 6 | 8 | 7 | 4 | 10 | 11 | 13 |
| [13]$R_i$ bit positions | 12 | 4 | 2 | 11 | 10 | 1 | 13 | 6 | 0 | 9 | 3 | 8 | 5 | 7 |
| [14]$R_i$ bit positions | 10 | 6 | 0 | 13 | 12 | 11 | 8 | 5 | 2 | 4 | 3 | 1 | 9 | 7 |
| [15]$R_i$ bit positions | 7 | 6 | 0 | 1 | 10 | 3 | 9 | 4 | 2 | 5 | 8 | 11 | 12 | 13 |

Bit permutation for the 32K mode

Adaptation of the Symbol Interleaver and Address Generator for Other Modes

As mentioned above the symbol interleaver shown in FIG. 40 can be adapted to interleaver symbols from other modes by simply changing the maximum valid address, the number of stages in the linear feedback shift register, and the permutation code. In particular, according to the abovementioned analysis, the following have been established for each of the 1k, 2k, 4k, 8k and 16k modes:

1k Mode
  Maximum valid address: approximately one thousand
  Number of stages in the linear feed back shift register: Nine
  Generator polynomial: $R'_i[8]=R'_{i-1}[0]\oplus R'_{i-1}[4]$
  Permutation code:

| | R'$_i$ bit positions | | | | | | | | |
|---|---|---|---|---|---|---|---|---|---|
| | 8 | 7 | 6 | 5 | 4 | 3 | 2 | 1 | 0 |
| R$_i$ bit positions | 4 | 3 | 2 | 1 | 0 | 5 | 6 | 7 | 8. |

2K Mode
  Maximum valid address approximately two thousand.
  Number of stages in the linear feed back shift register: 10
  Generator polynomial: $R'_i[9]=R'_{i-1}[0]\oplus R'_{i-1}[3]$
  Permutation code:

| | R'$_i$[n] bit position | | | | | | | | | |
|---|---|---|---|---|---|---|---|---|---|---|
| | 9 | 8 | 7 | 6 | 5 | 4 | 3 | 2 | 1 | 0 |
| R'$_i$[n] bit position | 0 | 7 | 5 | 1 | 8 | 2 | 6 | 9 | 3 | 4 |

4K Mode
  Maximum valid address: approximately four thousand
  Number of stages in the linear feed back shift register: Eleven
  Generator polynomial: $R'_i[10]=R'_{i-1}[0]\oplus R'_{i-1}[2]$
  Permutation code:

| | R'$_i$[n] for n = | | | | | | | | | | |
|---|---|---|---|---|---|---|---|---|---|---|---|
| | 10 | 9 | 8 | 7 | 6 | 5 | 4 | 3 | 2 | 1 | 0 |
| R$_i$ [n]for n = | 7 | 10 | 5 | 8 | 1 | 2 | 4 | 9 | 0 | 3 | 6. |

8K Mode
  Maximum valid address: approximately eight thousand
  Number of stages in the linear feed back shift register: Twelve
  Generator polynomial: $R'_i[11]=R'_{i-1}[0]\oplus R'_{i-1}[1]\oplus R'_{i-1}[4]\oplus R'_{i-1}[6]$
  Permutation code:

| | R'$_i$ bit positions | | | | | | | | | | |
|---|---|---|---|---|---|---|---|---|---|---|---|
| | 11 | 10 | 9 | 8 | 7 | 6 | 5 | 4 | 3 | 2 | 1 | 0 |
| R$_i$ bit positions | 5 | 11 | 3 | 0 | 10 | 8 | 6 | 9 | 2 | 4 | 1 | 7. |

16K Mode
  Maximum valid address: approximately sixteen thousand
  Number of stages in the linear feed back shift register: 13
  Generator polynomial:

$R'_i[12]=R'_{i-1}[0]\oplus R'_{i-1}[4]\oplus R'_{i-1}[5]\oplus R'_{i-1}[9]\oplus R'_{i-1}[11]$ Permutation code:

| | R'$_i$ bit positions | | | | | | | | | | | |
|---|---|---|---|---|---|---|---|---|---|---|---|---|
| | 12 | 11 | 10 | 9 | 8 | 7 | 6 | 5 | 4 | 3 | 2 | 1 | 0 |
| R$_i$ bit positions | 8 | 4 | 3 | 2 | 0 | 11 | 1 | 5 | 12 | 10 | 6 | 7 | 9. |

Further Description of Symbol Interleaver in the Receiver

Figure 42:
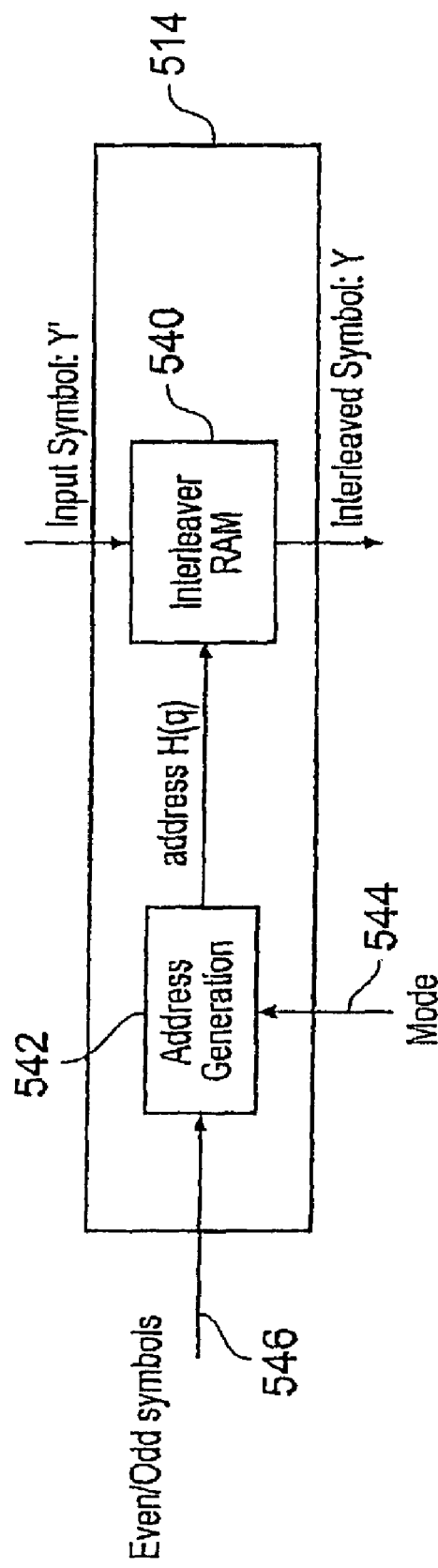
FIG. 42 is a schematic block diagram of a symbol de-interleaver which appears in FIG. 29.

Returning to the interleaver shown in FIG. 29, the symbol de-interleaver 514 is formed from a data processing apparatus as shown in FIG. 42 with an interleaver memory 540 and an address generator 542. The interleaver memory 540 is as shown in FIG. 39 and operates as already explained above to effect de-interleaving by utilising sets of addresses generated by the address generator 542. The address generator 542 is formed as shown in FIG. 40 and is arranged to generate corresponding addresses to map the data symbols recovered from each OFDM sub-carrier signals into an output data stream.

The remaining parts of the OFDM receiver shown in FIG. 29 are provided to effect error correction decoding of the LDPC encoded data bits to correct errors and recover an estimate of the source data.

One advantage provided by the present technique for both the receiver and the transmitter is that a symbol interleaver and a symbol de-interleaver operating in the receivers and transmitters can be switched between the 1k, 2k, 4k, 8k, 16k and the 32k mode by changing the generator polynomials and the permutation order. Hence the address generator 542 shown in FIG. 42 includes an input 544, providing an indication of the mode as well as an input 546 indicating whether there are odd/even OFDM symbols. A flexible implementation is thereby provided because a symbol interleaver and de-interleaver can be formed as shown in FIGS. 38 and 42, with an address generator as illustrated in either of FIG. 40. The address generator can therefore be adapted to the different modes by changing to the generator polynomials and the permutation orders indicated for each of the modes. For example, this can be effected using a software change. Alternatively, in other embodiments, an embedded signal indicating the mode of the DVB-T2 transmission can be detected in the receiver in the embedded-signalling processing unit 511 and used to configure automatically the symbol de-interleaver in accordance with the detected mode.

Alternatively, as mentioned above, different interleavers can be used with different modes, by simply adapting the maximum valid address in accordance with the mode being used.

Optimal Use of Odd Interleavers

As shown in FIG. 39, two symbol interleaving processes, one for even OFDM symbols and one for odd OFDM symbols allows the amount of memory used during interleaving to be reduced. In the example shown in FIG. 39, the write in order for the odd symbol is the same as the read out order for the even symbol therefore, while an odd symbol is being read from the memory, an even symbol can be written to the location just read from; subsequently, when that even symbol is read from the memory, the following odd symbol can be written to the location just read from.

Figure 43A:
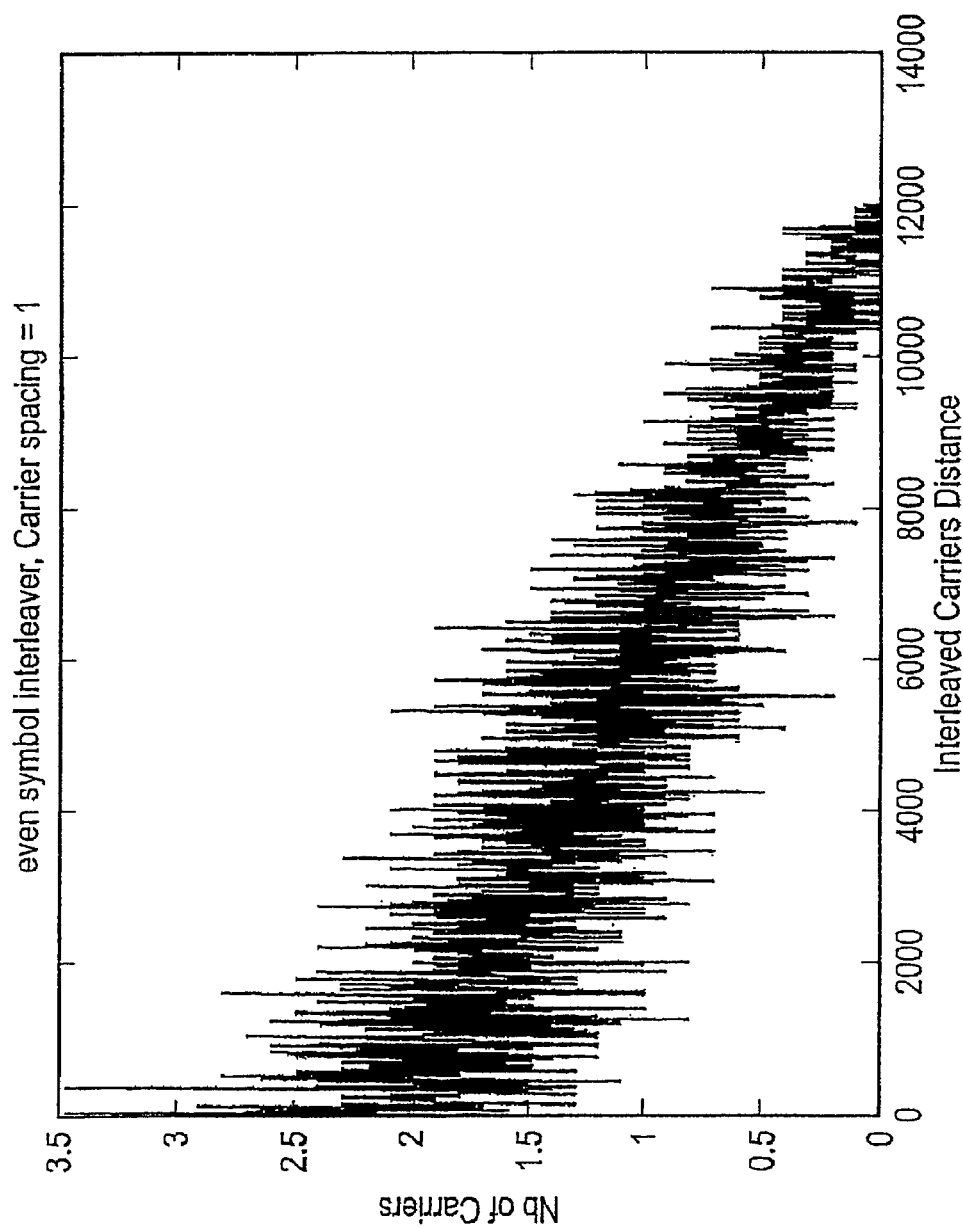
FIG. 43(a) is diagram illustrating results for an interleaver using the address generator shown in FIG. 40 for even OFDM symbols and FIG. 43(b) is a diagram illustrating results for odd OFDM symbols.
Figure 43B:
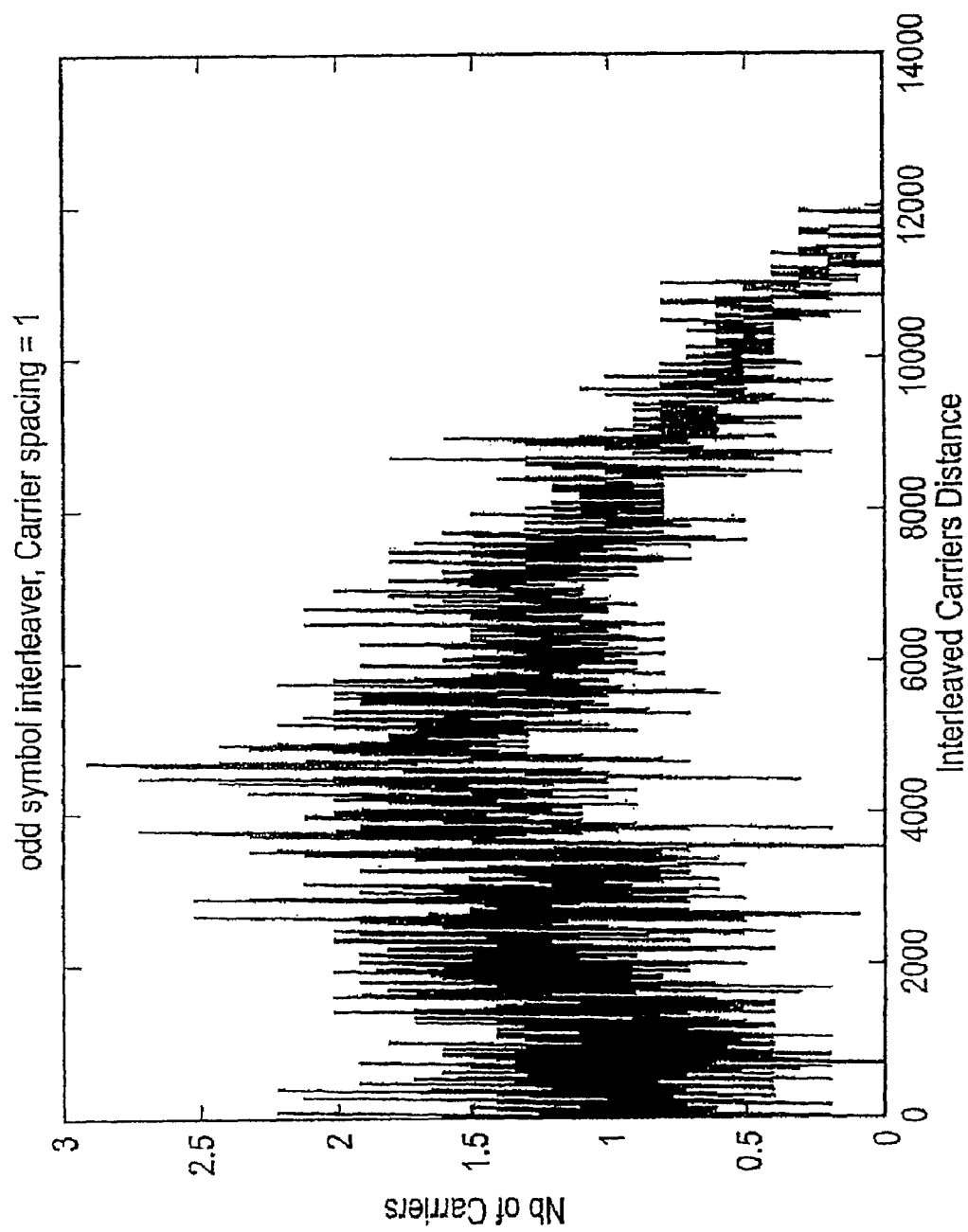

As mentioned above, during an experimental analysis of the performance of the interleavers (using criterion C as defined above) and for example shown in FIG. 43(a) and FIG. 43(b) it has been discovered that the interleaving schemes designed for the 2k and 8k symbol interleavers for DVB-T and the 4k symbol interleaver for DVB-H work better for odd symbols than even symbols. Thus from performance evaluation results of the interleavers, for example, as illustrated by FIGS. 43(a) and 43(b) have revealed that the odd interleavers work better than the even interleavers. This can be seen by comparing FIG. 43(a) which shows results for an interleaver for even symbols and FIG. 43(b) illustrating results for odd symbols: it can be seen that the average distance at the interleaver output of sub-carriers that were adjacent at the interleaver input is greater for an interleaver for odd symbols than an interleaver for even symbols.

As will be understood, the amount of interleaver memory required to implement a symbol interleaver is dependent on the number of data symbols to be mapped onto the OFDM carrier symbols. Thus a 16k mode symbol interleaver requires half the memory required to implement a 32k mode symbol interleaver and similarly, the amount of memory required to implement an 8k symbol interleaver is half that required to implement a 16k interleaver. Therefore a transmitter or receiver which is arranged to implement a symbol interleaver of a mode, which sets the maximum number of data symbols which can be carried per OFDM symbol, then that receiver or transmitter will include sufficient memory to implement two odd interleaving processes for any other mode, which provides half or smaller than half the number of sub-carriers per OFDM symbol in that given maximum mode. For example a receiver or transmitter including a 32K interleaver will have enough memory to accommodate two 16K odd interleaving processes each with their own 16K memory.

Therefore, in order to exploit the better performance of the odd interleaving processes, a symbol interleaver capable of accommodating multiple modulation modes can be arranged so that only an odd symbol interleaving process is used if in a mode which comprises half or less than half of the number of sub-carriers in a maximum mode, which represents the maximum number of sub-carriers per OFDM symbol. This maximum mode therefore sets the maximum memory size. For example, in a transmitter/receiver capable of the 32k mode, when operating in a mode with fewer carriers (i.e. 16k 8k, 4k or 1k) then rather than employing separate odd and even symbol interleaving processes, two odd interleavers would be used.

Figure 44:
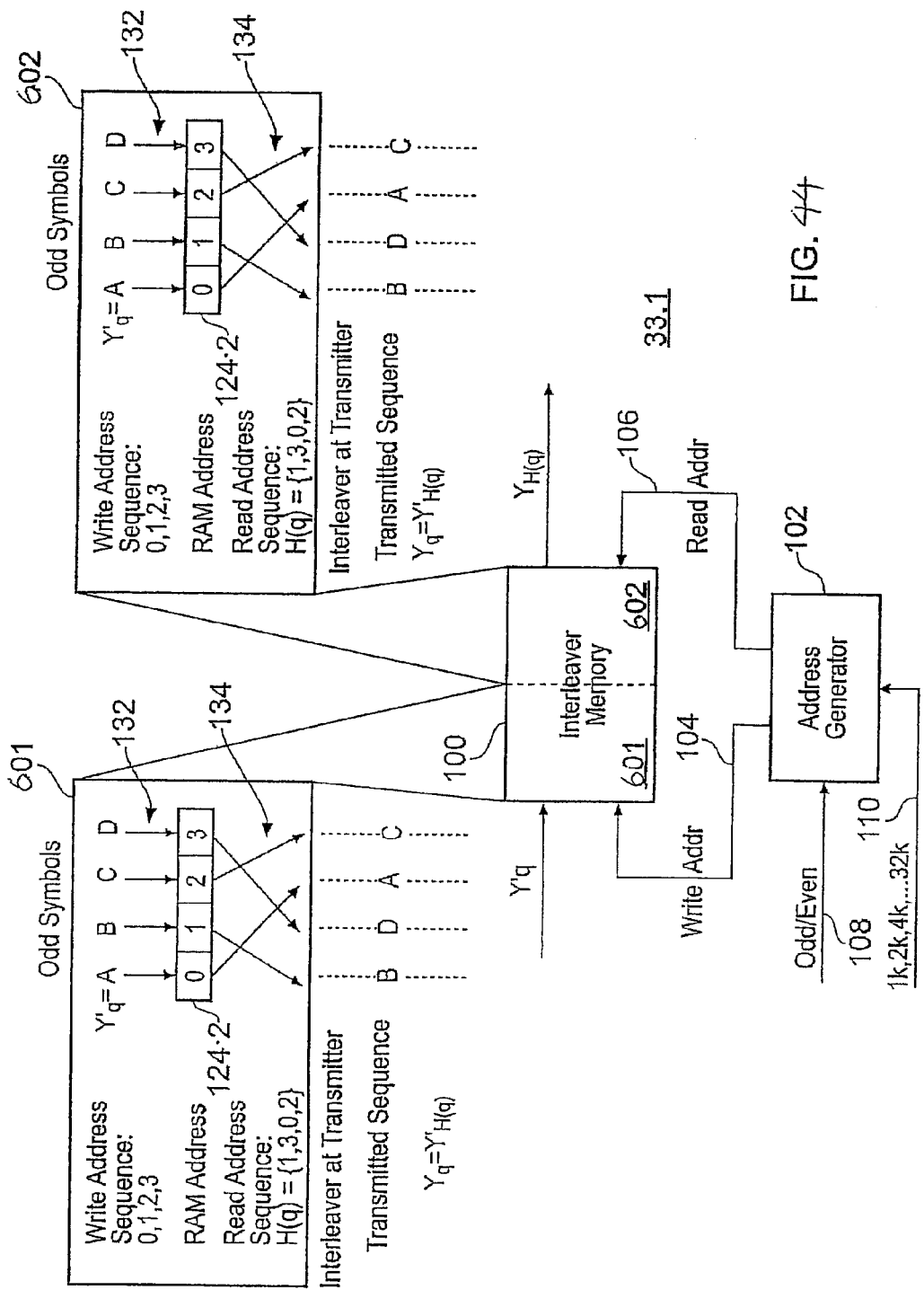
FIG. 44 provides a schematic block diagram of the symbol interleaver shown in FIG. 38, illustrating an operating mode in which interleaving is performed in accordance with an odd interleaving mode only.

An illustration of an adaptation of the symbol interleaver 33 which is shown in FIG. 38 when interleaving input data symbols onto the sub-carriers of OFDM symbols in the odd interleaving mode only is shown in FIG. 44. The symbol interleaver 33.1 corresponds exactly to the symbol interleaver 33 as shown in FIG. 38, except that the address generator 102 is adapted to perform the odd interleaving process only. For the example shown in FIG. 44, the symbol interleaver 33.1 is operating in a mode where the number of data symbols which can be carried per OFDM symbol is less than half of the maximum number which can be carried by an OFDM symbol in an operating mode with the largest number of sub-carriers per OFDM symbol. As such, the symbol interleaver 33.1 has been arranged to partition the interleaver memory 100. For the present illustration shown in FIG. 44 the interleaver memory then 100 is divided into two parts 601, 602. As an illustration of the symbol interleaver 33.1 operating in a mode in which data symbols are mapped onto the OFDM symbols using the odd interleaving process, FIG. 44 provides an expanded view of each half of the interleaver memory 601, 602. The expanded provides an illustration of the odd interleaving mode as represented for the transmitter side for four symbols A, B, C, D reproduced from FIG. 39. Thus as shown in FIG. 44, for successive sets of first and second data symbols, the data symbols are written into the interleaver memory 601, 602 in a sequential order and read out in accordance with addresses generated by the address generator 102 in a permuted order in accordance with the addresses generated by the address generator as previously explained. Thus as illustrated in FIG. 44, since an odd interleaving process is being performed for successive sets of first and second sets of data symbols, the interleaver memory must be partitioned into two parts. Symbols from a first set of data symbols are written into a first half of the interleaver memory 601, and symbols from a second set of data symbols are written into a second part of the interleaver memory 602, because the symbol interleaver is no longer able to reuse the same parts of the symbol interleaver memory as can be accommodated when operating in an odd and even mode of interleaving.

Figure 45:
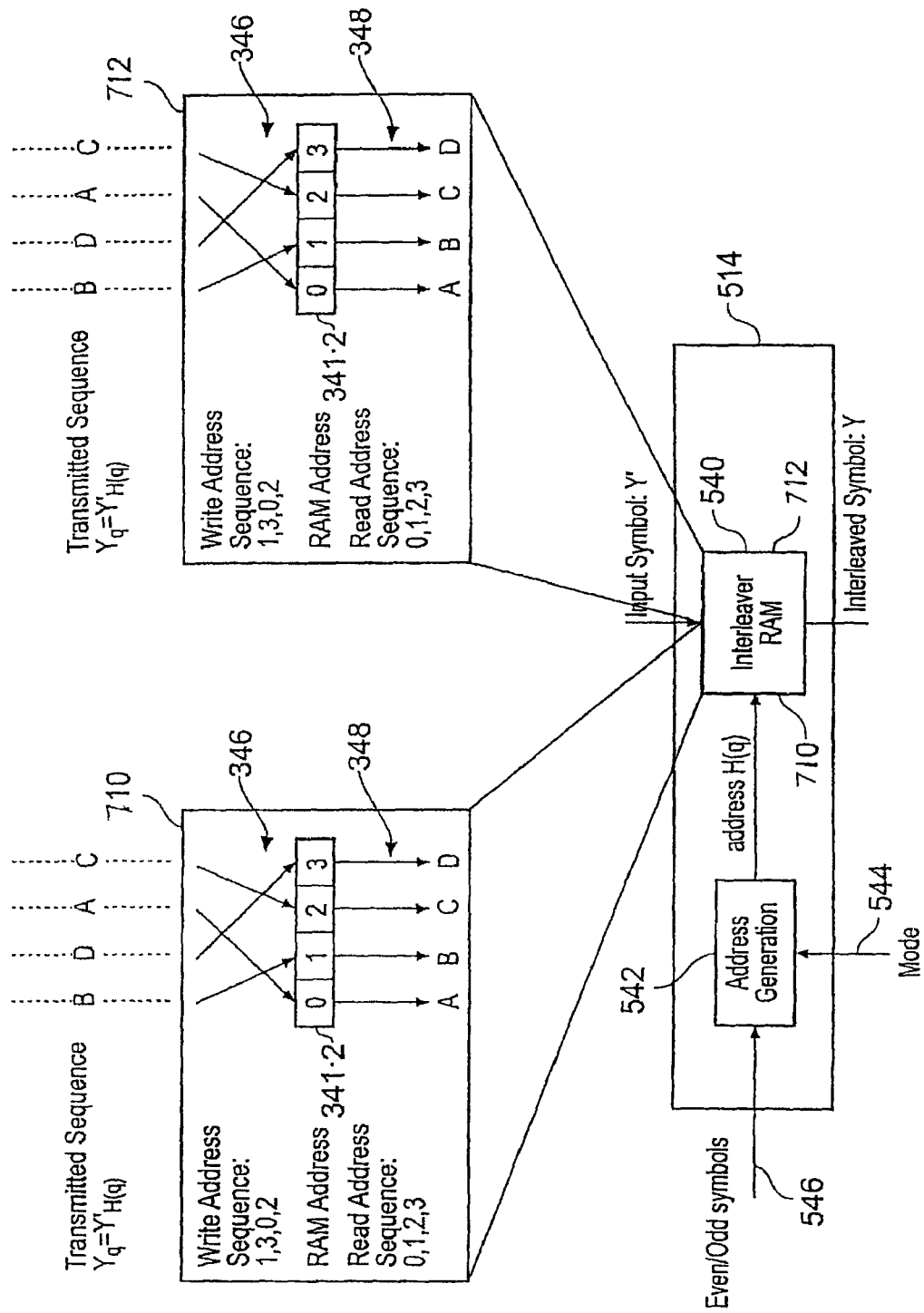
FIG. 45 provides a schematic block diagram of the symbol de-interleaver shown in FIG. 42, illustrating the operating mode in which interleaving is performed in accordance with the odd interleaving mode only.

A corresponding example of the interleaver in the receiver, which appears in FIG. 42 but adapted to operate with an odd interleaving process only is shown in FIG. 45. As shown in FIG. 45 the interleaver memory 540 is divided into two halves 710, 712 and the address generator 542 is adapted to write data symbols into the interleaver memory and read data symbols from the interleaver memory into respective parts of the memory 710, 712 for successive sets of data symbols to implement an odd interleaving process only. Therefore, in correspondence with representation shown in FIG. 44, FIG. 45 shows the mapping of the interleaving process which is performed at the receiver and illustrated in FIG. 39 as an expanded view operating for both the first and second halves of the interleaving memory 710, 712. Thus a first set of data symbols are written into a first part of the interleaver memory 710 in a permuted order defined in accordance with the addresses generated by the address generator 542 as illustrated by the order of writing in the data symbols which provides a write sequence of 1, 3, 0, 2. As illustrated the data symbols are then read out of the first part of the interleaver memory 710 in a sequential order thus recovering the original sequence A, B, C, D.

Correspondingly, a second subsequent set of data symbols which are recovered from a successive OFDM symbol are written into the second half of the interleaver memory 712 in accordance with the addresses generated by the address generator 542 in a permuted order and read out into the output data stream in a sequential order.

In one example the addresses generated for a first set of data symbols to write into the first half of the interleaver memory 710 can be reused to write a second subsequent set of data symbols into the interleaver memory 712. Correspondingly, the transmitter may also reuse addresses generated for one half of the interleaver for a first set of data symbols for reading out a second set of data symbols which have been written into the second half of the memory in sequential order.

Using a Sequence of Permutations

In one example the address generator can apply a different permutation code from a set of permutation codes for successive OFDM symbols. Using a sequence of permutations in the interleaver address generator reduces a likelihood that any bit of data input to the interleaver does not always modulate the same sub-carrier in the OFDM symbol. In another example, two address generators could be used, one generating addresses for the first set of data symbols and the first half of the memory and the other generating a different sequence of addresses for the second set of data symbols and the second half of the memory. The two address generators might differ in their choice of permutation code from the table of good permutations above for example.

For example, a cyclic sequence could be used, so that a different permutation code in a set of permutation codes in a sequence is used for successive OFDM symbols and then repeated. This cyclic sequence could be, for example, of length two or four. For the example of the 16k symbol interleaver a sequence of two permutation codes which are cycled through per OFDM symbol could be for example:

8 4 3 2 0 11 1 5 12 10 6 7 9
7 9 5 3 11 1 4 0 2 12 10 8 6 whereas a sequence of four permutation codes could be:

8 4 3 2 0 11 1 5 12 10 6 7 9
7 9 5 3 11 1 4 0 2 12 10 8 6
6 11 7 5 2 3 0 1 10 8 12 9 4
5 12 9 0 3 10 2 4 6 7 8 11 1

The switching of one permutation code to another could be effected in response to a change in the Odd/Even signal indicated on the control channel 108. In response the control unit 224 changes the permutation code in the permutation code circuit 210 via a control line.

For the example of a 1k symbol interleaver, two permutation codes could be:

4 3 2 1 0 5 6 7 8
3 2 5 0 1 4 7 8 6 whereas four permutation codes could be:

4 3 2 1 0 5 6 7 8
3 2 5 0 1 4 7 8 6
7 5 3 8 2 6 1 4 0
1 6 8 2 5 3 4 0 7

Other combinations of sequences may be possible for 2k, 4k and 8k carrier modes or indeed 0.5 k carrier mode. For example, the following permutation codes for each of the 0.5 k, 2k, 4k and 8k provide good de-correlation of symbols and can be used cyclically to generate the offset to the address generated by an address generator for each of the respective modes:

2k Mode:
0 7 5 1 8 2 6 9 3 4 *
4 8 3 2 9 0 1 5 6 7
8 3 9 0 2 1 5 7 4 6
7 0 4 8 3 6 9 1 5 2

4k Mode:
7 10 5 8 1 2 4 9 0 3 6 **
6 2 7 10 8 0 3 4 1 9 5
9 5 4 2 3 10 1 0 6 8 7
1 4 10 3 9 7 2 6 5 0 8

8k Mode:
5 11 3 0 10 8 6 9 2 4 1 7 *
10 8 5 4 2 9 1 0 6 7 3 11
11 6 9 8 4 7 2 1 0 10 5 3
8 3 11 7 9 1 5 6 4 0 2 10

For the permutation codes indicated above, the first two could be used in a two sequence cycle, whereas all four could be used for a four sequence cycle. In addition, some further sequences of four permutation codes, which are cycled through to provide the offset in an address generator to produce a good de-correlation in the interleaved symbols (some are common to the above) are provided below:

0.5 k Mode:
3 7 4 6 1 2 0 5
4 2 5 7 3 0 1 6
5 3 6 0 4 1 2 7
6 1 0 5 2 7 4 3

2k Mode:
0 7 5 1 8 2 6 9 3 4 *
3 2 7 0 1 5 8 4 9 6
4 8 3 2 9 0 1 5 6 7
7 3 9 5 2 1 0 6 4 8

4k Mode:
7 10 5 8 1 2 4 9 0 3 6 **
6 2 7 10 8 0 3 4 1 9 5

10 3 4 1 2 7 0 6 8 5 9
0 8 9 5 10 4 6 3 2 1 7

8k Mode:
5 11 3 0 10 8 6 9 2 4 1 7 *
8 10 7 6 0 5 2 1 3 9 4 11
11 3 6 9 2 7 4 10 5 1 0 8
10 8 1 7 5 6 0 11 4 2 9 3

*these are the permutations in the DVB-T standard
**these are the permutations in the DVB-H standard Examples of address generators, and corresponding interleavers, for the 2k, 4k and 8k modes are disclosed in European patent application number 04251667.4, which corresponds to U.S. Patent Application No. 2008/298487, the contents of which are incorporated herein by reference. An address generator for the 0.5k mode is disclosed in UK patent application number 0722553.5, which corresponds to U.K. Patent Application No. GB2454722.

Various further aspects in features of the present invention are defined in the independent claims. Various modifications may be made to the embodiments described above without departing from the scope of the present invention. In particular, the example representation of the generator polynomial and the permutation order which have been used to represent aspects of the invention are not intended to be limiting and extend to equivalent forms of the generator polynomial and the permutation order.

As will be appreciated the transmitter and receiver shown in FIGS. 1 and 29 respectively are provided as illustrations only and are not intended to be limiting. For example, it will be appreciated that the position of the symbol interleaver and the de-interleaver with respect, for example to the bit interleaver and the mapper and de-mapper can be changed. As will be appreciated the effect of the interleaver and de-interleaver is un-changed by its relative position, although the interleaver may be interleaving I/Q symbols instead of v-bit vectors. A corresponding change may be made in the receiver. Accordingly, the interleaver and de-interleaver may be operating on different data types, and may be positioned differently to the position described in the example embodiments.

As explained above the permutation codes and generator polynomial of the interleaver, which has been described with reference to an implementation of a particular mode, can equally be applied to other modes, by changing the predetermined maximum allowed address in accordance with the number of carriers for that mode.

According to one implementation of a receiver there is included a data processing apparatus operable to map data symbols received from a predetermined number of sub-carrier signals of Orthogonal Frequency Division Multiplexed OFDM symbols into an output data stream.

As mentioned above, embodiments of the present invention find application with DVB standards such as DVB-T, DVB-T2 and DVB-H, which are incorporated herein by reference. For example, embodiments of the present invention may be used in a transmitter or receiver operating in accordance with the DVB-T2 standard as specified in accordance with ETSI standard EN 302 755, although it will be appreciated that the present invention is not limited to application with DVB and may be extended to other standards for transmission or reception, both fixed and mobile. In other examples embodiments of the present invention find application with the cable transmission standard known as DVB-C2.

In addition to the example embodiments described above and the aspects and features of the invention defined in the appended claims, other embodiments can provide a data processing apparatus operable to map input symbols to be communicated onto a predetermined number of sub-carrier signals of an Orthogonal Frequency Division Multiplexed (OFDM) symbol. The predetermined number of sub-carrier signals corresponds to a modulation mode and the input symbols include odd data symbols and even data symbols. The data processing apparatus comprises an interleaver operable to perform a first interleaving process which interleaves odd input data symbols on to the sub-carrier signals and an even interleaving process which interleaves even input data symbols on to the sub-carrier signals, the first odd interleaving process and even interleaving process which reads-in and reads out the data symbols for mapping onto the OFDM sub-carrier signals to an interleaver memory the read-out being in a different order than the read-in such that while an odd symbol is being read from a location in the memory, an even symbol can be written to the location just read from and when an even symbol is read from the location in the memory, a following odd symbol can be written to the location just read from, the odd interleaving process reading-in and reading-out odd data symbols from the interleaver memory in accordance with an odd interleaving scheme and the even interleaving process reading-in and reading-out even data symbols from the interleaver memory in accordance with an even interleaving scheme. When the modulation mode is a mode which includes half or less than half sub-carrier signals than a total number of sub-carriers that can be accommodated by the interleaver memory, the data apparatus is operable to assign a portion of the interleaving memory to the first odd interleaving process and assign a second portion of the interleaving memory to a second odd interleaving process operating in accordance with the first, the second odd interleaving process interleaving the even input symbols.

According to another example embodiment a data processing apparatus is operable to map input symbols to be communicated onto a predetermined number of sub-carrier signals of an Orthogonal Frequency Division Multiplexed (OFDM) symbol. The predetermined number of sub-carrier signals corresponds to a modulation mode and the input symbols include first data symbols for mapping onto a first OFDM symbol and second data symbols for mapping onto a second OFDM symbol. The data processing apparatus comprises an interleaver operable to perform an odd interleaving process which interleaves first input data symbols on to the sub-carrier signals and an even interleaving process which interleaves second input data symbols on to the sub-carrier signals, the odd interleaving process writing the first input data symbols into an interleaver memory in accordance with a sequential order of the first input data symbols and reading out the first data symbols from the interleaver memory on to the sub-carrier signals in a accordance with an order defined by a permutation code, the even interleaving process writing the second input data symbols into an interleaver memory in a accordance with an order defined by the permutation code and reading out the second data symbols from the interleaver memory on to the sub-carrier signals in accordance with a sequential order such that while a first input data symbol is being read from a location in the interleaver memory, a second symbol can be written to the location just read from and when a second symbol is read from the location in the interleaver memory, a following first symbol can be written to the location just read from. When the modulation mode is a mode which includes half or less than half a number of sub-carrier signals than a total number of sub-carriers that can be accommodated by the interleaver memory, the data apparatus is operable to interleave both first and second input symbols in accordance with the odd interleaving process.

Another example embodiment can provide a method of mapping input symbols to be communicated onto a predetermined number of sub-carrier signals of an Orthogonal Frequency Division Multiplexed (OFDM) symbol. The method comprises mapping first data symbols onto a first OFDM symbol and mapping second data symbols onto a second OFDM symbol.

The invention claimed is:

1. A data processing apparatus for communicating data bits via a predetermined number of sub-carrier signals of an Orthogonal Frequency Division Multiplexed (OFDM) symbol, the data processing apparatus comprising:

a parity interleaver configured to perform parity interleaving on a Low Density Parity Check (LDPC) encoded data bits obtained by LDPC encoding the data bits according to a parity check matrix of an LDPC code, which includes a parity matrix corresponding to parity bits of an LDPC code, the parity matrix having a stepwise structure, so that a parity bit of the LDPC encoded data bits is interleaved to a different parity bit position, a mapping unit configured to map the parity interleaved bits onto data symbols corresponding to modulation symbols of a modulation scheme of the OFDM sub-carrier signals, a symbol interleaver configured to read-into a symbol interleaver memory the predetermined number of data symbols for mapping onto the OFDM sub-carrier signals, and to read-out of the symbol interleaver memory the data symbols for the OFDM sub-carriers to effect the mapping, the read-out being in a different order than the read-in, the order being determined from a set of addresses, with the effect that the data symbols are interleaved on the sub-carrier signals of the OFDM symbol, and an address generator configured to generate the set of addresses, an address being generated for each of the input symbols to indicate one of the sub-carrier signals onto which the data symbol is to be mapped, the address generator comprising:

a linear feedback shift register including a predetermined number of register stages and being configured to generate a pseudo-random bit sequence in accordance with a generator polynomial, a permutation circuit configured to receive the content of the shift register stages and to permute the bits present in the register stages in accordance with a permutation code to form an address of one of the OFDM sub-carriers, and a control unit configured in combination with an address check circuit to re-generate an address when a generated address exceeds a predetermined maximum valid address, wherein the predetermined maximum valid address is approximately thirty two thousand, the linear feedback shift register has fourteen register stages with a generator polynomial for the linear feedback shift register of $R'_i[13]=R'_{i-1}[0] \oplus R'_{i-1}[1] \oplus R'_{i-1}[2] \oplus R'_{i-1}[12]$, and the permutation code forms, with an additional bit, a fifteen bit address $R_i[n]$ for the i-th data symbol from the bit present in the n-th register stage $R'_i[n]$ in accordance with the table:

|  | R'$_i$ bit positions | | | | | | | | | | | | | |
| --- | --- | --- | --- | --- | --- | --- | --- | --- | --- | --- | --- | --- | --- | --- |
|  | 13 | 12 | 11 | 10 | 9 | 8 | 7 | 6 | 5 | 4 | 3 | 2 | 1 | 0 |
| R$_i$ bit positions | 6 | 5 | 0 | 10 | 8 | 1 | 11 | 12 | 2 | 9 | 4 | 3 | 13 | 7. |

2. The data processing apparatus as claimed in claim 1, wherein when a number of parity bits M of the LDPC code is a non-prime value, P and q are two divisors, excluding 1 and M, of the number of the parity bits M such that a product of the two divisors P and q is equal to the number of the parity bits M, K is a number of information bits of the LDPC code, x is an integer equal to or greater than 0 and less than P, and y is an integer equal to or greater than 0 and less than q, the parity interleaver interleaves a K+qx+y+1 th code bit among parity bits, including K+1 th to K+Mth code bits of the LDPC code, to a K+Py+x+1 th code bit position.

3. The data processing apparatus as claimed in claim 2, comprising:

a permuter configured to perform, when two or more code bits of the LDPC encoded data bits are transmitted as one of the data symbols, a permutation process on the parity-interleaved LDPC encoded data bits to permute the parity-interleaved LDPC encoded data bits so that a plurality of code bits corresponding to a value of 1 in an arbitrary row of the parity check matrix is not incorporated into the same data symbol.

4. The data processing apparatus as claimed in claim 3, wherein the parity check matrix of the LDPC code includes an information matrix corresponding to information bits of the LDPC code, the information matrix having a cyclic structure; and when the LDPC encoded data bits are written to a bit interleaver memory, in which encoded bits of each LDPC code are stored in row and column directions, in the column direction and are then read from the bit interleaver memory in the row direction to constitute a symbol, the permuter performs column twist interleaving as the permutation process to change a writing start position at which encoded bits of the LDPC code begin to be written in the column direction in each column of the bit interleaver memory.

5. The data processing apparatus as claimed in claim 4, wherein through column permutation corresponding to the parity interleaving, the parity matrix in the parity check matrix of the LDPC code is converted into a pseudo-cyclic structure such that a portion of the parity matrix, excluding a specific part of the parity matrix, has a cyclic structure.

6. The data processing apparatus as claimed in claim 5, wherein when m of the LDPC encoded data bits constitute a symbol, the LDPC code has a code length of N bits, and b is a positive integer;

the bit interleaver memory stores mb bits in the row direction and stores N/mb bits in the column direction;

the LDPC encoded data bits are written to the bit interleaver memory in the column direction and are then read from the bit interleaver memory in the row direction; and mb encoded bits read from the bit interleaver memory in the row direction constitute b symbols.

7. The data processing apparatus as claimed in claim 1, wherein the OFDM symbol includes pilot sub-carriers, which are arranged to carry known symbols, and the predetermined maximum valid address depends on a number of the pilot sub-carrier symbols present in the OFDM symbol.

8. A transmitter for transmitting data bits using a predetermined number of sub-carriers of an Orthogonal Frequency Division Multiplexing (OFDM) symbol, the transmitter comprising:

a Low Density Parity Check (LDPC) encoder configured to LDPC encode the data bits according to a parity check matrix of an LDPC code, which includes a parity matrix corresponding to parity bits of the LDPC code, the parity matrix having a stepwise structure, a parity interleaver configured to perform parity interleaving on the LDPC encoded data bits so that a parity bit of the LDPC code is interleaved to a different parity bit position, a mapping unit configured to map the parity interleaved encoded data bits onto data symbols corresponding to modulation symbols of a modulation scheme of the OFDM sub-carrier signals, a symbol interleaver configured to read-into an interleaver memory the predetermined number of data symbols for mapping onto the OFDM sub-carrier signals, and to read-out of the interleaver memory the data symbols for the OFDM sub-carriers to effect the mapping, the read-out being in a different order than the read-in, the order being determined from a set of addresses, with the effect that the data symbols are interleaved on the sub-carrier signals, and an address generator configured to generate the set of addresses, an address being generated for each of the data symbols to indicate one of the sub-carrier signals onto which the data symbol is to be mapped, the address generator comprising:

a linear feedback shift register including a predetermined number of register stages and being configured to generate a pseudo-random bit sequence in accordance with a generator polynomial, a permutation circuit configured to receive the content of the shift register stages and to permute the bits present in the register stages in accordance with a permutation code to form an address of one of the OFDM sub-carriers, and a control unit configured in combination with an address check circuit to re-generate an address when a generated address exceeds a predetermined maximum valid address, wherein the predetermined maximum valid address is approximately thirty two thousand, the linear feedback shift register has fourteen register stages with a generator polynomial for the linear feedback shift register of $R'_i[13]=R'_{i-1}[0] \oplus R'_{i-1}[1] \oplus R'_{i-1}[2] \oplus R'_{i-1}[12]$, and the permutation code forms, with an additional bit, a fifteen bit address $R_i[n]$ for the i-th data symbol from the bit present in the n-th register stage $R'_i[n]$ in accordance with the table:

|  | R'$_i$ bit positions | | | | | | | | | | | | | |
|---|---|---|---|---|---|---|---|---|---|---|---|---|---|---|
|  | 13 | 12 | 11 | 10 | 9 | 8 | 7 | 6 | 5 | 4 | 3 | 2 | 1 | 0 |
| R$_i$ bit positions | 6 | 5 | 0 | 10 | 8 | 1 | 11 | 12 | 2 | 9 | 4 | 3 | 13 | 7. |

9. The transmitter as claimed in claim 8, wherein the transmitter is configured to transmit data in accordance with a Digital Video Broadcasting standard including the Digital Video Broadcasting-Terrestrial standard, the Digital Video Broadcasting-Handheld standard, the Digital Video Broadcasting-Terrestrial2standard, or the Digital Video Broadcasting-Cable2 standard.

10. A method of communicating data bits via a predetermined number of sub-carrier signals of an Orthogonal Frequency Division Multiplexed (OFDM) symbol, the method comprising:
  parity interleaving Low Density Parity Check (LDPC) encoded data bits obtained by performing LDPC encoding of the data bits according to a parity check matrix of an LDPC code, which includes a parity matrix corresponding to parity bits of the LDPC code, the parity matrix having a stepwise structure, so that a parity bit of the LDPC code is interleaved to a different parity bit position,
  mapping the parity interleaved bits onto data symbols corresponding to modulation symbols of a modulation scheme of the OFDM sub-carrier signals,
  reading-into a symbol interleaver memory the predetermined number of data symbols for mapping onto the OFDM sub-carrier signals,
  reading-out of the symbol interleaver memory the data symbols for the OFDM sub-carriers to effect the mapping, the read-out being in a different order than the read-in, the order being determined from a set of addresses, with the effect that the data symbols are interleaved on the sub-carrier signals, and
  generating the set of addresses, an address being generated for each of the input symbols to indicate one of the sub-carrier signals onto which the data symbol is to be mapped, the generating the set of addresses comprising:
  using a linear feedback shift register including a predetermined number of register stages to generate a pseudo-random bit sequence in accordance with a generator polynomial,
  using a permutation circuit configured to receive the content of the shift register stages to permute the bits present in the register stages in accordance with a permutation code to form an address, and
  re-generating an address when a generated address exceeds a predetermined maximum valid address, wherein
  the predetermined maximum valid address is approximately thirty two thousand,
  the linear feedback shift register has fourteen register stages with a generator polynomial for the linear feedback shift register of
  $R'_i[13]=R'_{i-1}[0]\oplus R'_{i-1}[1]\oplus R'_{i-1}[2]\oplus R'_{i-1}[12]$, and the permutation code forms, with an additional bit, a fifteen bit address $R_i[n]$ for the i-th data symbol from the bit present in the n-th register stage $R'_i[n]$ in accordance with the table:

11. The method as claimed in claim 10, wherein when a number of parity bits M of the LDPC code is a non-prime value, P and q are two divisors, excluding 1 and M, of the number of the parity bits M such that a product of the two divisors P and q is equal to the number of the parity bits M, K is a number of information bits of the LDPC code, x is an integer equal to or greater than 0 and less than P, and y is an integer equal to or greater than 0 and less than q,
  the parity interleaving includes interleaving a K+qx+y+1 th code bit among parity bits, including K+1 th to K+Mth code bits of the LDPC code, to a K+Py+x+1 th code bit position.

12. The method as claimed in claim 11, further comprising:
  permuting, when two or more encoded bits of the LDPC encoded data bits are transmitted as one of the data symbols, the encoded bits of the parity-interleaved LDPC encode data bits so that a plurality of encoded data bits corresponding to a value of 1 in an arbitrary row of the parity check matrix is not incorporated into the same data symbol.

13. The method as claimed in claim 12, wherein the parity check matrix of the LDPC code includes an information matrix corresponding to information bits of the LDPC code, the information matrix having a cyclic structure; and when encoded data bits of the LDPC code are written to a bit interleaver memory, in which encoded bits of each LDPC code are stored in row and column directions, in the column direction and are then read from the bit interleaver memory in the row direction to constitute a symbol, and the permuting includes column twist interleaving to change a writing start position at which the encoded data bits of the LDPC code begin to be written in the column direction in each column of the bit interleaver memory.

14. The method as claimed in claim 13, wherein the column twist interleaving includes permuting through column permutation corresponding to the parity interleaving, the parity matrix in the parity check matrix of the LDPC code into a pseudo-cyclic structure such that a portion of the parity matrix, excluding a specific part of the parity matrix, has a cyclic structure.

15. The method as claimed in claim 14, wherein when m encoded data bits of the LDPC code constitute a symbol, the LDPC code has a code length of N bits, and b is a positive integer;
  the storing in the bit interleaver memory includes storing mb bits in the row direction and N/mb bits in the column direction;
  writing the LDPC encoded bits into the bit interleaver memory in the column direction, and

|  | R'$_i$ bit positions | | | | | | | | | | | | | |
|---|---|---|---|---|---|---|---|---|---|---|---|---|---|---|
|  | 13 | 12 | 11 | 10 | 9 | 8 | 7 | 6 | 5 | 4 | 3 | 2 | 1 | 0 |
| R$_i$ bit positions | 6 | 5 | 0 | 10 | 8 | 1 | 11 | 12 | 2 | 9 | 4 | 3 | 13 | 7. | reading out from the bit interleaver memory in the row direction; and reading mb encoded data bits from the bit interleaver memory in the row direction to constitute b of the data symbols.

16. The method as claimed in claim 10, wherein the OFDM symbol includes pilot sub-carriers, which are arranged to carry known symbols, and the predetermined maximum valid address depends on a number of the pilot sub-carrier symbols present in the OFDM symbol.

17. A method of transmitting data bits via a number of sub-carrier signals of an Orthogonal Frequency Division Multiplexing (OFDM) symbol, the method comprising:

Low Density Parity Check (LDPC) encoding the data bits according to a parity check matrix of an LDPC code, which includes a parity matrix corresponding to parity bits of the LDPC code, the parity matrix having a step-wise structure, parity interleaving the LDPC encoded data bits so that a parity bit of the LDPC code is interleaved to a different parity bit position, mapping the parity interleaved encoded bits onto data symbols corresponding to modulation symbols of a modulation scheme of the OFDM sub-carrier signals, reading-into a symbol interleaver memory the predetermined number of data symbols for mapping onto the OFDM sub-carrier signals, reading-out of the symbol interleaver memory the data symbols for the OFDM sub-carriers to effect the mapping, the read-out being in a different order than the read-in, the order being determined from a set of addresses, with the effect that the data symbols are interleaved on the sub-carrier signals, and generating the set of addresses, an address being generated for each of the input symbols to indicate one of the sub-carrier signals onto which the data symbol is to be mapped, the generating the set of addresses comprising:

using a linear feedback shift register including a predetermined number of register stages to generate a pseudo-random bit sequence in accordance with a generator polynomial, using a permutation circuit configured to receive the content of the shift register stages to permute the bits present in the register stages in accordance with a permutation code to form an address, and re-generating an address when a generated address exceeds a predetermined maximum valid address, wherein the predetermined maximum valid address is approximately thirty two thousand, the linear feedback shift register has fourteen register stages with a generator polynomial for the linear feedback shift register of $R'_i[13] = R'_{i-1}[0] \oplus R'_{i-1}[1] \oplus R'_{i-1}[2] \oplus R'_{i-1}[12]$, and the permutation code forms, with an and the permutation code forms, with an additional bit, a fifteen bit address $R_i[n]$ for the i-th data symbol from the bit present in the n-th register stage $R'_i[n]$ in accordance with the table:

18. The method as claimed in claim 17, comprising transmitting the data symbols on OFMD symbols modulated in accordance with a Digital Video Broadcasting standard including the Digital Video Broadcasting-Terrestrial standard, the Digital Video Broadcasting-Handheld standard, the Digital Video Broadcasting-Terrestrial2 standard, or the Digital Video Broadcasting Cable2 standard.

19. A data processing apparatus for communicating data bits via a predetermined number of sub-carrier signals of an Orthogonal Frequency Division Multiplexed (OFDM) symbol, the data processing apparatus comprising:

a parity interleaver configured to perform parity interleaving on a Low Density Parity Check (LDPC) encoded data bits obtained by LDPC encoding the data bits according to a parity check matrix of an LDPC code, which includes a parity matrix corresponding to parity bits of an LDPC code, the parity matrix having a stepwise structure, so that a parity bit of the LDPC encoded data bits is interleaved to a different parity bit position, a mapping unit configured to map the parity interleaved bits onto data symbols corresponding to modulation symbols of a modulation scheme of the OFDM sub-carrier signals, a symbol interleaver configured to read-into a symbol interleaver memory the predetermined number of data symbols for mapping onto the OFDM sub-carrier signals, and to read-out of the symbol interleaver memory the data symbols for the OFDM sub-carriers to effect the mapping, the read-out being in a different order than the read-in, the order being determined from a set of addresses, with the effect that the data symbols are interleaved on the sub-carrier signals of the OFDM symbol, and an address generator configured to provide the set of addresses, the set of addresses including an address for each of the input symbols to indicate one of the sub-carrier signals onto which the data symbol is to be mapped, the address generator comprising a memory containing the set of addresses, the set of addresses having been generated and stored in the memory using:

a linear feedback shift register which includes a predetermined number of register stages which are configured to generate a pseudo-random bit sequence in accordance with a generator polynomial, a permutation circuit configured to receive the content of the shift register stages and to permute the bits present in the register stages in accordance with a permutation code to form an address of one of the OFDM sub-carriers, and a control unit configured in combination with an address check circuit to re-generate an address when a generated address exceeds a predetermined maximum valid address, wherein the predetermined maximum valid address is approximately thirty two thousand, the linear feedback shift register has fourteen register stages with a generator polynomial for the linear feedback shift register of $R'_i[13] = R'_{i-1}[0] \oplus R'_{i-1}[1] \oplus R'_{i-1}[2] \oplus R'_{i-1}[12]$, and the permutation code forms, with an additional bit, a fifteen bit address $R_i[n]$ for the i-th data symbol from the bit present in the n-th register stage $R'_i[n]$ in accordance with the table:

| | $R'_i$ bit positions | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| $R_i$ bit positions | 6 | 5 | 0 | 10 | 8 | 1 | 11 | 12 | 2 | 9 | 4 | 3 | 13 | 7. |

|  | R'$_i$ bit positions | | | | | | | | | | | | | |
| --- | --- | --- | --- | --- | --- | --- | --- | --- | --- | --- | --- | --- | --- | --- |
|  | 13 | 12 | 11 | 10 | 9 | 8 | 7 | 6 | 5 | 4 | 3 | 2 | 1 | 0 |
| R$_i$ bit positions | 6 | 5 | 0 | 10 | 8 | 1 | 11 | 12 | 2 | 9 | 4 | 3 | 13 | 7. |

20. A method of communicating data bits via a predetermined number of sub-carrier signals of an Orthogonal Frequency Division Multiplexed (OFDM) symbol, the method comprising:

parity interleaving Low Density Parity Check (LDPC) encoded data bits obtained by performing LDPC encoding of the data bits according to a parity check matrix of an LDPC code, which includes a parity matrix corresponding to parity bits of the LDPC code, the parity matrix having a stepwise structure, so that a parity bit of the LDPC code is interleaved to a different parity bit position, mapping the parity interleaved bits onto data symbols corresponding to modulation symbols of a modulation scheme of the OFDM sub-carrier signals, reading-into a symbol interleaver memory the predetermined number of data symbols for mapping onto the OFDM sub-carrier signals, reading-out of the symbol interleaver memory the data symbols for the OFDM sub-carriers to effect the mapping, the read-out being in a different order than the read-in, the order being determined from a set of addresses, with the effect that the data symbols are interleaved on the sub-carrier signals, and providing the set of addresses, each of the addresses in the set of addresses being provided for each of the input symbols to indicate one of the sub-carrier signals onto which the data symbol is to be mapped, the address generator comprising a memory containing the set of addresses, the set of addresses having been generated and stored in the memory by:

using a linear feedback shift register including a predetermined number of register stages to generate a pseudorandom bit sequence in accordance with a generator polynomial, using a permutation circuit configured to receive the content of the shift register stages to permute the bits present in the register stages in accordance with a permutation code to form an address, and re-generating an address when a generated address exceeds a predetermined maximum valid address, wherein the predetermined maximum valid address is approximately thirty two thousand, the linear feedback shift register has fourteen register stages with a generator polynomial for the linear feedback shift register of $R'_i[13]=R'_{i-1}[0] \oplus R'_{i-1}[1] \oplus R'_{i-1}[2] \oplus R'_{i-1}[12]$, and the permutation code forms, with an additional bit, a fifteen bit address $R_i[n]$ for the i-th data symbol from the bit present in the n-th register stage $R'_i[n]$ in accordance with the table:

|  | R'$_i$ bit positions | | | | | | | | | | | | | |
| --- | --- | --- | --- | --- | --- | --- | --- | --- | --- | --- | --- | --- | --- | --- |
|  | 13 | 12 | 11 | 10 | 9 | 8 | 7 | 6 | 5 | 4 | 3 | 2 | 1 | 0 |
| R$_i$ bit positions | 6 | 5 | 0 | 10 | 8 | 1 | 11 | 12 | 2 | 9 | 4 | 3 | 13 | 7. |

* * * * *